(12) United States Patent
Feng et al.

(10) Patent No.: US 12,008,974 B2
(45) Date of Patent: Jun. 11, 2024

(54) SHIFT REGISTER CIRCUIT, GATE DRIVER CIRCUIT AND DRIVING METHOD THEREFOR, AND DISPLAY APPARATUS

(71) Applicants: Hefei BOE Joint Technology Co.,Ltd., Anhui (CN); BOE TECHNOLOGY GROUP CO., LTD., Beijing (CN)

(72) Inventors: Xuehuan Feng, Beijing (CN); Yongqian Li, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 22 days.

(21) Appl. No.: 17/776,267

(22) PCT Filed: Nov. 24, 2020

(86) PCT No.: PCT/CN2020/131121
§ 371 (c)(1),
(2) Date: May 12, 2022

(87) PCT Pub. No.: WO2022/109780
PCT Pub. Date: Jun. 2, 2022

(65) Prior Publication Data
US 2023/0306924 A1  Sep. 28, 2023

(51) Int. Cl.
*G09G 3/36* (2006.01)
*G09G 3/20* (2006.01)

(52) U.S. Cl.
CPC ......... *G09G 3/3677* (2013.01); *G09G 3/2092* (2013.01); *G09G 2310/0286* (2013.01); *G09G 2310/08* (2013.01)

(58) Field of Classification Search
CPC ............... G09G 3/3677; G09G 3/2092; G09G 2310/0286; G09G 2310/08
See application file for complete search history.

(56) References Cited

U.S. PATENT DOCUMENTS 10,453,369 B2 * 10/2019 Li .................... G11C 19/28
10,789,871 B2 *  9/2020 Yuan ................. G09G 3/20
(Continued)

FOREIGN PATENT DOCUMENTS

CN    106875913 A    6/2017
CN    110706639 A    1/2020
(Continued)

OTHER PUBLICATIONS

PCT International Search Report (w/ English translation) for corresponding PCT Application No. PCT/CN2020/131053, dated Nov. 24, 2020, 16 pages.

(Continued)

*Primary Examiner* — Abbas I Abdulselam
(74) *Attorney, Agent, or Firm* — Dority & Manning, P.A.

(57) ABSTRACT

A shift register circuit includes an input sub-circuit, an output sub-circuit and a control sub-circuit. The input sub-circuit is coupled to a first input signal terminal and a pull-up node, and configured to, under control of a first input signal, transmit the first input signal to the pull-up node. The output sub-circuit is at least coupled to the pull-up node, a first clock signal terminal and a first signal output terminal, and configured to transmit a first clock signal to the first signal output terminal under control of a voltage at the pull-up node. The control sub-circuit is coupled to at least one first reference node, at least one first control signal terminal and the pull-up node, and configured to transmit a voltage at a first reference node to the pull-up node under control of a first control signal.

20 Claims, 37 Drawing Sheets

(56) References Cited

U.S. PATENT DOCUMENTS

| | | |
|---|---|---|
| 2006/0187177 A1 | 8/2006 | Kuo et al. |
| 2013/0265291 A1 | 10/2013 | Huang |
| 2018/0046311 A1 | 2/2018 | Gu et al. |
| 2019/0096500 A1 | 3/2019 | Gu et al. |
| 2021/0201803 A1 | 7/2021 | Feng et al. |
| 2021/0335317 A1 | 10/2021 | Liu et al. |

FOREIGN PATENT DOCUMENTS

| | | |
|---|---|---|
| CN | 111210789 A | 5/2020 |
| CN | 111312322 A | 6/2020 |
| CN | 111402774 A | 7/2020 |
| KR | 20030054816 A | 7/2003 |

OTHER PUBLICATIONS

PCT International Search Report and Written Opinion (w/ English translation) for corresponding PCT Application No. PCT/CN2020/131053, dated Aug. 27, 2021, 16 pages.

* cited by examiner

An input sub-circuit of the Xth-stage shift register circuit, under control of a first input signal received at a first input signal terminal, transmits the first input signal to a pull-up node coupled thereto; an output sub-circuit of the Xth-stage shift register circuit transmits a first clock signal received at a first clock signal terminal to a first signal output terminal under control of a voltage at the pull-up node coupled thereto; and a control sub-circuit of an (X+m)th-stage shift register circuit, a first input signal terminal of which is coupled to the Xth-stage shift register circuit, stores a first input signal received at the first input signal terminal under control of the first input signal received at the first input signal terminal — S10

A control sub-circuit of the Yth-stage shift register circuit releases an operating voltage of a pull-up node to the pull-up node coupled thereto under control of a first control signal received at a first control signal terminal; an output sub-circuit of the Yth-stage shift register circuit transmits a first clock signal received at a first clock signal terminal to a first signal output terminal under control of the voltage at the pull-up node coupled thereto; and a control sub-circuit of a (Y+n)th-stage shift register circuit, a second input signal terminal of which is coupled to the Yth-stage shift register circuit, stores a second input signal received at the second input signal terminal under control of the second input signal received at the second input signal terminal — S20

The control sub-circuit of the (X+m)th-stage shift register circuit releases an operating voltage of a pull-up node to the pull-up node coupled thereto under control of a first control signal received at a first control signal terminal; an output sub-circuit of the (X+m)th-stage shift register circuit transmits a first clock signal received at a first clock signal terminal to a first signal output terminal under control of the voltage at the pull-up node coupled thereto — S30

FIG. 38

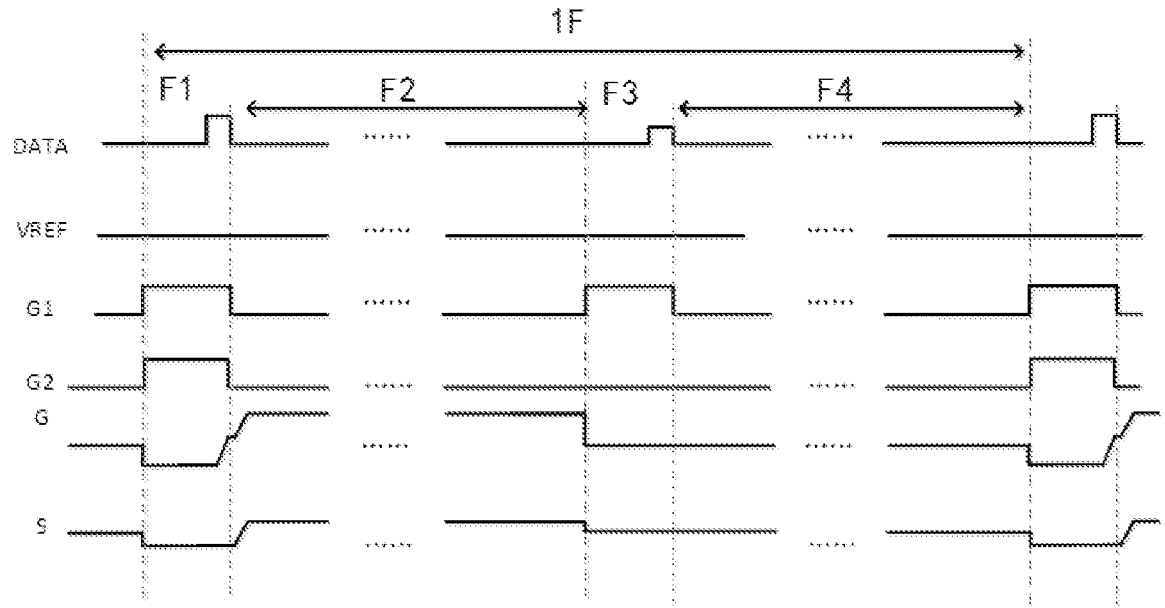

SHIFT REGISTER CIRCUIT, GATE DRIVER CIRCUIT AND DRIVING METHOD THEREFOR, AND DISPLAY APPARATUS

CROSS-REFERENCE TO RELATED APPLICATION

This application is a national phase entry under 35 USC 371 of International Patent Application No. PCT/CN2020/131121 filed on Nov. 24, 2020, which is incorporated herein by reference in its entirety.

TECHNICAL FIELD

The present disclosure relates to the field of display technologies, and in particular, to a shift register circuit, a gate driver circuit and a driving method therefor, and a display apparatus.

BACKGROUND

In the display field, organic light-emitting diode (OLED) display apparatuses have attracted extensive attention due to their advantages of self-luminescence, low power consumption, wide viewing angle, and fast response rate.

The OLED display apparatuses have a problem of image smear (i.e., dynamic image smear) in a process of switching dynamic pictures. Motion picture response time (MPRT) may be used to represent a degree of smear. The larger the MPRT is, the lighter the smear is.

SUMMARY

In an aspect, a shift register circuit is provided. The shift register circuit includes an input sub-circuit, an output sub-circuit and a control sub-circuit. The input sub-circuit is coupled to a first input signal terminal and a pull-up node, and is configured to, under control of a first input signal received at the first input signal terminal, transmit the first input signal to the pull-up node. The output sub-circuit is at least coupled to the pull-up node, a first clock signal terminal and a first signal output terminal, and is configured to transmit a first clock signal received at the first clock signal terminal to the first signal output terminal under control of a voltage at the pull-up node. The control sub-circuit is coupled to at least one first reference node, at least one first control signal terminal and the pull-up node, and is configured to transmit a voltage at a first reference node to the pull-up node under control of a first control signal received at a first control signal terminal.

In some embodiments, the control sub-circuit is coupled to two first reference nodes and two first control signal terminals; the two first reference nodes are a first node and a second node, and the two first control signal terminals are a second clock signal terminal and a third clock signal terminal. The control sub-circuit includes a first release unit and a second release unit. The first release unit is coupled to the first node, the second clock signal terminal and the pull-up node, and is configured to transmit a voltage at the first node to the pull-up node under control of a second clock signal received at the second clock signal terminal. The second release unit is coupled to the second node, the third clock signal terminal and the pull-up node, and is configured to transmit a voltage at the second node to the pull-up node under control of a third clock signal received at the third clock signal terminal.

In some embodiments, the first release unit includes a first transistor. A control electrode of the first transistor is coupled to the second clock signal terminal, a first electrode of the first transistor is coupled to the first node, and a second electrode of the first transistor is coupled to the pull-up node. The second release unit includes a second transistor. A control electrode of the second transistor is coupled to the third clock signal terminal, a first electrode of the second transistor is coupled to the second node, and a second electrode of the second transistor is coupled to the pull-up node.

In some embodiments, the control sub-circuit further includes a first storage unit and a second storage unit. The first storage unit is at least coupled to the first input signal terminal, a first storage signal terminal and the first node, and is configured to store the first input signal under the control of the first input signal received at the first input signal terminal, and to transmit a first storage signal received at the first storage signal terminal to the first node under the control of the first input signal. The second storage unit is at least coupled to a second input signal terminal, a fourth clock signal terminal, a second storage signal terminal and the second node, and is configured to store a second input signal received at the second input signal terminal under control of a fourth clock signal received at the fourth clock signal terminal, and to transmit a second storage signal received at the second storage signal terminal to the second node under control of the second input signal.

In some embodiments, the first storage unit is further coupled to a first reset signal terminal and a first voltage signal terminal. The first storage unit includes a third transistor, a fourth transistor, a fifth transistor and a first storage capacitor. A control electrode and a first electrode of the third transistor are coupled to the first input signal terminal, and a second electrode of the third transistor is coupled to a third node. A control electrode of the fourth transistor is coupled to the third node, a first electrode of the fourth transistor is coupled to the first storage signal terminal, and a second electrode of the fourth transistor is coupled to the first node. A control electrode of the fifth transistor is coupled to the first reset signal terminal, a first electrode of the fifth transistor is coupled to the first voltage signal terminal, and a second electrode of the fifth transistor is coupled to the third node. One terminal of the first storage capacitor is coupled to the third node, and another terminal of the first storage capacitor is coupled to the first voltage signal terminal or the first node. The second storage unit includes a sixth transistor, a seventh transistor and a second storage capacitor. A control electrode of the sixth transistor is coupled to the fourth clock signal terminal, a first electrode of the sixth transistor is coupled to the second input signal terminal, and a second electrode of the sixth transistor is coupled to a fourth node. A control electrode of the seventh transistor is coupled to the fourth node, a first electrode of the seventh transistor is coupled to the second storage signal terminal, and a second electrode of the seventh transistor is coupled to the second node. One terminal of the second storage capacitor is coupled to the fourth node, and another terminal of the second storage capacitor is coupled to the first voltage signal terminal or the second node.

In some embodiments, the control sub-circuit is coupled to one first reference node and one first control signal terminal, the first reference node is a fifth node, and the first control signal terminal is a third clock signal terminal. The control sub-circuit includes a third release unit. The third release unit is coupled to the fifth node, the third clock signal terminal and the pull-up node, and is configured to transmit a voltage at the fifth node to the pull-up node under control of a third clock signal received at the third clock signal terminal.

In some embodiments, the third release unit includes an eighth transistor. A control electrode of the eighth transistor is coupled to the third clock signal terminal, a first electrode of the eighth transistor is coupled to the fifth node, and a second electrode of the eighth transistor is coupled to the pull-up node.

In some embodiments, the control sub-circuit further includes a third storage unit and a fourth storage unit. The third storage unit is at least coupled to the first input signal terminal, a third storage signal terminal and the fifth node, and is configured to store the first input signal under the control of the first input signal received at the first input signal terminal, and to transmit a third storage signal received at the third storage signal terminal to the fifth node under the control of the first input signal. The fourth storage unit is coupled to a fourth clock signal terminal and a second input signal terminal, and is configured to store a second input signal received at the second input signal terminal under control of a fourth clock signal received at the fourth clock signal terminal.

In some embodiments, the third storage unit is further coupled to a first reset signal terminal and a first voltage signal terminal. The third storage unit includes a ninth transistor, a tenth transistor, an eleventh transistor and a third storage capacitor. A control electrode and a first electrode of the ninth transistor are coupled to the first input signal terminal, and a second electrode of the ninth transistor is coupled to a sixth node. A control electrode of the tenth transistor is coupled to the sixth node, a first electrode of the tenth transistor is coupled to the third storage signal terminal, and a second electrode of the tenth transistor is coupled to the fifth node. A control electrode of the eleventh transistor is coupled to the first reset signal terminal, a first electrode of the eleventh transistor is coupled to the first voltage signal terminal, and a second electrode of the eleventh transistor is coupled to the sixth node. One terminal of the third storage capacitor is coupled to the sixth node, and another terminal of the third storage capacitor is coupled to the first voltage signal terminal or the fifth node. The fourth storage unit includes a twelfth transistor. A control electrode of the twelfth transistor is coupled to the fourth clock signal terminal, a first electrode of the twelfth transistor is coupled to the second input signal terminal, and a second electrode of the twelfth transistor is coupled to the sixth node.

In some embodiments, the input sub-circuit includes a thirteenth transistor. A control electrode and a first electrode of the thirteenth transistor are coupled to the first input signal terminal, and a second electrode of the thirteenth transistor is coupled to the pull-up node. The output sub-circuit at least includes a fourteenth transistor and a fourth storage capacitor. A control electrode of the fourteenth transistor is coupled to the pull-up node, a first electrode of the fourteenth transistor is coupled to the first clock signal terminal, and a second electrode of the fourteenth transistor is coupled to the first signal output terminal. One terminal of the fourth storage capacitor is coupled to the pull-up node, and another terminal of the fourth storage capacitor is coupled to the first signal output terminal.

In some embodiments, the output sub-circuit is further coupled to a fifth clock signal terminal and a cascade signal output terminal. The output sub-circuit further includes a fifteenth transistor. A control electrode of the fifteenth transistor is coupled to the pull-up node, a first electrode of the fifteenth transistor is coupled to the fifth clock signal terminal, and a second electrode of the fifteenth transistor is coupled to the cascade signal output terminal.

In some embodiments, the output sub-circuit is further coupled to a sixth clock signal terminal and a second signal output terminal. The output sub-circuit further includes a sixteenth transistor and a fifth storage capacitor. A control electrode of the sixteenth transistor is coupled to the pull-up node, a first electrode of the sixteenth transistor is coupled to the sixth clock signal terminal, and a second electrode of the sixteenth transistor is coupled to the second signal output terminal. One terminal of the fifth storage capacitor is coupled to the pull-up node, and another terminal of the fifth storage capacitor is coupled to the second signal output terminal.

In some embodiments, the shift register circuit further includes a pull-down sub-circuit, a first noise reduction sub-circuit and a second noise reduction sub-circuit. The pull-down sub-circuit is coupled to a second voltage signal terminal, a first voltage signal terminal, the pull-up node and a pull-down node, and is configured to, under control of a second voltage signal received at the second voltage signal terminal, transmit the second voltage signal to the pull-down node, and to transmit a first voltage signal received at the first voltage signal terminal to the pull-down node under control of the voltage at the pull-up node. The first noise reduction sub-circuit is coupled to the pull-down node, the pull-up node and the first voltage signal terminal, and is configured to transmit the first voltage signal to the pull-up node under control of a voltage at the pull-down node. The second noise reduction sub-circuit is at least coupled to the pull-down node, the first signal output terminal and a third voltage signal terminal, and is configured to transmit a third voltage signal received at the third voltage signal terminal to the first signal output terminal under the control of the voltage at the pull-down node.

In some embodiments, the pull-down sub-circuit includes an eighteenth transistor, a nineteenth transistor, a twentieth transistor and a twenty-first transistor. A control electrode and a first electrode of the eighteenth transistor are coupled to the second voltage signal terminal, and a second electrode of the eighteenth transistor is coupled to a pull-down control node. A control electrode of the nineteenth transistor is coupled to the pull-down control node, a first electrode of the nineteenth transistor is coupled to the second voltage signal terminal, and a second electrode of the nineteenth transistor is coupled to the pull-down node. A control electrode of the twentieth transistor is coupled to the pull-up node, a first electrode of the twentieth transistor is coupled to the first voltage signal terminal, and a second electrode of the twentieth transistor is coupled to the pull-down control node. A control electrode of the twenty-first transistor is coupled to the pull-up node, a first electrode of the twenty-first transistor is coupled to the first voltage signal terminal, and a second electrode of the twenty-first transistor is coupled to the pull-down node. Or the pull-down sub-circuit includes a twenty-second transistor and a twenty-third transistor. A control electrode and a first electrode of the twenty-second transistor are coupled to the second voltage signal terminal, and a second electrode of the twenty-second transistor is coupled to the pull-down node. A control electrode of the twenty-third transistor is coupled to the pull-up node, a first electrode of the twenty-third transistor is coupled to the first voltage signal terminal, and a second electrode of the twenty-third transistor is coupled to the pull-down node.

In some embodiments, the first noise reduction sub-circuit includes a twenty-fourth transistor. A control electrode of the twenty-fourth transistor is coupled to the pull-down node, a first electrode of the twenty-fourth transistor is coupled to the first voltage signal terminal, and a second electrode of the twenty-fourth transistor is coupled to the pull-up node. The second noise reduction sub-circuit includes a twenty-fifth transistor. A control electrode of the twenty-fifth transistor is coupled to the pull-down node, a first electrode of the twenty-fifth transistor is coupled to the third voltage signal terminal, and a second electrode of the twenty-fifth transistor is coupled to the first signal output terminal.

In some embodiments, in a case where the output sub-circuit is further coupled to a cascade signal output terminal, a fifth clock signal terminal, a second signal output terminal and a sixth clock signal terminal, the second noise reduction sub-circuit further includes a twenty-sixth transistor and a twenty-seventh transistor. A control electrode of the twenty-sixth transistor is coupled to the pull-down node, a first electrode of the twenty-sixth transistor is coupled to the first voltage signal terminal, and a second electrode of the twenty-sixth transistor is coupled to the cascade signal output terminal. A control electrode of the twenty-seventh transistor is coupled to the pull-down node, a first electrode of the twenty-seventh transistor is coupled to the third voltage signal terminal, and a second electrode of the twenty-seventh transistor is coupled to the second signal output terminal.

In some embodiments, the shift register circuit further includes a first reset sub-circuit and a second reset sub-circuit. The first reset sub-circuit is coupled to a first reset signal terminal, the pull-up node and a first voltage signal terminal, and is configured to transmit a first voltage signal received at the first voltage signal terminal to the pull-up node under control of a first reset signal received at the first reset signal terminal. The second reset sub-circuit is coupled to a second reset signal terminal, the pull-up node and the first voltage signal terminal, and is configured to transmit the first voltage signal to the pull-up node under control of a second reset signal received at the second reset signal terminal.

In some embodiments, the first reset sub-circuit includes a twenty-ninth transistor. A control electrode of the twenty-ninth transistor is coupled to the first reset signal terminal, a first electrode of the twenty-ninth transistor is coupled to the first voltage signal terminal, and a second electrode of the twenty-ninth transistor is coupled to the pull-up node. The second reset sub-circuit includes a thirtieth transistor. A control electrode of the thirtieth transistor is coupled to the second reset signal terminal, a first electrode of the thirtieth transistor is coupled to the first voltage signal terminal, and a second electrode of the thirtieth transistor is coupled to the pull-up node. Or the second reset sub-circuit includes a thirty-first transistor and a thirty-second transistor. A control electrode of the thirty-first transistor is coupled to the second reset signal terminal, a first electrode of the thirty-first transistor is coupled to the first voltage signal terminal, and a second electrode of the thirty-first transistor is coupled to a first electrode of the thirty-second transistor. A control electrode of the thirty-second transistor is coupled to a second reference node, and a second electrode of the thirty-second transistor is coupled to the pull-up node.

In some embodiments, the second reset sub-circuit is further coupled to an auxiliary third clock signal terminal, and is configured to transmit the first voltage signal to the pull-up node under control of an auxiliary third clock signal received at the auxiliary third clock signal terminal.

In some embodiments, the second reset sub-circuit further includes a forty-first transistor. A control electrode of the forty-first transistor is coupled to the auxiliary third clock signal terminal, a first electrode of the forty-first transistor is coupled to the first voltage signal terminal, and a second electrode of the forty-first transistor is coupled to the pull-up node.

In some embodiments, the shift register circuit further includes a first voltage boosting sub-circuit and a second voltage boosting sub-circuit. The first voltage boosting sub-circuit is coupled to the pull-up node, a second voltage signal terminal and a ninth node, and is configured to transmit a second voltage signal received at the second voltage signal terminal to the ninth node under the control of the voltage at the pull-up node. The second voltage boosting sub-circuit is coupled to the eighth node, the second voltage signal terminal and a tenth node, and is configured to transmit the second voltage signal received at the second voltage signal terminal to the tenth node under control of a voltage at the eighth node.

In some embodiments, the first voltage boosting sub-circuit includes a thirty-sixth transistor. A control electrode of the thirty-sixth transistor is coupled to the pull-up node, a first electrode of the thirty-sixth transistor is coupled to the second voltage signal terminal, and a second electrode of the thirty-sixth transistor is coupled to the ninth node. The second voltage boosting sub-circuit includes a thirty-seventh transistor. A control electrode of the thirty-seventh transistor is coupled to the eighth node, a first electrode of the thirty-seventh transistor is coupled to the second voltage signal terminal, and a second electrode of the thirty-seventh transistor is coupled to the tenth node.

In another aspect, a gate driver circuit is provided. The gate driver circuit includes a plurality of shift register circuits that are cascaded and each as described in any of the above embodiments.

In some embodiments, a control sub-circuit of a (4i+1)th-stage shift register circuit includes a first release unit, a second release unit, a first storage unit and a second storage unit, and control sub-circuits of (4i+2)th-stage to (4i+4)th-stage shift register circuits each include a first release unit and a second release unit. Each first release unit is coupled to a respective first node, a respective second clock signal terminal and a respective pull-up node. Each second release unit is coupled to a respective second node, a respective third clock signal terminal and the respective pull-up node. The first storage unit is at least coupled to a first input signal terminal, a first storage signal terminal and a first node. The second storage unit is at least coupled to a second input signal terminal, a fourth clock signal terminal, a second storage signal terminal and a second node. First nodes and second nodes of the control sub-circuits of the (4i+2)th-stage to (4i+4)th-stage shift register circuits are coupled to the first node and the second node of the control sub-circuit of the (4i+1)th-stage shift register circuit, respectively.

In some embodiments, the plurality of shift register circuits are divided into a plurality of first shift register circuit groups and a plurality of second shift register circuit groups, and the first shift register circuit groups and the second shift register circuit groups are alternately arranged. A number of shift register circuits in a first shift register circuit group is equal to a number of shift register circuits in a second shift register circuit group. The first shift register circuit group is coupled to a first second clock signal line, a first third clock signal line and a first fourth clock signal line, and the second shift register circuit group is coupled to a second second clock signal line, a second third clock signal line and a second fourth clock signal line.

In some embodiments, a control sub-circuit of a (2i+1)th-stage shift register circuit includes a first release unit, a second release unit, a first storage unit and a second storage unit, and a control sub-circuit of a (2i+2)th-stage shift register circuit includes a first release unit and a second release unit. Each first release unit is coupled to a respective first node, a respective second clock signal terminal and a respective pull-up node. Each second release unit is coupled to a respective second node, a respective third clock signal terminal and the respective pull-up node. The first storage unit is at least coupled to a first input signal terminal, a first storage signal terminal and a first node. The second storage unit is at least coupled to a second input signal terminal, a fourth clock signal terminal, a second storage signal terminal and a second node. A first node and a second node of the control sub-circuit of the (2i+2)th-stage shift register circuit are coupled to the first node and the second node of the control sub-circuit of the (2i+1)th-stage shift register circuit, respectively.

In some embodiments, the plurality of shift register circuits are divided into a plurality of first shift register circuit groups and a plurality of second shift register circuit groups, and the first shift register circuit groups and the second shift register circuit groups are alternately arranged. A number of shift register circuits in a first shift register circuit group is equal to a number of shift register circuits in a second shift register circuit group. The first shift register circuit group is coupled to a first third clock signal line and a first fourth clock signal line, the second shift register circuit group is coupled to a second third clock signal line and a second fourth clock signal line, and all shift register circuits are coupled to a second clock signal line.

In some embodiments, a control sub-circuit of a (2i+1)th-stage shift register circuit includes a third release unit, a third storage unit and a fourth storage unit, and a control sub-circuit of a (2i+2)th-stage shift register circuit includes a third release unit. Each third release unit is coupled to a respective fifth node, a respective third clock signal terminal and a respective pull-up node. The third storage unit is at least coupled to a first input signal terminal, a third storage signal terminal and a fifth node. The fourth storage unit is coupled to a fourth clock signal terminal and a second input signal terminal. A fifth node of the control sub-circuit of the (2i+2)th-stage shift register circuit is coupled to the fifth node of the control sub-circuit of the (2i+1)th-stage shift register circuit.

In some embodiments, the plurality of shift register circuits are divided into a plurality of first shift register circuit groups, a plurality of second shift register circuit groups and a plurality of third shift register circuit groups, and the first shift register circuit groups, the second shift register circuit groups and the third shift register circuit groups are alternately arranged in sequence. A number of shift register circuits in a first shift register circuit group, a number of shift register circuits in a second shift register circuit group and a number of shift register circuits in a third shift register circuit group are equal to each other. The first shift register circuit group is coupled to a first third clock signal line and a first fourth clock signal line, the second shift register circuit group is coupled to a second third clock signal line and a second fourth clock signal line, and the third shift register circuit group is coupled to a third third clock signal line and a third fourth clock signal line.

In some embodiments, the plurality of shift register circuits are divided into a plurality of first shift register circuit groups, a plurality of second shift register circuit groups and a plurality of third shift register circuit groups, and the first shift register circuit groups, the second shift register circuit groups and the third shift register circuit groups are alternately arranged in sequence. A number of shift register circuits in a first shift register circuit group, a number of shift register circuits in a second shift register circuit group and a number of shift register circuits in a third shift register circuit group are equal to each other. The first shift register circuit group is coupled to a first third clock signal line, a third third clock signal line and a first fourth clock signal line, the second shift register circuit group is coupled to a second third clock signal line, the first third clock signal line and a second fourth clock signal line, and the third shift register circuit group is coupled to the third third clock signal line, the second third clock signal line and a third fourth clock signal line.

In yet another aspect, a display apparatus is provided, and the display apparatus includes a display panel and at least one gate driver circuit as described in any of the above embodiments.

In yet another aspect, a driving method for the gate driver circuit as described in any of the above embodiments is provided. The gate driver circuit includes a plurality of shift register circuit groups, an Xth-stage shift register circuit and a Yth-stage shift register circuit belong to different shift register circuit groups, and X and Y are both positive integers. The driving method includes a first phase, a second phase and a third phase. In the first phase, an input sub-circuit of the Xth-stage shift register circuit, under control of a first input signal received at a first input signal terminal, transmits the first input signal to a pull-up node coupled thereto; an output sub-circuit of the Xth-stage shift register circuit transmits a first clock signal received at a first clock signal terminal to a first signal output terminal under control of a voltage at the pull-up node coupled thereto; and a control sub-circuit of an (X+m)th-stage shift register circuit stores a first input signal received at another first input signal terminal under control of the first input signal received at the another first input signal terminal; the another first input signal terminal is coupled to the Xth-stage shift register circuit; m is a positive integer. In the second phase, a control sub-circuit of the Yth-stage shift register circuit releases an operating voltage of another pull-up node to the another pull-up node coupled thereto under control of a first control signal received at a first control signal terminal; an output sub-circuit of the Yth-stage shift register circuit transmits a first clock signal received at another first clock signal terminal to another first signal output terminal under control of the voltage at the another pull-up node coupled thereto; and a control sub-circuit of a (Y+n)th-stage shift register circuit, a second input signal terminal of which is coupled to the Yth-stage shift register circuit, stores a second input signal received at the second input signal terminal under control of the second input signal received at the second input signal terminal; n is a positive integer. In the third phase, the control sub-circuit of the (X+m)th-stage shift register circuit releases an operating voltage of yet another pull-up node to the yet another pull-up node coupled thereto under control of a first control signal received at another first control signal terminal; and an output sub-circuit of the (X+m)th-stage shift register circuit transmits a first clock signal received at yet another first clock signal terminal to yet another first signal output terminal under control of the voltage at the yet another pull-up node coupled thereto.

BRIEF DESCRIPTION OF THE DRAWINGS

In order to describe technical solutions in the present disclosure more clearly, the accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product, an actual process of a method and an actual timing of a signal to which the embodiments of the present disclosure relate.

FIG. 38 is a flow diagram of a driving method for a gate driver circuit, in accordance with some embodiments;

FIG. 39A is a timing diagram of a pixel driving circuit, in accordance with some embodiments;

DETAILED DESCRIPTION

Figure 1:
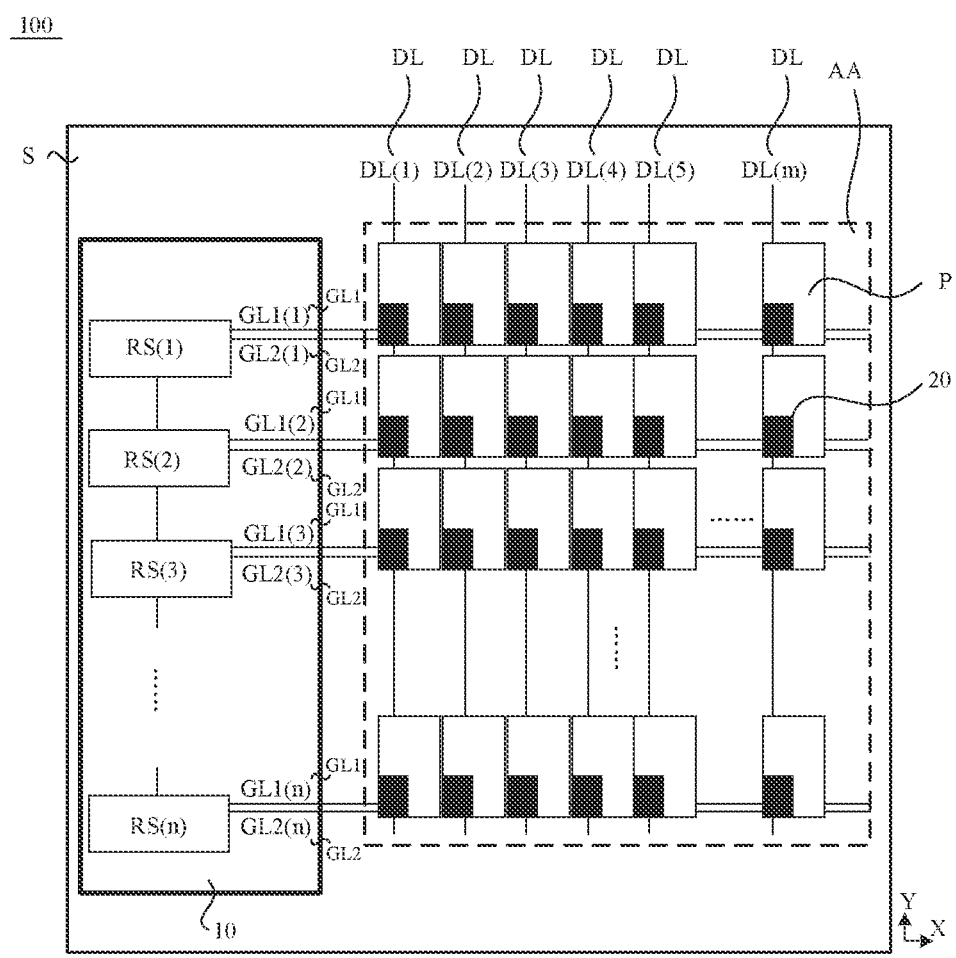
FIG. 1 is a structural diagram of a display panel, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined by "first" or "second" may explicitly or implicitly includes one or more of the features. In the description of the embodiments of the present disclosure, the term "a plurality of" or "the plurality of" means two or more unless otherwise specified.

In the description of some embodiments, the terms such as "coupled" and "connected" and their derivatives may be used. For example, the term "connected" may be used in the description of some embodiments to indicate that two or more components are in direct physical contact or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

As used herein, the term "if" is optionally construed as "when" or "in a case where" or "in response to determining that" or "in response to detecting", depending on the context. Similarly, the phrase "if it is determined that" or "if [a stated condition or event] is detected" is optionally construed as "in a case where it is determined that" or "in response to determining that" or "in a case where [the stated condition or event] is detected" or "in response to detecting [the stated condition or event]", depending on the context.

The use of the phrase "applicable to" or "configured to" herein means an open and inclusive language, which does not exclude devices that are applicable to or configured to perform additional tasks or steps.

Embodiments of the present disclosure provide a display apparatus. As shown in FIG. 1, the display apparatus includes a display panel 100. The display panel 100 has a display area (also referred to as an active area) AA and at least one peripheral area S located on a periphery of the display area.

As shown in FIG. 1, the display panel 100 includes a plurality of sub-pixels P arranged in the display area. The plurality of sub-pixels P include at least sub-pixels of first color, sub-pixels of second color and sub-pixels of third color. The first color, the second color and the third color are three primary colors, such as red, green and blue.

It will be noted that, FIG. 1 illustrates an example in which the plurality of sub-pixels P are arranged in an array of n rows and m columns, but the embodiments of the present disclosure are not limited thereto, and the plurality of sub-pixels P may also be arranged in other manners. Sub-pixels P arranged in a line in a horizontal direction X are referred to as sub-pixels in the same row, and sub-pixels P arranged in a line in a vertical direction Y are referred to as sub-pixels in the same column.

In some embodiments, as shown in FIG. 1, the display panel 100 is provided with a plurality of first scanning signal lines GL1 (GL1(1) to GL1(n)), a plurality of second scanning signal lines GL2 (GL2(1) to GL2(n)), and a plurality of data signal lines DL (DL(1) to DL(m)). For example, the first scanning signal lines GL1 and the second scanning signal lines GL2 extend in the horizontal direction X, and the data signal lines DL extend in the vertical direction Y.

In some embodiments, as shown in FIG. 1, the display panel 100 is provided with a gate driver circuit 10 in a peripheral area S. The gate driver circuit 10 includes a plurality of shift register circuits RS(1) to RS(n) that are cascaded. Each shift register circuit RS is coupled to a first scanning signal line GL1 and a second scanning signal line GL2, and is configured to provide a first scanning signal and a second scanning signal to the first scanning signal line GL1 and the second scanning signal line GL2, respectively.

In some other embodiments, the display apparatus further includes a gate driver. A gate driver circuit is integrated into the gate driver, and the gate driver is bonded to an edge of the display panel 100. The gate driver circuit includes a plurality of shift register circuits RS(1) to RS(n) that are cascaded. Each shift register circuit RS is coupled to a first scanning signal line GL1 and a second scanning signal line GL2, and is configured to provide a first scanning signal and a second scanning signal to the first scanning signal line GL1 and the second scanning signal line GL2, respectively.

It will be noted that the embodiments of the present disclosure are described by considering an example in which the gate driver circuit is disposed in the peripheral area S of the display panel 100, i.e., by considering a gate driver on array (GOA) circuit as an example.

Figure 2:
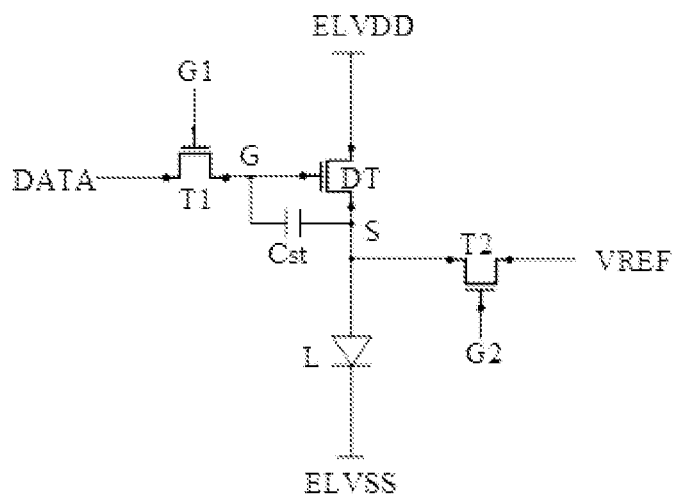
FIG. 2 is a structural diagram of a pixel driving circuit, in accordance with some embodiments.

In some embodiments, as shown in FIG. 1, each sub-pixel P is provided with a pixel driving circuit 20 therein. As shown in FIG. 2, the pixel driving circuit 20 is coupled to a light-emitting device L, and is configured to drive the light-emitting device L to emit light.

For example, the light-emitting device L includes an organic light-emitting diode (OLED) or a quantum dot light-emitting diode (QLED).

For example, as shown in FIG. 2, the pixel driving circuit 20 includes a storage capacitor Cst, a first switching transistor T1, a second switching transistor T2 and a driving transistor DT.

A control electrode of the first switching transistor T1 is coupled to a first scanning signal terminal G1, a first electrode of the first switching transistor T1 is coupled to a data signal terminal DATA, and a second electrode of the first switching transistor T1 is coupled to a control electrode G of the driving transistor DT. A control electrode of the second switching transistor T2 is coupled to a second scanning signal terminal G2, a first electrode of the second switching transistor T2 is coupled to a reference signal terminal VREF, and a second electrode of the second switching transistor T2 is coupled to a second electrode S of the driving transistor DT. A first electrode of the driving transistor DT is coupled to a first power signal terminal ELVDD. One terminal of the storage capacitor Cst is coupled to the control electrode G of the driving transistor DT, and the other terminal of the storage capacitor Cst is coupled to the second electrode S of the driving transistor DT.

A first electrode of the light-emitting device L is coupled to the second electrode S of the driving transistor DT, and a second electrode of the light-emitting device L is coupled to a second power signal terminal ELVSS.

The first scanning signal line GL1 is configured to provide the first scanning signal to the first scanning signal terminal G1, the second scanning signal line GL2 is configured to provide the second scanning signal to the second scanning signal terminal G2, and a data signal line DL is configured to provide a data signal to the data signal terminal DATA.

It will be noted that all the transistors in the embodiments of the present disclosure may be either P-type transistors or N-type transistors. For convenience, the following description will be made by considering N-type transistors as an example.

Figure 3:
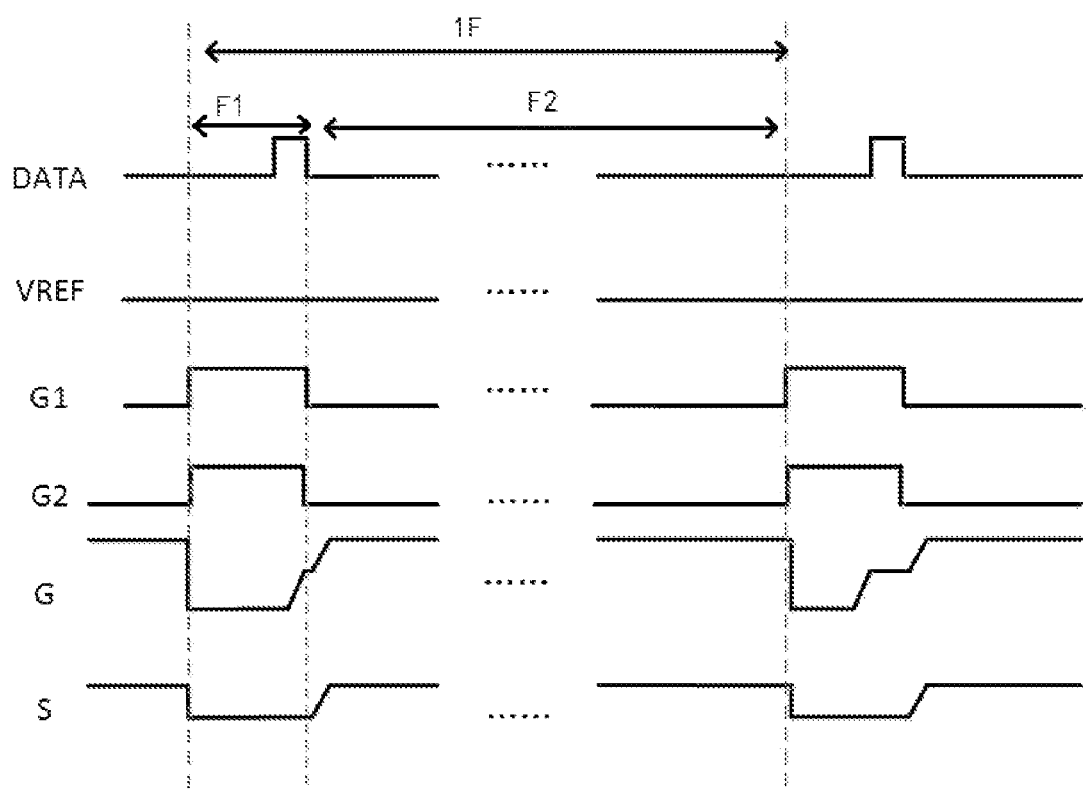
FIG. 3 is a timing diagram based on the pixel driving circuit in FIG. 2 in the related art.

In the related art, as shown in FIGS. 2 and 3, a process in which the pixel driving circuit 20 drives the light-emitting device L to emit light includes a data writing phase F1 and a light-emitting phase F2.

In the data writing phase F1, the first scanning signal line GL1 provides the first scanning signal with a high voltage to the first scanning signal terminal G1, and the first switching transistor T1 is turned on to write the data signal provided by the data signal terminal DATA to the control electrode G of the driving transistor DT. Meanwhile, the second scanning signal line GL2 provides the second scanning signal with a high voltage to the second scanning signal terminal G2, and the second switching transistor T2 is turned on to write a reference signal provided by the reference signal terminal VREF to the second electrode S of the driving transistor DT.

In the light-emitting phase F2, the first scanning signal provided by the first scanning signal line GL1 to the first scanning signal terminal G1 and the second scanning signal provided by the second scanning signal line GL2 to the second scanning signal terminal G2 are both at a low voltage, and the first switching transistor T1 and the second switching transistor T2 are turned off. The driving transistor DT is turned on to transmit a first power signal provided by the first power signal terminal ELVDD to the second electrode S of the driving transistor DT due to an action of a high voltage of the control electrode G of the driving transistor DT. In this case, the voltage of the control electrode G of the driving transistor DT is further raised due to a bootstrap effect of the storage capacitor Cst, and the driving transistor DT remains turned on and drives the light-emitting device L to emit light.

However, in a process of switching dynamic pictures, i.e., in a process of switching from one image frame to another image frame, if an operating duration of the light-emitting device L is too long, an image smear of a previous image frame will occur, thereby affecting an image display effect.

Figure 4:
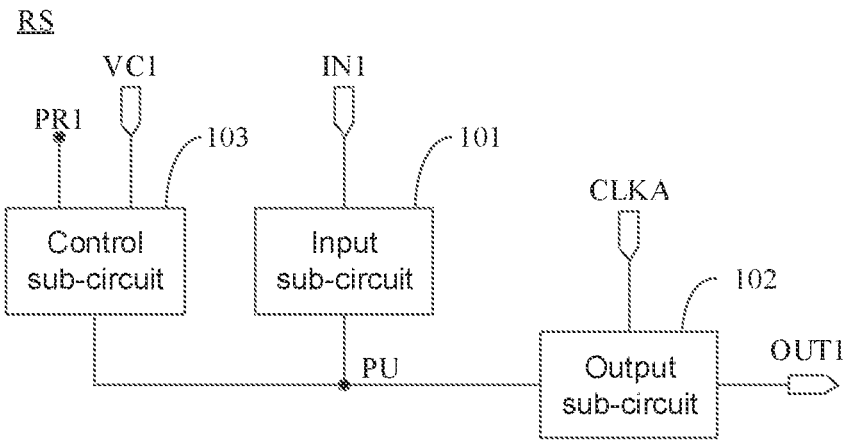
FIG. 4 is a block diagram of a shift register circuit, in accordance with some embodiments.

The embodiments of the present disclosure provide a shift register circuit RS. As shown in FIG. 4, the shift register circuit RS includes an input sub-circuit 101, an output sub-circuit 102 and a control sub-circuit 103.

The input sub-circuit 101 is coupled to a first input signal terminal IN1 and a pull-up node PU, and is configured to, under control of a first input signal received at the first input signal terminal IN1, transmit the first input signal to the pull-up node PU, so that the pull-up node PU is at an operating voltage.

It will be noted that first input signal terminals IN1 of first several stages of shift register circuits may be coupled to a first initial signal line of the display panel, and the first initial signal line is configured to transmit a first initial signal, so that the gate driver circuit starts operating in response to the first initial signal. The number of shift register circuits coupled to the first initial signal line may be determined according to an actual circuit design. First input signal terminals of other stages of shift register circuits, other than the first several stages of shift register circuits coupled to the first initial signal line, are each coupled to a signal output terminal, used for implementing cascade, of a previous shift register circuit. That is, a first input signal is a cascaded output signal of the previous shift register circuit.

The output sub-circuit 102 is coupled to the pull-up node PU, a first clock signal terminal CLKA and a first signal output terminal OUT1, and is configured to transmit a first clock signal received at the first clock signal terminal CLKA to the first signal output terminal OUT1 under control of a voltage at the pull-up node PU, so as to scan the first scanning signal line coupled to the first signal output terminal OUT1.

It will be noted that, after the first signal output terminal OUT1 outputs the first clock signal (i.e., a first scanning signal) to a corresponding first scanning signal line, the pixel driving circuit 20 in the display panel 100 will be in an operating state, thereby driving the light-emitting device L to emit light in combination with a data driving signal.

The control sub-circuit 103 is coupled to at least one first reference node PR1, at least one first control signal terminal VC1 and the pull-up node PU, and is configured to transmit a voltage at a corresponding first reference node PR1 to the pull-up node PU under control of a first control signal received at a first control signal terminal VC1, so that the pull-up node PU is at the operating voltage.

It will be noted that the first reference node PR1 may release the operating voltage of the pull-up node PU to the pull-up node PU. That is, the control sub-circuit 103 may control the pull-up node PU to be at the operating voltage at an appropriate time. A connection relationship of the first reference node PR1 may be determined according to an actual circuit.

In the embodiments of the present disclosure, the control sub-circuit 103 of the shift register circuit may release the operating voltage of the pull-up node PU to the pull-up node PU in response to the first control signal when needed. In this way, after an output sub-circuit 102 of a current-stage shift register circuit completes signal output for normal image display, a control sub-circuit 103 of another stage of shift register circuit may transmit a voltage at a first reference node PR1 to a pull-up node PU, so that the pull-up node PU is at an operating voltage, thereby enabling an output sub-circuit 102 of the another stage of shift register circuit to be capable of implementing signal output for black image display. Based on this, after the current-stage shift register circuit completes scanning of a corresponding first scanning signal line, the another stage of shift register circuit performs scanning of a corresponding first scanning signal line, so that a black image may be inserted during normal image display.

The shift register circuit provided by the embodiments of the present disclosure may improve a motion picture response time (MPRT) function of the display apparatus to ameliorate the problem of dynamic image smear since a black image insertion process is added in the normal display process and thus the light-emitting duration of the display apparatus is shortened.

Figure 5:
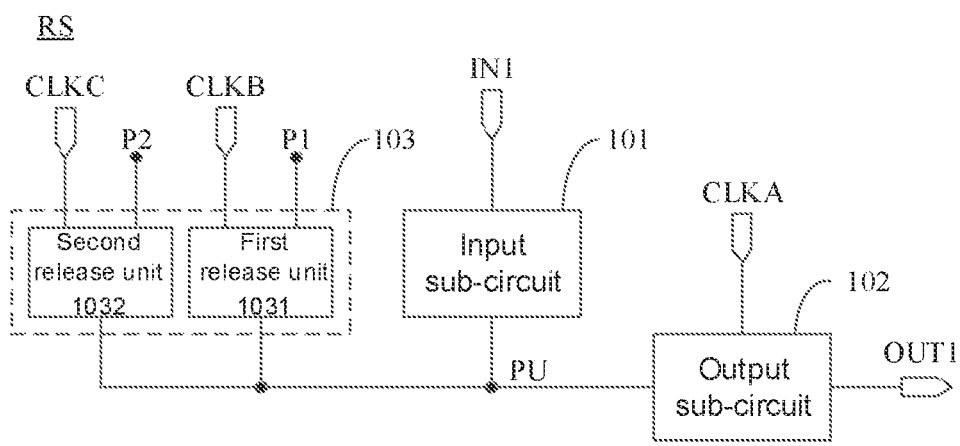
FIG. 5 is a block diagram of another shift register circuit, in accordance with some embodiments.

In some embodiments, as shown in FIG. 5, the control sub-circuit 103 is coupled to two first reference nodes PR1 and two first control signal terminals VC1. The two first reference nodes PR1 are a first node P1 and a second node P2, and the two first control signal terminals VC1 are a second clock signal terminal CLKB and a third clock signal terminal CLKC.

In some examples, as shown in FIG. 5, the control sub-circuit 103 includes a first release unit 1031 and a second release unit 1032.

The first release unit 1031 is coupled to the first node P1, the second clock signal terminal CLKB and the pull-up node PU, and is configured to transmit a voltage at the first node P1 to the pull-up node PU under control of a second clock signal received at the second clock signal terminal CLKB.

It will be noted that the voltage at the first node P1 may be provided by a circuit coupled to the first node P1; alternatively, the voltage at the first node P1 may also be obtained by multiplexing a voltage at a first node P1 of another shift register circuit.

The second release unit 1032 is coupled to the second node P2, the third clock signal terminal CLKC and the pull-up node PU, and is configured to transmit a voltage at the second node P2 to the pull-up node PU under control of a third clock signal received at the third clock signal terminal CLKC.

It will be noted that the voltage at the second node P2 may be provided by a circuit coupled to the second node P2; alternatively, the voltage at the second node P2 may also be obtained by multiplexing a voltage at a second node P2 of another shift register circuit.

Figure 6:
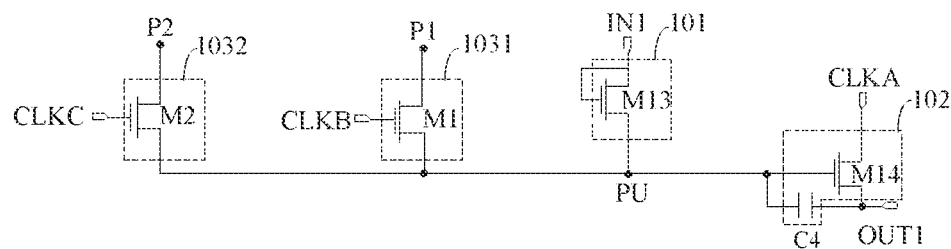
FIG. 6 is a structural diagram of a shift register circuit based on FIG. 5.

For example, as shown in FIG. 6, the first release unit 1031 includes a first transistor M1.

A control electrode of the first transistor M1 is coupled to the second clock signal terminal CLKB, a first electrode of the first transistor M1 is coupled to the first node P1, and a second electrode of the first transistor M1 is coupled to the pull-up node PU. The first transistor M1 may transmit the voltage at the first node P1 to the pull-up node PU in response to the second clock signal received at the second clock signal terminal CLKB.

For example, as shown in FIG. 6, the second release unit 1032 includes a second transistor M2.

A control electrode of the second transistor M2 is coupled to the third clock signal terminal CLKC, a first electrode of the second transistor M2 is coupled to the second node P2, and a second electrode of the second transistor M2 is coupled to the pull-up node PU. The second transistor M2 may transmit the voltage at the second node P2 to the pull-up node PU in response to the third clock signal received at the third clock signal terminal CLKC.

Figure 7:
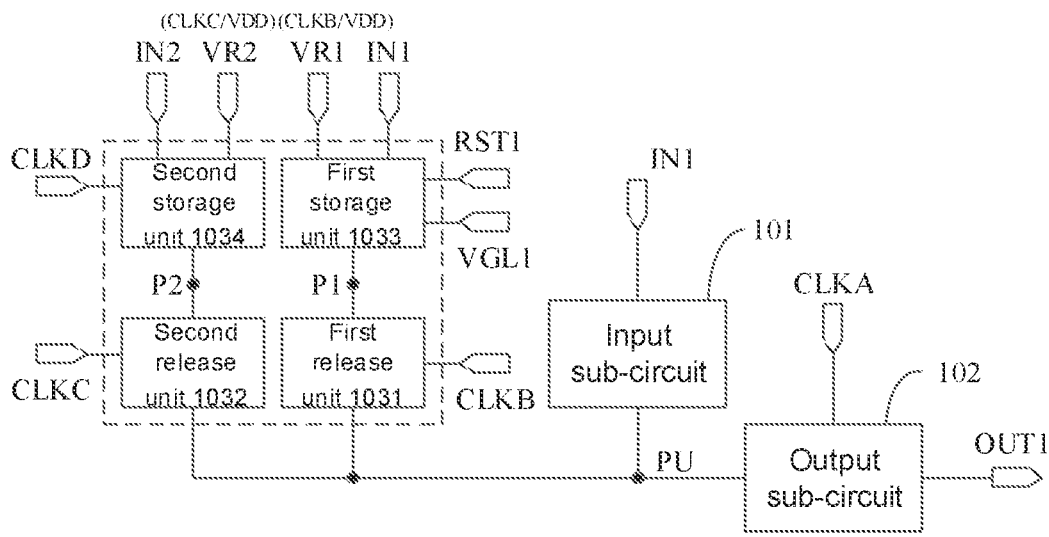
FIG. 7 is a block diagram of yet another shift register circuit, in accordance with some embodiments.

In some examples, as shown in FIG. 7, the control sub-circuit 103 further includes a first storage unit 1033 and a second storage unit 1034.

The first storage unit 1033 is coupled to the first input signal terminal IN1, a first storage signal terminal VR1 and the first node P1, and is configured to store the first input signal under the control of the first input signal received at the first input signal terminal IN1, and to transmit a first storage signal received at the first storage signal terminal VR1 to the first node P1 under the control of the first input signal, so that the first release unit 1031 transmits the voltage at the first node P1 to the pull-up node PU under the control of the second clock signal. In addition, the first storage unit 1033 is further coupled to a first reset signal terminal RST1 and a first voltage signal terminal VGL1, and is configured to reset the first storage unit 1033 under control of a first reset signal received at the first reset signal terminal RST1.

It will be noted that the first storage signal provided by the first storage signal terminal VR1 may be a clock signal or a fixed level signal. For example, the first storage signal terminal VR1 may be the second clock signal terminal CLKB or a second voltage signal terminal VDD, and the first storage signal is the second clock signal or a second voltage signal correspondingly. In addition, the first reset signal terminal RST1 may be coupled to a signal output terminal, used for implementing cascade, of a subsequent shift register circuit. That is, the first reset signal is a cascade output signal of the subsequent shift register circuit.

The second storage unit 1034 is at least coupled to a second input signal terminal IN2, a fourth clock signal terminal CLKD, a second storage signal terminal VR2 and the second node P2, and is configured to store a second input signal received at the second input signal terminal IN2 under control of a fourth clock signal received at the fourth clock signal terminal CLKD, and to transmit a second storage signal received at the second storage signal terminal VR2 to the second node P2 under control of the second input signal, so that the second release unit 1032 transmits the voltage at the second node P2 to the pull-up node PU under control of the third clock signal.

It will be noted that the second storage signal provided by the second storage signal terminal VR2 may be a clock signal or a fixed level signal. For example, the second storage signal terminal VR2 may be the third clock signal terminal CLKC or the second voltage signal terminal VDD, and the second storage signal is the third clock signal or the second voltage signal correspondingly. In addition, second input signal terminals IN2 of the first several stages of shift register circuits may be coupled to a second initial signal line STU of the display panel. The second initial signal line STU is configured to transmit a second initial signal, so that the shift register circuit stores the second input signal, so as to release the operating voltage of the pull-up node PU to the pull-up node PU when a black image is displayed. The number of shift register circuits coupled to the second initial signal line STU may be determined according to the actual circuit design.

Second input signal terminals IN2 of other stages of shift register circuits, other than the first several stages of shift register circuits coupled to the second initial signal line STU, may each be coupled to a signal output terminal, used for implementing cascade, of a previous shift register circuit. That is, a second input signal is a cascaded output signal of the previous shift register circuit. Of course, a previous shift register circuit coupled to the second input signal terminal of the shift register circuit and a previous shift register circuit coupled to the first input signal terminal of the shift register circuit may be the same or different, which may be determined according to the actual circuit.

Figure 8A:
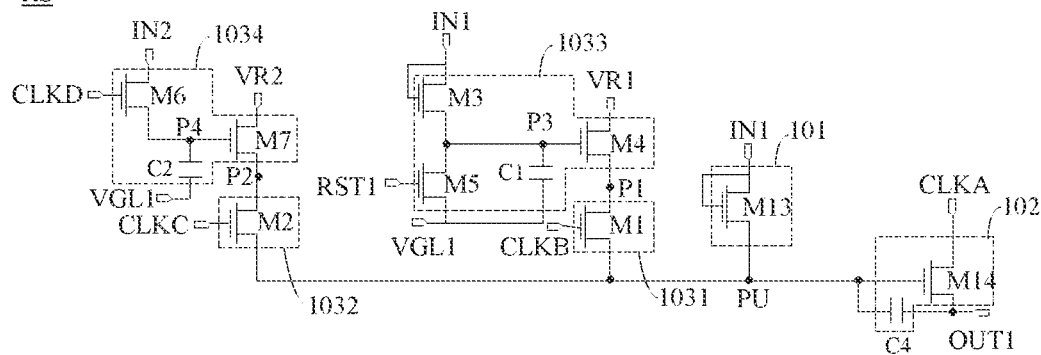
FIG. 8A is a structural diagram of a shift register circuit based on FIG. 7.
Figure 8B:
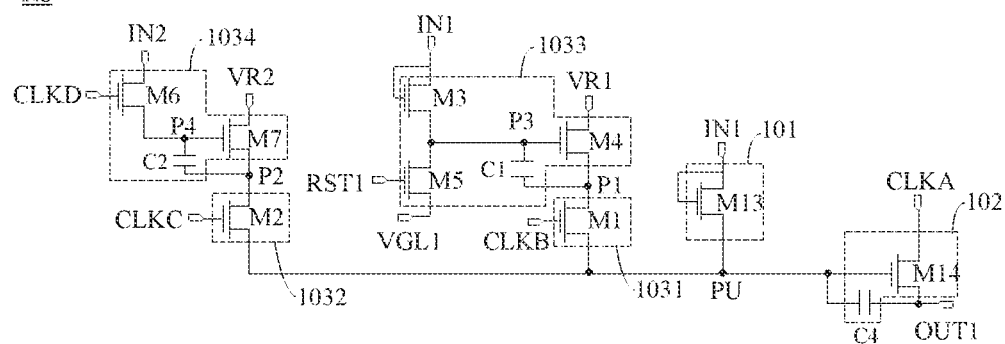
FIG. 8B is a structural diagram of another shift register circuit based on FIG. 7.

For example, as shown in FIGS. 8A and 8B, the first storage unit 1033 includes a third transistor M3, a fourth transistor M4, a fifth transistor M5 and a first storage capacitor C1.

A control electrode and a first electrode of the third transistor M3 are coupled to the first input signal terminal IN1, and a second electrode of the third transistor M3 is coupled to a third node P3. The third transistor M3 may transmit the first input signal to the third node P3 in response to the first input signal received at the first input signal terminal IN1.

A control electrode of the fourth transistor M4 is coupled to the third node P3, a first electrode of the fourth transistor M4 is coupled to the first storage signal terminal VR1, and a second electrode of the fourth transistor M4 is coupled to the first node P1. The fourth transistor M4 may transmit the first storage signal received at the first storage signal terminal VR1 to the first node P1 in response to a voltage at the third node P3.

A control electrode of the fifth transistor M5 is coupled to the first reset signal terminal RST1, a first electrode of the fifth transistor M5 is coupled to the first voltage signal terminal VGL1, and a second electrode of the fifth transistor M5 is coupled to the third node P3. The fifth transistor M5 may transmit a first voltage signal received at the first voltage signal terminal VGL1 to the third node P3 in response to the first reset signal received at the first reset signal terminal RST1.

One terminal of the first storage capacitor C1 is coupled to the third node P3, and the other terminal of the first storage capacitor C1 is coupled to the first voltage signal terminal VGL1 (as shown in FIG. 8A) or the first node P1 (as shown in FIG. 8B).

It will be noted that the voltage at the first node P1 may be provided by the first storage signal terminal VR1 when the fourth transistor M4 is turned on; alternatively, the voltage at the first node P1 may also be obtained by multiplexing a voltage at a first node P1 of a previous shift register circuit. For example, in the gate driver circuit, a voltage at a first node P1 of a (4i+1)th-stage shift register circuit is provided by a first storage signal terminal VR1 of the (4i+1)th-stage shift register circuit, and voltages at first nodes P1 of (4i+2)th-stage to (4i+4)th-stage shift register circuits each multiplex the voltage at the first node P1 of the (4i+1)th-stage shift register circuit, where i is a positive integer greater than or equal to 0. For another example, in the gate driver circuit, a voltage at a first node P1 of a shift register circuit at an odd-numbered stage is provided by the first storage signal terminal VR1, and a voltage at a first node P1 of a shift register circuit at an even-numbered stage multiplexes a voltage at a first node P1 of its previous shift register circuit at the odd-numbered stage. Here, a multiplexing manner of the first node P1 needs to be determined according to a cascade relationship of shift register circuits.

For example, as shown in FIGS. 8A and 8B, the second storage unit 1034 includes a sixth transistor M6, a seventh transistor M7 and a second storage capacitor C2.

A control electrode of the sixth transistor M6 is coupled to the fourth clock signal terminal CLKD, a first electrode of the sixth transistor M6 is coupled to the second input signal terminal IN2, and a second electrode of the sixth transistor M6 is coupled to a fourth node P4. The sixth transistor M6 may transmit the second input signal received at the second input signal terminal IN2 to the fourth node P4 in response to the fourth clock signal received at the fourth dock signal terminal CLKD.

A control electrode of the seventh transistor M7 is coupled to the fourth node P4, a first electrode of the seventh transistor M7 is coupled to the second storage signal terminal VR2, and a second electrode of the seventh transistor M7 is coupled to the second node P2. The seventh transistor M7 may transmit the second storage signal received at the second storage signal terminal VR2 to the second node P2 in response to a voltage at the fourth node P4.

One terminal of the second storage capacitor C2 is coupled to the fourth node P4, and the other terminal of the second storage capacitor C2 is coupled to the first voltage signal terminal VGL1 (as shown in FIG. 8A) or the second node P2 (as shown in FIG. 8B).

It will be noted that the voltage at the second node P2 may be provided by the second storage signal terminal VR2 when the seventh transistor M7 is turned on; alternatively, the voltage at the second node P2 may also be obtained by multiplexing a voltage at a second node P2 of a previous shift register circuit. For example, in the gate driver circuit, a voltage at a second node P2 of the (4i+1)th-stage shift register circuit is provided by a second storage signal terminal VR2 of the (4i+1)th-stage shift register circuit, and voltages at second nodes P2 of the (4i+2)th-stage to (4i+4)th-stage shift register circuits each multiplex the voltage at the second node P2 of the (4i+1)th-stage shift register circuit. For another example, in the gate driver circuit, a voltage at a second node P2 of the shift register circuit at the odd-numbered stage is provided by the second storage signal terminal VR2, and a voltage at a second node P2 of the shift register circuit at the even-numbered stage multiplexes a voltage at a second node P2 of its previous shift register circuit at the odd-numbered stage. Here, a multiplexing manner of the second node P2 needs to be determined according to a cascade relationship of the shift register circuits.

It will be known based on the above embodiments that, a circuit portion constituted of the first transistor M1, the third transistor M3, the fourth transistor M4, the fifth transistor M5 and the first storage capacitor C1 may store the first input signal, and release the operating voltage of the pull-up node PU to the pull-up node PU in response to the second clock signal, and a circuit portion constituted of the second transistor M2, the sixth transistor M6, the seventh transistor M7 and the second storage capacitor C2 may store the second input signal, and release the operating voltage of the pull-up node PU to the pull-up node PU in response to the third clock signal. Therefore, the shift register circuit provided by the embodiments of the present disclosure may implement storage and release of the operating voltage of the pull-up node PU as required.

It will be noted that the first voltage signal terminal VGL1 is configured to transmit a direct-current (DC) low voltage signal (e.g., lower than or equal to a low voltage portion of a clock signal). For example, the first voltage signal terminal VGL1 is grounded. Here, the DC low voltage signal is referred to as the first voltage signal. The second voltage signal terminal VDD is configured to transmit a DC high voltage signal (e.g., a voltage higher than or equal to a voltage of a high voltage portion of the clock signal). Here, the DC high voltage signal is referred to as the second voltage signal, and a voltage value of the second voltage signal is greater than a voltage value of the first voltage signal. The following embodiments are the same as the above contents, which will not be described again.

It will be understood that in a case where the shift register circuit is applied to the gate driver circuit, a driving process of the gate driver circuit may change according to connection manners of terminals of the shift register circuit and a timing of each signal, which is not limited in the embodiments of the present disclosure.

Figure 9:
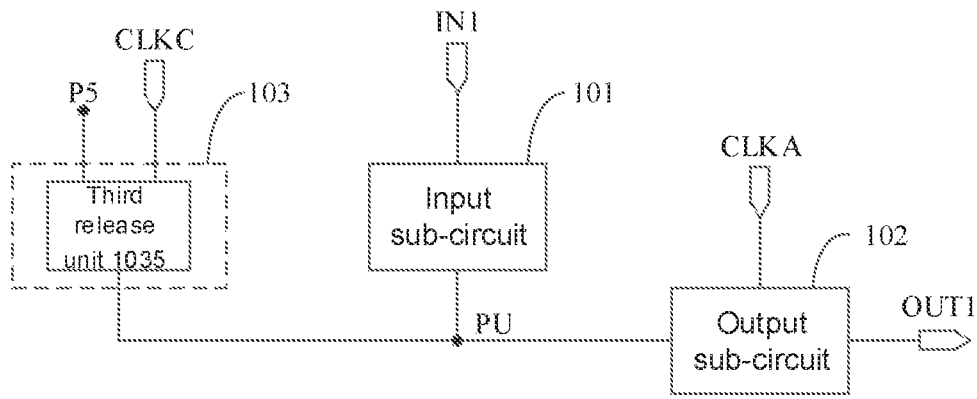
FIG. 9 is a block diagram of yet another shift register circuit, in accordance with some embodiments.

In some other embodiments, as shown in FIG. 9, the control sub-circuit 103 is coupled to a single first reference node PR1 and a single first control signal terminal VC1. The single first reference node PR1 is a fifth node P5, and the single first control signal terminal VC1 is the third clock signal terminal CLKC.

In some examples, as shown in FIG. 9, the control sub-circuit 103 includes a third release unit 1035.

The third release unit 1035 is coupled to the fifth node P5, the third clock signal terminal CLKC and the pull-up node PU, and is configured to transmit a voltage at the fifth node P5 to the pull-up node PU under the control of the third clock signal received at the third clock signal terminal CLKC.

It will be noted that the voltage at the fifth node P5 may be provided by a circuit coupled to the fifth node P5; alternatively, the voltage at the fifth node P5 may also be obtained by multiplexing a voltage at a fifth node P5 of another shift register circuit.

Figure 10:
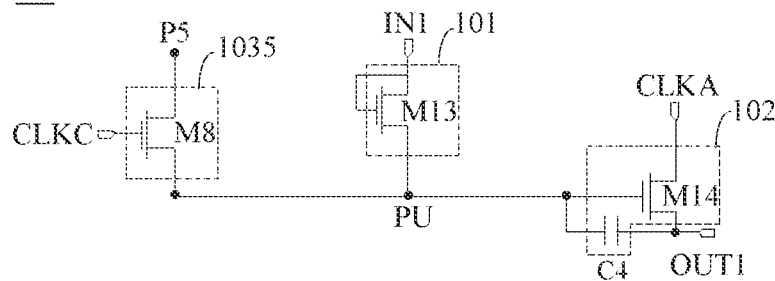
FIG. 10 is a structural diagram of a shift register circuit based on FIG. 9.

For example, as shown in FIG. 10, the third release unit 1035 includes an eighth transistor M8.

A control electrode of the eighth transistor M8 is coupled to the third clock signal terminal CLKC, a first electrode of the eighth transistor M8 is coupled to the fifth node P5, and a second electrode of the eighth transistor M8 is coupled to the pull-up node PU. The eighth transistor M8 may transmit the voltage at the fifth node P5 to the pull-up node PU in response to the third clock signal received at the third clock signal terminal CLKC.

Figure 11:
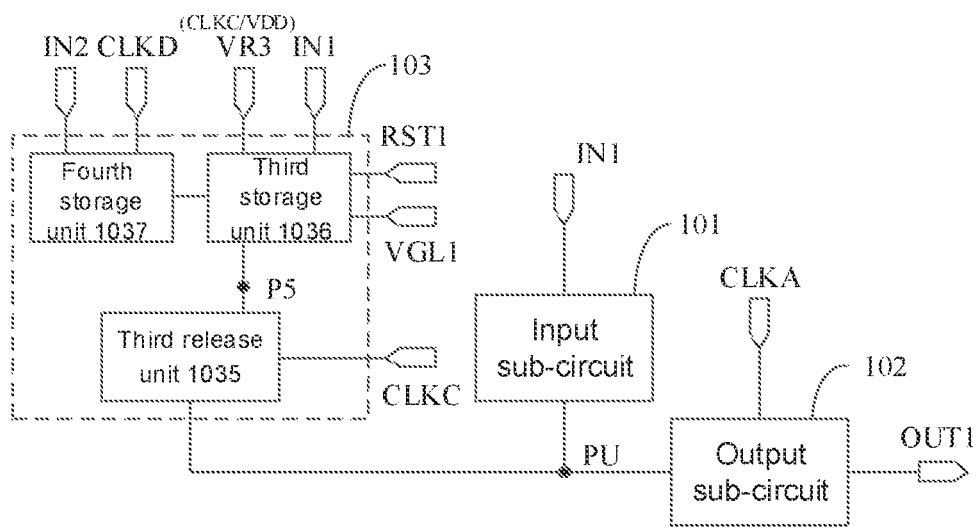
FIG. 11 is a block diagram of yet another shift register circuit, in accordance with some embodiments.

In some examples, as shown in FIG. 11, the control sub-circuit 103 further includes a third storage unit 1036 and a fourth storage unit 1037.

The third storage unit 1036 is coupled to the first input signal terminal IN1, a third storage signal terminal VR3 and the fifth node P5, and is configured to store the first input signal under the control of the first input signal received at the first input signal terminal IN1, and to transmit a third storage signal received at the third storage signal terminal VR3 to the fifth node P5 under the control of the first input signal, so that the third release unit 1035 transmits the voltage at the fifth node P5 to the pull-up node PU under the control of the third clock signal. In addition, the third storage unit 1036 is further coupled to the first reset signal terminal RST1 and the first voltage signal terminal VGL1, and is configured to reset the third storage unit 1036 under control of the first reset signal received at the first reset signal terminal RST1.

It will be noted that the third storage signal provided by the third storage signal terminal VR3 may be a clock signal or a fixed level signal. For example, the third storage signal terminal VR3 may be the third clock signal terminal CLKC or the second voltage signal terminal VDD, and the third storage signal is the third clock signal or the second voltage signal correspondingly.

The fourth storage unit 1037 is coupled to the fourth clock signal terminal CLKD and the second input signal terminal IN2, and is configured to store the second input signal received at the second input signal terminal IN2 under the control of the fourth clock signal received at the fourth clock signal terminal CLKD. On this basis, the third storage unit 1036 is further configured to transmit the third storage signal received at the third storage signal terminal VR3 to the fifth node P5 under the control of the second input signal, so that the third release unit 1035 transmits the voltage at the fifth node P5 to the pull-up node PU under the control of the third clock signal. It can be seen that a portion of the circuit of the third storage unit 1036 assists the fourth storage unit 1037 to implement its complete function.

Figure 12A:
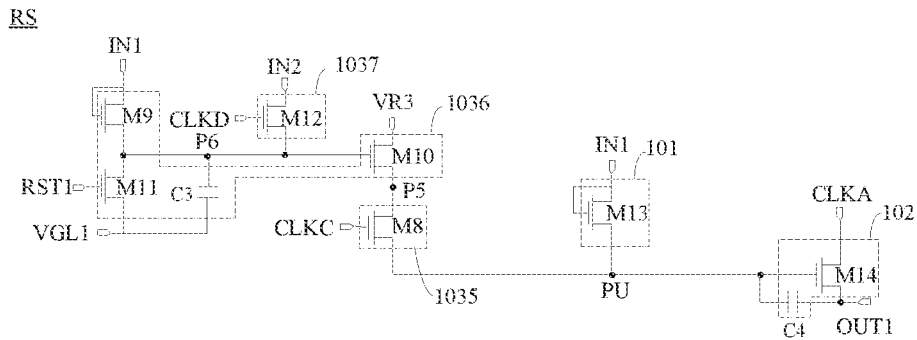
FIG. 12A is a structural diagram of a shift register circuit based on FIG. 10.
Figure 12B:
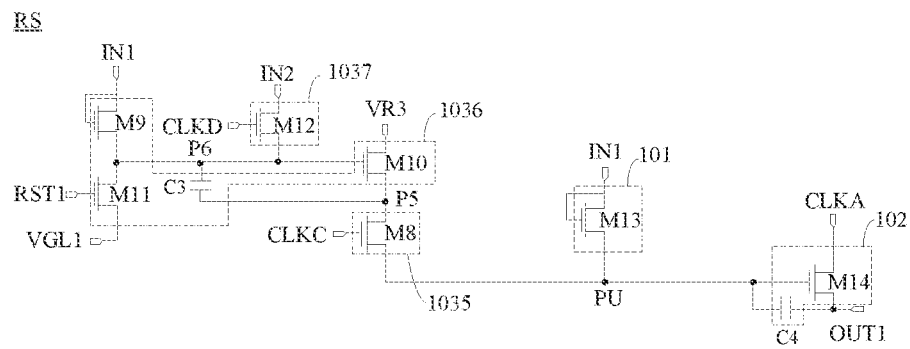
FIG. 12B is a structural diagram of another shift register circuit based on FIG. 10.

For example, as shown in FIGS. 12A and 12B, the third storage unit 1036 includes a ninth transistor M9, a tenth transistor M10, an eleventh transistor M11 and a third storage capacitor C3.

A control electrode and a first electrode of the ninth transistor M9 are coupled to the first input signal terminal IN1, and a second electrode of the ninth transistor M9 is coupled to a sixth node P6. The ninth transistor M9 may transmit the first input signal to the sixth node P6 in response to the first input signal received at the first input signal terminal IN1.

A control electrode of the tenth transistor M10 is coupled to the sixth node P6, a first electrode of the tenth transistor M10 is coupled to the third storage signal terminal VR3, and a second electrode of the tenth transistor M10 is coupled to the fifth node P5. The tenth transistor M10 may transmit the third storage signal received at the third storage signal terminal VR3 to the fifth node P5 in response to a voltage at the sixth node P6.

A control electrode of the eleventh transistor M11 is coupled to the first reset signal terminal RST1, a first electrode of the eleventh transistor M11 is coupled to the first voltage signal terminal VGL1, and a second electrode of the eleventh transistor M11 is coupled to the sixth node P6. The eleventh transistor M11 may transmit the first voltage signal received at the first voltage signal terminal VGL1 to the sixth node P6 in response to the first reset signal received at the first reset signal terminal RST1.

One terminal of the third storage capacitor C3 is coupled to the sixth node P6, and the other terminal of the third storage capacitor C3 is coupled to the first voltage signal terminal VGL1 (as shown in FIG. 12A) or the fifth node P5 (as shown in FIG. 12B).

It will be noted that the voltage at the fifth node P5 may be provided by the third storage signal terminal VR3 when the tenth transistor M10 is turned on; alternatively, the voltage at the fifth node P5 may also be obtained by multiplexing a voltage at a fifth node P5 of a previous shift register circuit. For example, in the gate driver circuit, a voltage at a fifth node P5 of the shift register circuit at the odd-numbered stage is provided by the third storage signal terminal VR3, and a voltage at a fifth node P5 of the shift register circuit at the even-numbered stage multiplexes a voltage at a fifth node P5 of its previous shift register circuit at the odd-numbered stage.

For example, as shown in FIGS. 12A and 12B, the fourth storage unit 1037 includes a twelfth transistor M12.

A control electrode of the twelfth transistor M12 is coupled to the fourth clock signal terminal CLKD, a first electrode of the twelfth transistor M12 is coupled to the second input signal terminal IN2, and a second electrode of the twelfth transistor M12 is coupled to the sixth node P6. The twelfth transistor M12 may transmit the second input signal received at the second input signal terminal IN2 to the sixth node P6 in response to the fourth clock signal received at the fourth clock signal terminal CLKD.

It will be known based on the above embodiments that, a circuit portion constituted of the eighth transistor M8, the ninth transistor M9, the tenth transistor M10, the eleventh transistor M11 and the third storage capacitor C3 may store the first input signal, and release the operating voltage of the pull-up node PU to the pull-up node PU in response to the third clock signal, and a circuit portion constituted of the eighth transistor M8, the tenth transistor M10, the twelfth transistor M12 and the third storage capacitor C3 may store the second input signal, and release the operating voltage of the pull-up node PU to the pull-up node PU in response to the third clock signal. Therefore, the shift register circuit provided by the embodiments of the present disclosure may implement storage and release of the operating voltage of the pull-up node PU as required.

In some embodiments, as shown in FIGS. 5 to 12B, the input sub-circuit 101 includes a thirteenth transistor M13. A control electrode and a first electrode of the thirteenth transistor M13 are coupled to the first input signal terminal IN1, and a second electrode of the thirteenth transistor M13 is coupled to the pull-up node PU. The thirteenth transistor M13 may transmit the first input signal to the pull-up node PU in response to the first input signal received at the first input signal terminal IN1, so that the pull-up node PU is at the operating voltage.

In some embodiments, as shown in FIGS. 5 to 12B, the output sub-circuit 102 includes a fourteenth transistor M14 and a fourth storage capacitor C4. A control electrode of the fourteenth transistor M14 is coupled to the pull-up node PU, a first electrode of the fourteenth transistor M14 is coupled to the first clock signal terminal CLKA, and a second electrode of the fourteenth transistor M14 is coupled to the first signal output terminal OUT1. The fourteenth transistor M14 may transmit the first clock signal received at the first clock signal terminal CLKA to the first signal output terminal OUT1 in response to the voltage at the pull-up node PU. One terminal of the fourth storage capacitor C4 is coupled to the pull-up node PU, and the other terminal of the fourth storage capacitor C4 is coupled to the first signal output terminal OUT1.

Figure 13:
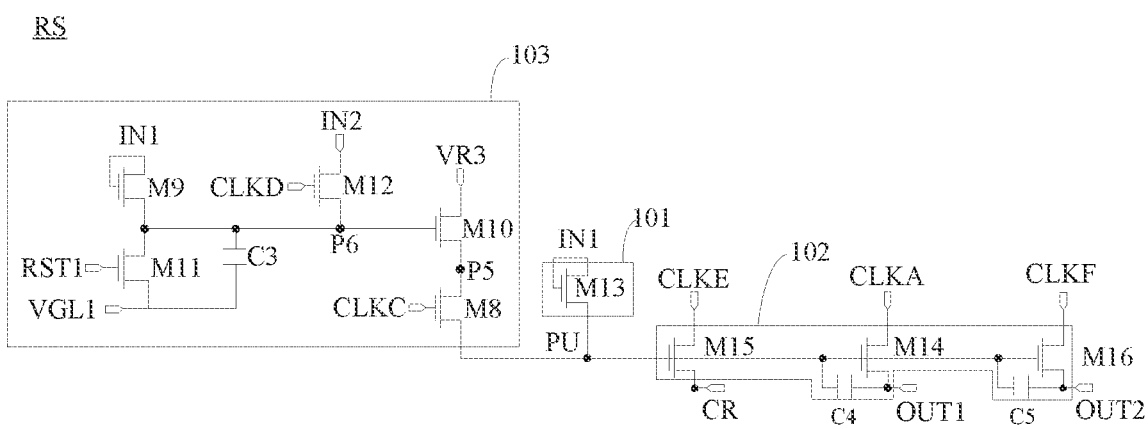
FIG. 13 is a structural diagram of a shift register circuit, in accordance with some embodiments.

In some embodiments, as shown in FIG. 13, the output sub-circuit 102 is further coupled to a fifth clock signal terminal CLKE, a sixth clock signal terminal CLKF, a cascade signal output terminal CR and a second signal output terminal OUT2. In this case, the output sub-circuit 102 further includes a fifteenth transistor M15, a sixteenth transistor M16 and a fifth storage capacitor C5.

A control electrode of the fifteenth transistor M15 is coupled to the pull-up node PU, a first electrode of the fifteenth transistor M15 is coupled to the fifth clock signal terminal CLKE, and a second electrode of the fifteenth transistor M15 is coupled to the cascade signal output terminal CR. The fifteenth transistor M15 may transmit a fifth clock signal received at the fifth clock signal terminal CLKE to the cascade signal output terminal CR in response to the voltage at the pull-up node PU.

A control electrode of the sixteenth transistor M16 is coupled to the pull-up node PU, a first electrode of the sixteenth transistor M16 is coupled to the sixth clock signal terminal CLKF, and a second electrode of the sixteenth transistor M16 is coupled to the second signal output terminal OUT2. The sixteenth transistor M16 may transmit a sixth clock signal received at the sixth clock signal terminal CLKF to the second signal output terminal OUT2 in response to the voltage at the pull-up node PU.

One terminal of the fifth storage capacitor C5 is coupled to the pull-up node PU, and the other terminal of the fifth storage capacitor C5 is coupled to the second signal output terminal OUT2.

In this way, a first input signal terminal IN1 of an Nth-stage shift register circuit, other than the first several stages of shift register circuits, may be coupled to a cascade signal output terminal CR of an (N−j)th-stage shift register circuit, where j is a positive integer less than N and may be set to, for example, one of 1 to 4.

In some embodiments, in the gate driver circuit, the shift register circuit at the odd-numbered stage and the shift register circuit at the even-numbered stage have different circuit structures.

In some examples, the control sub-circuit 103 of the shift register circuit includes the first release unit 1031, the second release unit 1032, the first storage unit 1033 and the second storage unit 1034. The second input signal terminal IN2 coupled to the second storage unit 1034 is coupled to a cascade signal output terminal CR of a previous shift register circuit. For example, a second input signal terminal IN2 of the Nth-stage shift register circuit is coupled to a cascade signal output terminal CR of an (N−7)th-stage shift register circuit.

In some other examples, the control sub-circuit 103 of the shift register circuit includes the third release unit 1035, the third storage unit 1036 and the fourth storage unit 1037. The second input signal terminal IN2 coupled to the fourth storage unit 1037 is coupled to a cascade signal output terminal CR of a previous shift register circuit. For example, the second input signal terminal IN2 of the Nth-stage shift register circuit is coupled to a cascade signal output terminal CR of an (N−4)th-stage shift register circuit.

Figure 14:
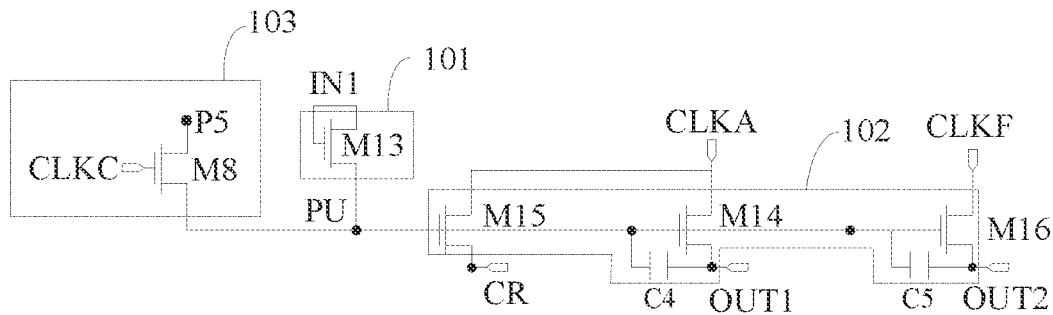
FIG. 14 is a structural diagram of a shift register circuit located at an even-numbered stage in a gate driver circuit, in accordance with some embodiments.

Based on the above two examples, in a case where the shift register circuit is located at the odd-numbered stage in the gate driver circuit, a structure of the shift register circuit is the structure shown in FIG. 13. In a case where the shift register circuit is located at the even-numbered stage in the gate driver circuit, as shown in FIG. 14, the first clock signal terminal CLKA and the fifth clock signal terminal CLKE may be the same signal terminal. That is, the first output signal output by the first signal output terminal OUT1 and the cascade output signal output by the cascade signal output terminal CR are the same clock signal.

Figure 15A:
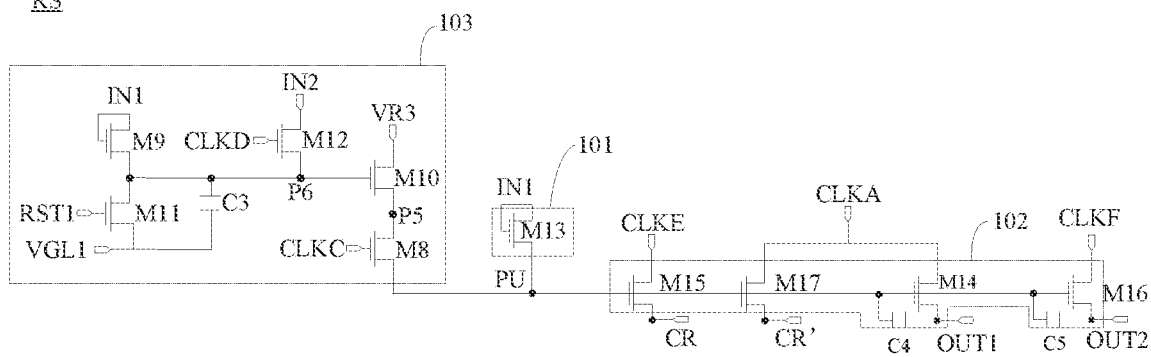
FIG. 15A is a structural diagram of a shift register circuit located at an odd-numbered stage in a gate driver circuit, in accordance with some embodiments.

Based on the above two examples, as shown in FIG. 15A, in the case where the shift register circuit is located at the odd-numbered stage in the gate driver circuit, the output sub-circuit 102 of the shift register circuit is further coupled to an auxiliary cascade signal output terminal CR' relative to the structure shown in FIG. 13. In this case, the shift register circuit further includes a seventeenth transistor M17 in addition to the fifteenth transistor M15, the sixteenth transistor M16 and the fifth storage capacitor C5. A control electrode of the seventeenth transistor M17 is coupled to the pull-up node PU, a first electrode of the seventeenth transistor M17 is coupled to the first clock signal terminal CLKA, and a second electrode of the seventeenth transistor M17 is coupled to the auxiliary cascade signal output terminal CR'. The seventeenth transistor M17 may transmit the first clock signal received at the first clock signal terminal CLKA to the auxiliary cascade signal output terminal CR' in response to the voltage at the pull-up node PU. That is, the first output signal output by the first signal output terminal OUT1 and an auxiliary cascade output signal output by the auxiliary cascade signal output terminal CR' are the same clock signal.

Figure 15B:
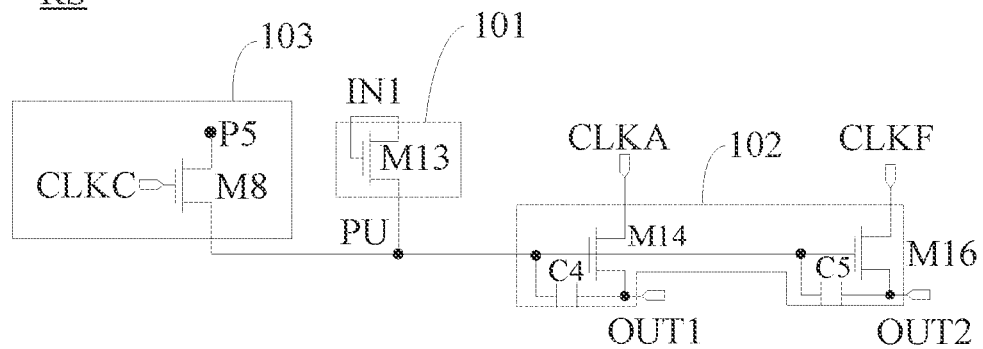
FIG. 15B is a structural diagram of another shift register circuit located at an even-numbered stage in a gate driver circuit, in accordance with some embodiments.

As shown in FIG. 15B, in the case where the shift register circuit is located at the even-numbered stage in the gate driver circuit, the structure of the shift register circuit omits the fifth clock signal terminal CLKE, the cascade signal output terminal CR and the fifteenth transistor M15 coupled to the fifth clock signal terminal CLKE and the cascade signal output terminal CR relative to the structure shown in FIG. 13. It can be seen that a cascade signal output terminal CR of the shift register circuit at the even-numbered stage in the gate driver circuit may be replaced by an auxiliary cascade signal output terminal CR' of a previous shift register circuit at the odd-numbered stage.

It will be understood that although FIGS. 13 to 15B are illustrated based on the embodiments shown in FIGS. 10 and 12A, they may also be illustrated based on the embodiments shown in FIGS. 6 and 8A, as long as a structure of the control sub-circuit 103 is modified accordingly.

Figure 16:
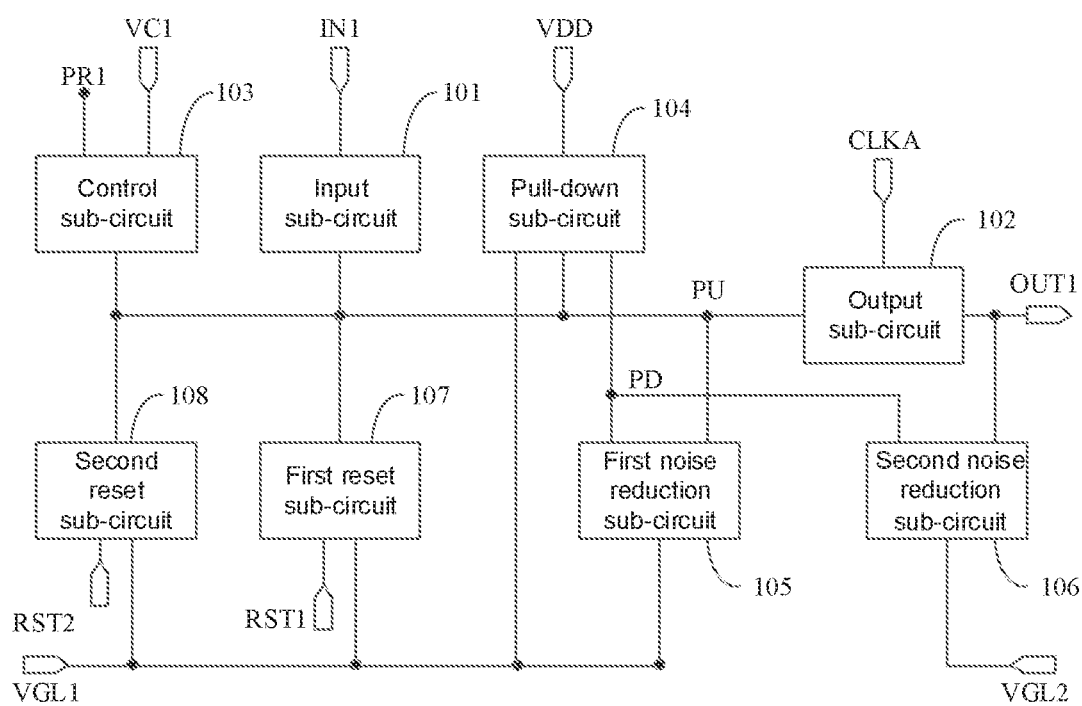
FIG. 16 is a block diagram of yet another shift register circuit, in accordance with some embodiments.

In some embodiments, as shown in FIG. 16, the shift register circuit RS further includes a pull-down sub-circuit 104, a first noise reduction sub-circuit 105 and a second noise reduction sub-circuit 106.

The pull-down sub-circuit 104 is coupled to the second voltage signal terminal VDD, the first voltage signal terminal VGL1, the pull-up node PU and a pull-down node PD, and is configured to transmit the second voltage signal to the pull-down node PD under control of the second voltage signal received at the second voltage signal terminal VDD, and to transmit the first voltage signal received at the first voltage signal terminal VGL1 to the pull-down node PD under the control of the voltage at the pull-up node PU.

The first noise reduction sub-circuit 105 is coupled to the pull-down node PD, the pull-up node PU and the first voltage signal terminal VGL1, and is configured to transmit the first voltage signal to the pull-up node PU under control of a voltage at the pull-down node PD, so as to reduce noise of the pull-up node PU.

The second noise reduction sub-circuit 106 is coupled to the pull-down node PD, the first signal output terminal OUT1 and a third voltage signal terminal VGL2, and is configured to transmit a third voltage signal received at the third voltage signal terminal VGL2 to the first signal output terminal OUT1 under the control of the voltage at the pull-down node PD, so as to reduce noise of the first signal output terminal OUT1.

It will be noted that the third voltage signal terminal VGL2 is configured to transmit a DC low voltage signal (e.g., lower than or equal to the low voltage portion of the clock signal). For example, the third voltage signal terminal VGL2 is grounded. Here, the DC low voltage signal is referred to as the third voltage signal. The following embodiments are the same as the above contents, which will not be described again. In addition, the first voltage signal terminal VGL1 and the third voltage signal terminal VGL2 may be the same signal terminal or different signal terminals, but both function to provide a non-operating voltage.

Figure 17:
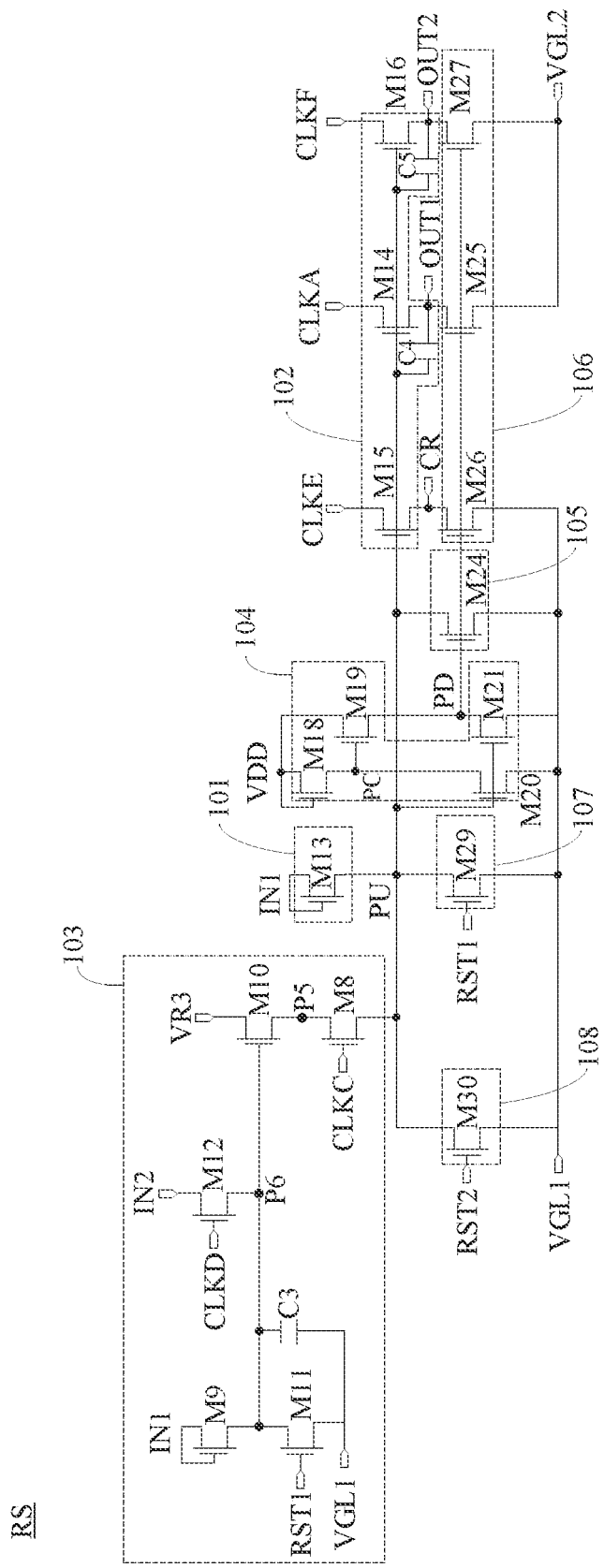
FIG. 17 is a structural diagram of a shift register circuit, in accordance with some embodiments.

In some examples, as shown in FIG. 17, the pull-down sub-circuit 104 includes an eighteenth transistor M18, a nineteenth transistor M19, a twentieth transistor M20 and a twenty-first transistor M21.

A control electrode and a first electrode of the eighteenth transistor M18 are coupled to the second voltage signal terminal VDD, and a second electrode of the eighteenth transistor M18 is coupled to a pull-down control node PC. The eighteenth transistor M18 may transmit the second voltage signal to the pull-down control node PC in response to the second voltage signal received at the second voltage signal terminal VDD.

A control electrode of the nineteenth transistor M19 is coupled to the pull-down control node PC, a first electrode of the nineteenth transistor M19 is coupled to the second voltage signal terminal VDD, and a second electrode of the nineteenth transistor M19 is coupled to the pull-down node PD. The nineteenth transistor M19 may transmit the second voltage signal to the pull-down node PD in response to a voltage at the pull-down control node PC.

A control electrode of the twentieth transistor M20 is coupled to the pull-up node PU, a first electrode of the twentieth transistor M20 is coupled to the first voltage signal terminal VGL1, and a second electrode of the twentieth transistor M20 is coupled to the pull-down control node PC. The twentieth transistor M20 may transmit the first voltage signal received at the first voltage signal terminal VGL1 to the pull-down control node PC in response to the voltage at the pull-up node PU.

A control electrode of the twenty-first transistor M21 is coupled to the pull-up node PU, a first electrode of the twenty-first transistor M21 is coupled to the first voltage signal terminal VGL1, and a second electrode of the twenty-first transistor M21 is coupled to the pull-down node PD. The twenty-first transistor M21 may transmit the first voltage signal received at the first voltage signal terminal VGL1 to the pull-down node PD in response to the voltage at the pull-up node PU.

Figure 18:
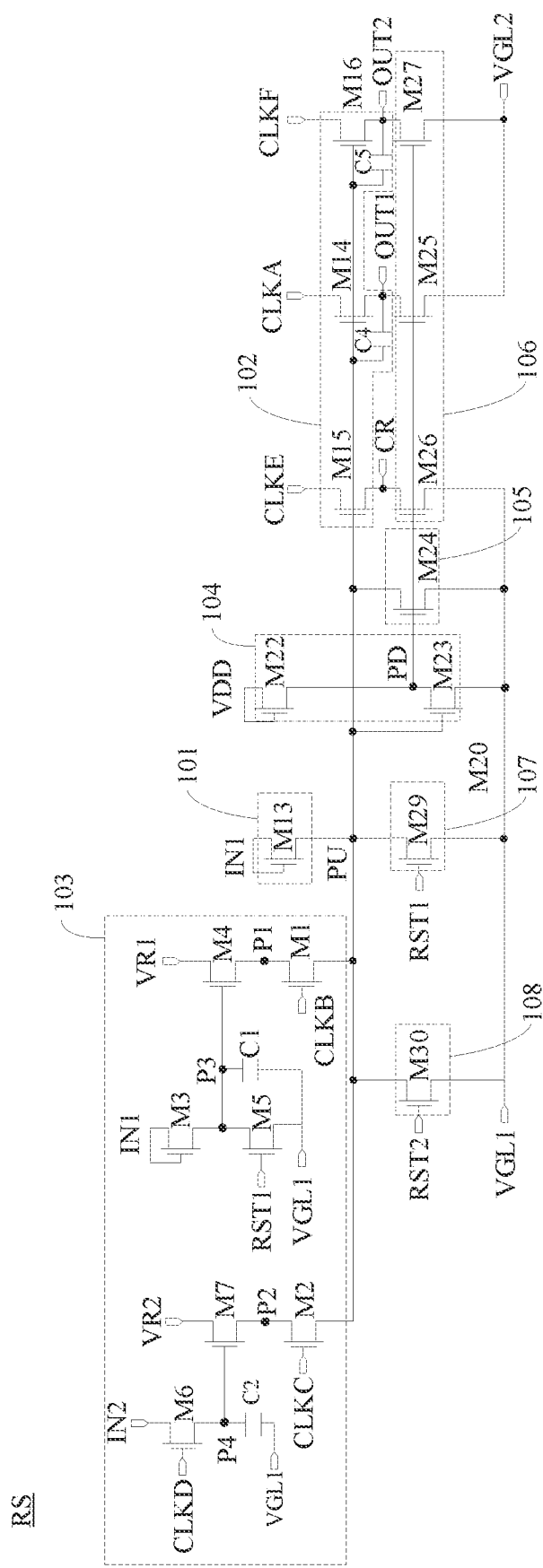
FIG. 18 is a structural diagram of another shift register circuit, in accordance with some embodiments.

In some other examples, as shown in FIG. 18, the pull-down sub-circuit 104 includes a twenty-second transistor M22 and a twenty-third transistor M23.

A control electrode and a first electrode of the twenty-second transistor M22 are coupled to the second voltage signal terminal VDD, and a second electrode of the twenty-second transistor M22 is coupled to the pull-down node PD. The twenty-second transistor M22 may transmit the second voltage signal to the pull-down node PD in response to the second voltage signal received at the second voltage signal terminal VDD.

A control electrode of the twenty-third transistor M23 is coupled to the pull-up node PU, a first electrode of the twenty-third transistor M23 is coupled to the first voltage signal terminal VGL1, and a second electrode of the twenty-third transistor M23 is coupled to the pull-down node PD. The twenty-third transistor M23 may transmit the first voltage signal received at the first voltage signal terminal VGL1 to the pull-down node PD in response to the voltage at the pull-up node PU.

In some examples, as shown in FIGS. 17 and 18, the first noise reduction sub-circuit 105 includes a twenty-fourth transistor M24. A control electrode of the twenty-fourth transistor M24 is coupled to the pull-down node PD, a first electrode of the twenty-fourth transistor M24 is coupled to the first voltage signal terminal VGL1, and a second electrode of the twenty-fourth transistor M24 is coupled to the pull-up node PU. The twenty-fourth transistor M24 may transmit the first voltage signal received at the first voltage signal terminal VGL1 to the pull-up node PU in response to the voltage at the pull-down node PD.

In some examples, as shown in FIGS. 17 and 18, the second noise reduction sub-circuit 106 includes a twenty-fifth transistor M25. A control electrode of the twenty-fifth transistor M25 is coupled to the pull-down node PD, a first electrode of the twenty-fifth transistor M25 is coupled to the third voltage signal terminal VGL2, and a second electrode of the twenty-fifth transistor M25 is coupled to the first signal output terminal OUT1. The twenty-fifth transistor M25 may transmit the third voltage signal received at the third voltage signal terminal VGL2 to the first signal output terminal OUT1 in response to the voltage at the pull-down node PD.

In some examples, as shown in FIGS. 17 and 18, the second noise reduction sub-circuit 106 is further coupled to the cascade signal output terminal CR, the second signal output terminal OUT2 and the first voltage signal terminal VGL1. In this case, the second noise reduction sub-circuit 106 further includes a twenty-sixth transistor M26 and a twenty-seventh transistor M27.

A control electrode of the twenty-sixth transistor M26 is coupled to the pull-down node PD, a first electrode of the twenty-sixth transistor M26 is coupled to the first voltage signal terminal VGL1, and a second electrode of the twenty-sixth transistor M26 is coupled to the cascade signal output terminal CR. The twenty-sixth transistor M26 may transmit the first voltage signal received at the first voltage signal terminal VGL1 to the cascade signal output terminal CR in response to the voltage at the pull-down node PD, so as to reduce noise of the cascade signal output terminal CR.

A control electrode of the twenty-seventh transistor M27 is coupled to the pull-down node PD, a first electrode of the twenty-seventh transistor M27 is coupled to the third voltage signal terminal VGL2, and a second electrode of the twenty-seventh transistor M27 is coupled to the second signal output terminal OUT2. The twenty-seventh transistor M27 may transmit the third voltage signal received at the third voltage signal terminal VGL2 to the second signal output terminal OUT2 in response to the voltage at the pull-down node PD, so as to reduce noise of the second signal output terminal OUT2.

Figure 19:
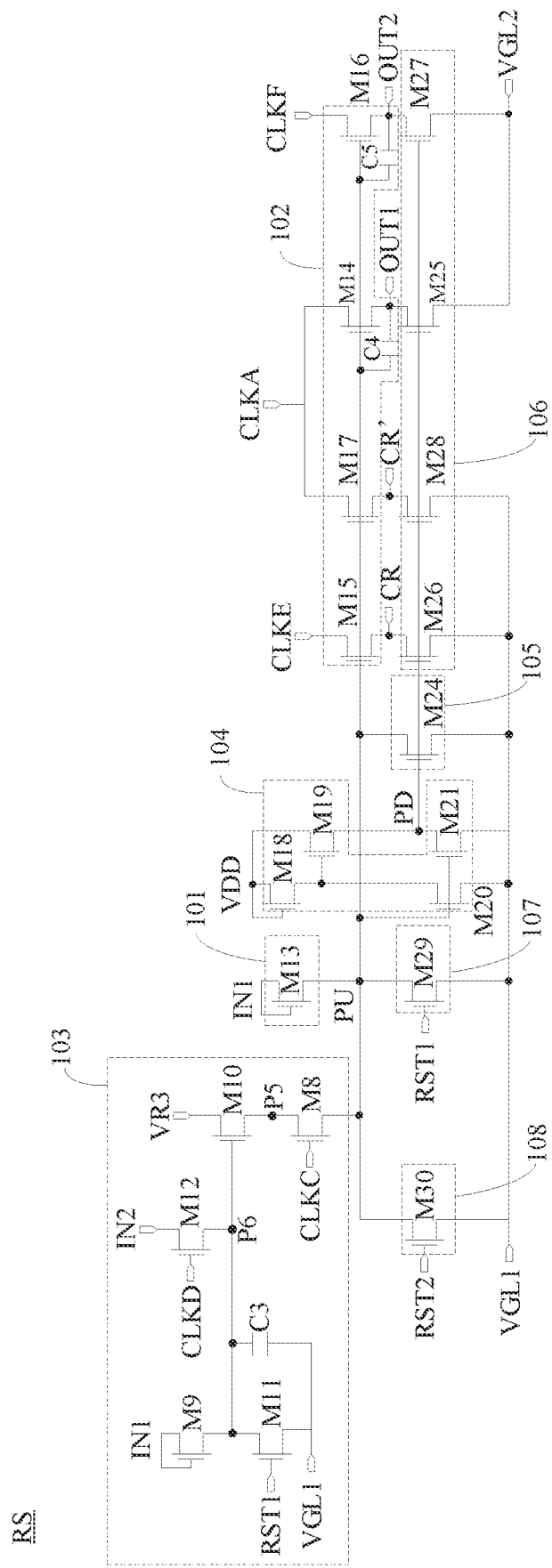
FIG. 19 is a structural diagram of another shift register circuit, in accordance with some embodiments.

In a case where the output sub-circuit 102 of the shift register circuit is further coupled to the auxiliary cascade signal output terminal CR', as shown in FIG. 19, the second noise reduction sub-circuit 106 further includes a twenty-eighth transistor M28. A control electrode of the twenty-eighth transistor M28 is coupled to the pull-down node PD, a first electrode of the twenty-eighth transistor M28 is coupled to the first voltage signal terminal VGL1, and a second electrode of the twenty-eighth transistor M28 is coupled to the auxiliary cascade signal output terminal CR'. The twenty-eighth transistor M28 may transmit the first voltage signal received at the first voltage signal terminal VGL1 to the auxiliary cascade signal output terminal CR' in response to the voltage at the pull-down node PD, so as to reduce noise of the auxiliary cascade signal output terminal CR'.

In some embodiments, as shown in FIG. 16, the shift register circuit RS further includes a first reset sub-circuit 107 and a second reset sub-circuit 108.

The first reset sub-circuit 107 is coupled to the first reset signal terminal RST1, the pull-up node PU and the first voltage signal terminal VGL1, and is configured to transmit the first voltage signal received at the first voltage signal terminal VGL1 to the pull-up node PU under the control of the first reset signal received at the first reset signal terminal RST1.

The second reset sub-circuit 108 is coupled to a second reset signal terminal RST2, the pull-up node PU and the first voltage signal terminal VGL1, and is configured to transmit the first voltage signal received at the first voltage signal terminal VGL1 to the pull-up node PU under control of a second reset signal received at the second reset signal terminal RST2.

The second reset signal terminal RST2 may be a total reset signal terminal TRST coupled to a total reset signal line. The total reset signal line refers to a reset signal line coupled to each stage of shift register circuit, and is configured to reset all shift register circuits.

In this way, the second reset signal resets the pull-up node of the current-stage shift register circuit in advance, which may avoid mis-output of a signal of the current-stage shift register circuit due to a fact that the current-stage shift register circuit and another stage of shift register circuit share a clock signal line in a process of inserting a black image; the second reset signal resets a pull-up node of another stage of shift register circuit, which may also avoid mis-output of a signal of another stage of shift register circuit. In addition, the second reset signal terminates an output process of the first clock signal in advance, which is equivalent to changing a duty cycle of the first clock signal, thereby making a duty cycle of the gate driver circuit adjustable.

In some examples, as shown in FIGS. 17 to 20, the first reset sub-circuit 107 includes a twenty-ninth transistor M29. A control electrode of the twenty-ninth transistor M29 is coupled to the first reset signal terminal RST1, a first electrode of the twenty-ninth transistor M29 is coupled to the first voltage signal terminal VGL1, and a second electrode of the twenty-ninth transistor M29 is coupled to the pull-up node PU. The twenty-ninth transistor M29 may transmit the first voltage signal received at the first voltage signal terminal VGL1 to the pull-up node PU in response to the first reset signal received at the first reset signal terminal RST1.

In some examples, as shown in FIGS. 17 to 19, the second reset sub-circuit 108 includes a thirtieth transistor M30. A control electrode of the thirtieth transistor M30 is coupled to the second reset signal terminal RST2, a first electrode of the thirtieth transistor M30 is coupled to the first voltage signal terminal VGL1, and a second electrode of the thirtieth transistor M30 is coupled to the pull-up node PU. The thirtieth transistor M30 may transmit the first voltage signal received at the first voltage signal terminal VGL1 to the pull-up node PU in response to the second reset signal received at the second reset signal terminal RST2. Since the second reset signal terminal RST2 is coupled to the total reset signal line, the second reset sub-circuit 108 may reset all shift register circuits simultaneously.

Figure 20:
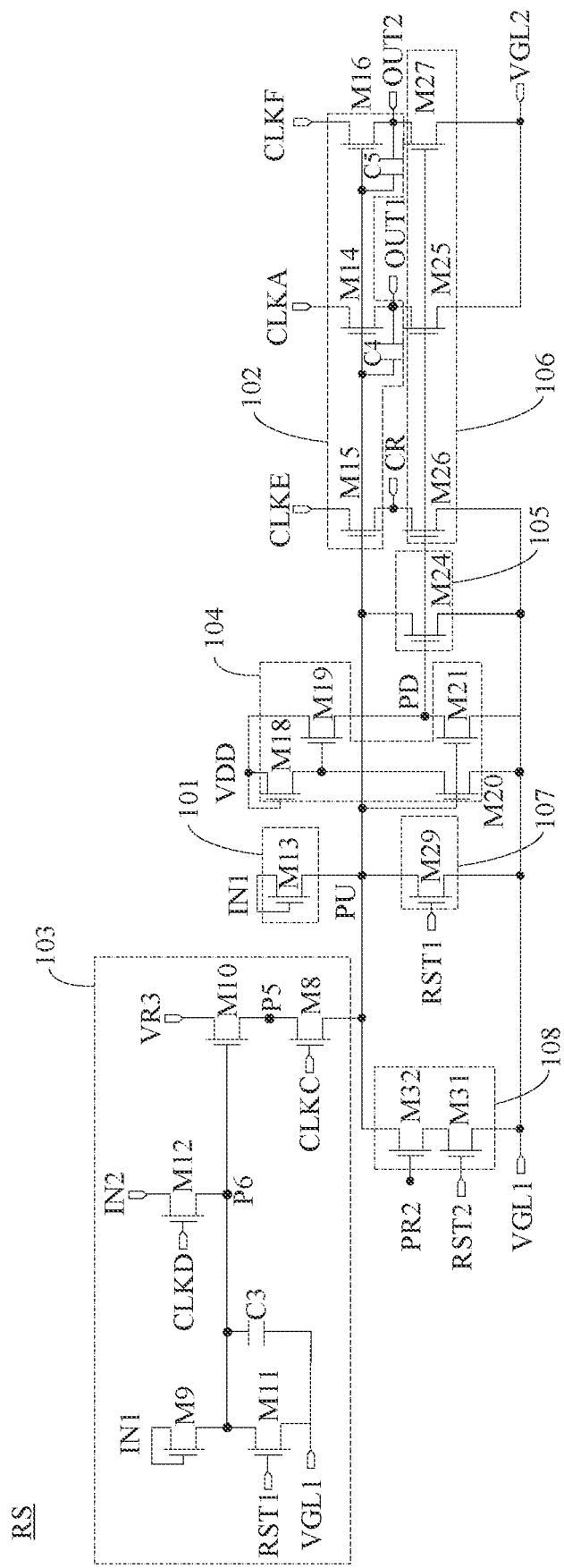
FIG. 20 is a structural diagram of another shift register circuit, in accordance with some embodiments.

In some other examples, as shown in FIG. 20, the second reset sub-circuit 108 includes a thirty-first transistor M31 and a thirty-second transistor M32.

A control electrode of the thirty-first transistor M31 is coupled to the second reset signal terminal RST2, a first electrode of the thirty-first transistor M31 is coupled to the first voltage signal terminal VGL1, and a second electrode of the thirty-first transistor M31 is coupled to a first electrode of the thirty-second transistor M32. The thirty-first transistor M31 may transmit the first voltage signal received at the first voltage signal terminal VGL1 to the first electrode of the thirty-second transistor M32 in response to the second reset signal received at the second reset signal terminal RST2.

A control electrode of the thirty-second transistor M32 is coupled to a second reference node PR2, and a second electrode of the thirty-second transistor M32 is coupled to the pull-up node PU. The thirty-second transistor M32 may transmit the first voltage signal to the pull-up node PU in response to a voltage at the second reference node PR2. The second reference node PR2 may be the third node P3 or the sixth node P6.

Since the second reset sub-circuit 108 is simultaneously controlled by a total reset signal and a voltage at the second reference node PR2, and the third node P3 or the sixth node P6 is a node for storing the operating voltage of the pull-up node PU, the second reset sub-circuit 108 may control the shift register circuit that needs to be reset to reset.

Figure 21:
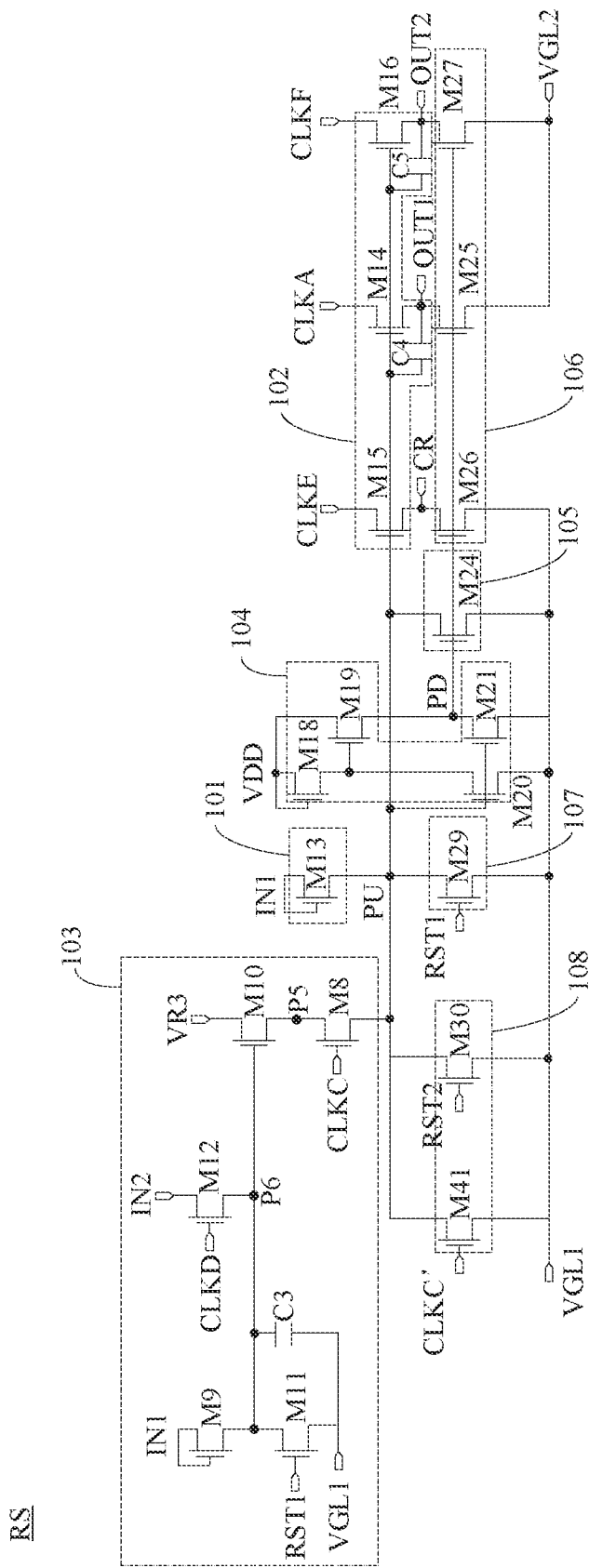
FIG. 21 is a structural diagram of another shift register circuit, in accordance with some embodiments.

In some embodiments, as shown in FIG. 21, the second reset sub-circuit 108 is further coupled to an auxiliary third clock signal terminal CLKC', and is configured to transmit the first voltage signal to the pull-up node PU under control of an auxiliary third clock signal received at the auxiliary third clock signal terminal CLKC'.

In some examples, as shown in FIG. 21, the second reset sub-circuit 108 further includes a forty-first transistor M41. A control electrode of the forty-first transistor M41 is coupled to the auxiliary third clock signal terminal CLKC', a first electrode of the forty-first transistor M41 is coupled to the first voltage signal terminal VGL1, and a second electrode of the forty-first transistor M41 is coupled to the pull-up node PU.

Figure 22:
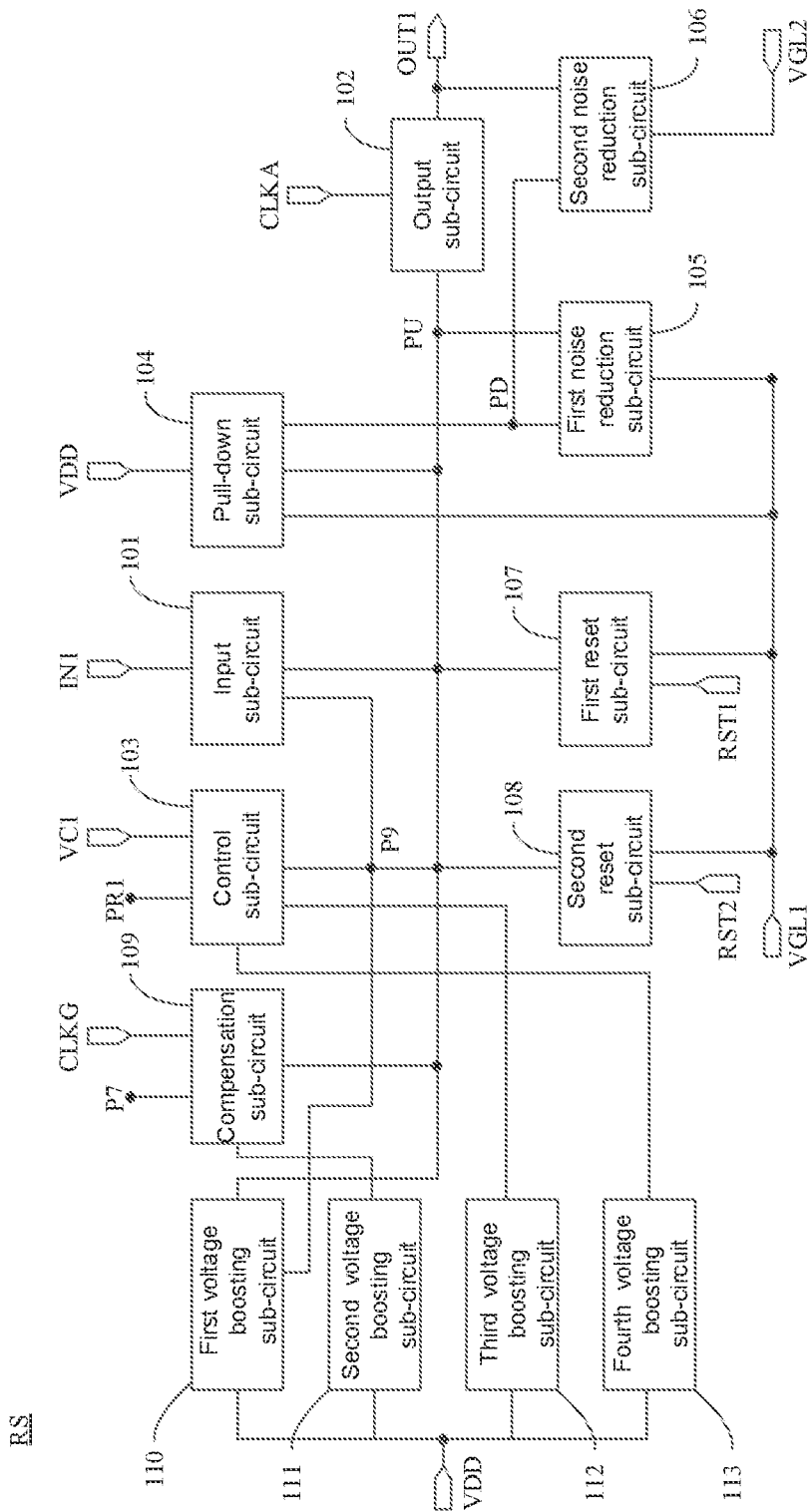
FIG. 22 is a block diagram of another shift register circuit, in accordance with some embodiments.
Figure 23:
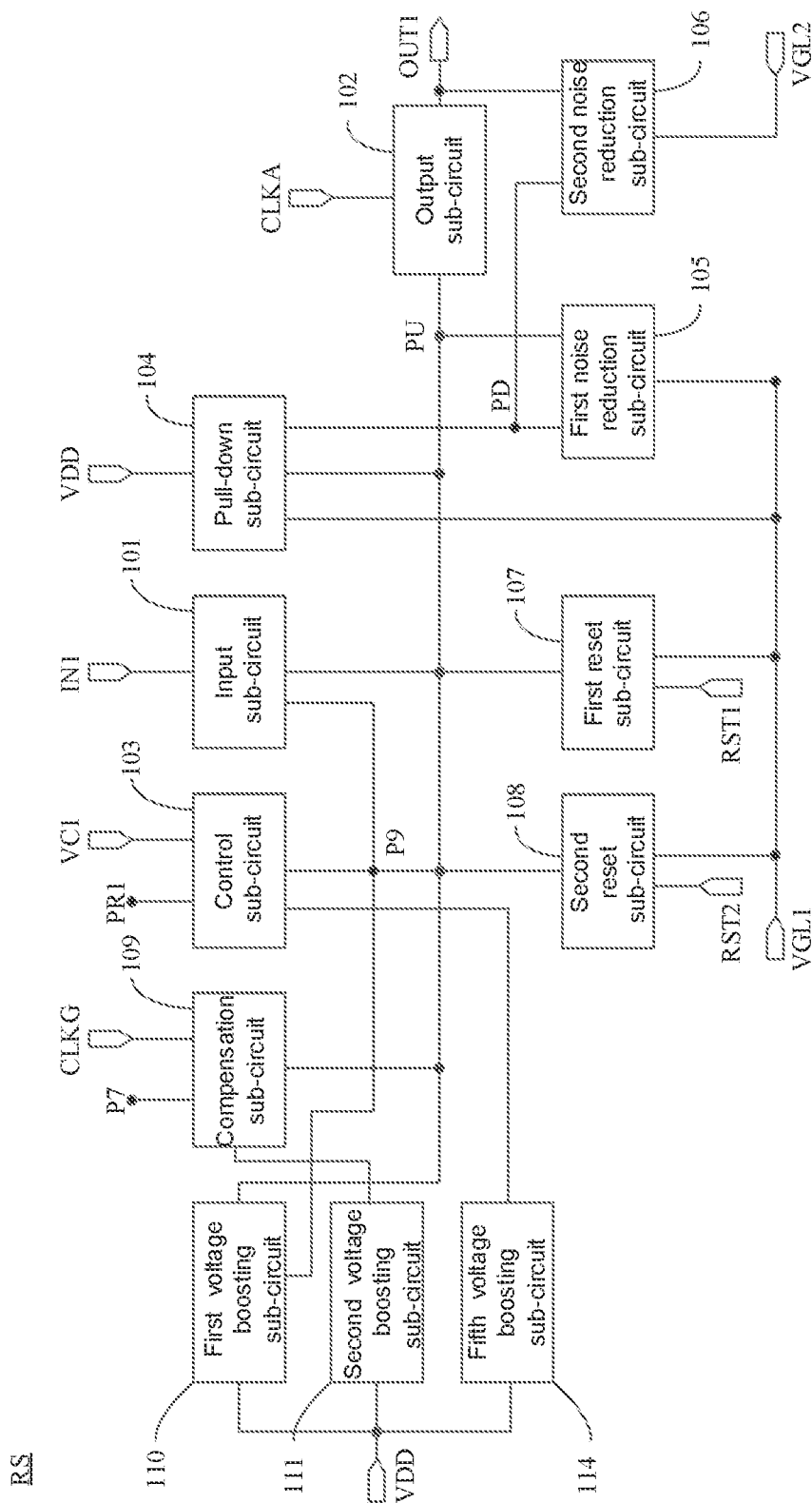
FIG. 23 is a block diagram of another shift register circuit, in accordance with some embodiments.

In some embodiments, as shown in FIGS. 22 and 23, the shift register circuit RS further includes a compensation sub-circuit 109. The compensation sub-circuit 109 is coupled to a seventh clock signal terminal CLKG, a seventh node P7 and the pull-up node PU, and is configured to transmit a voltage at the seventh node P7 to the pull-up node PU under control of a seventh clock signal received at the seventh clock signal terminal CLKG.

Figure 24A:
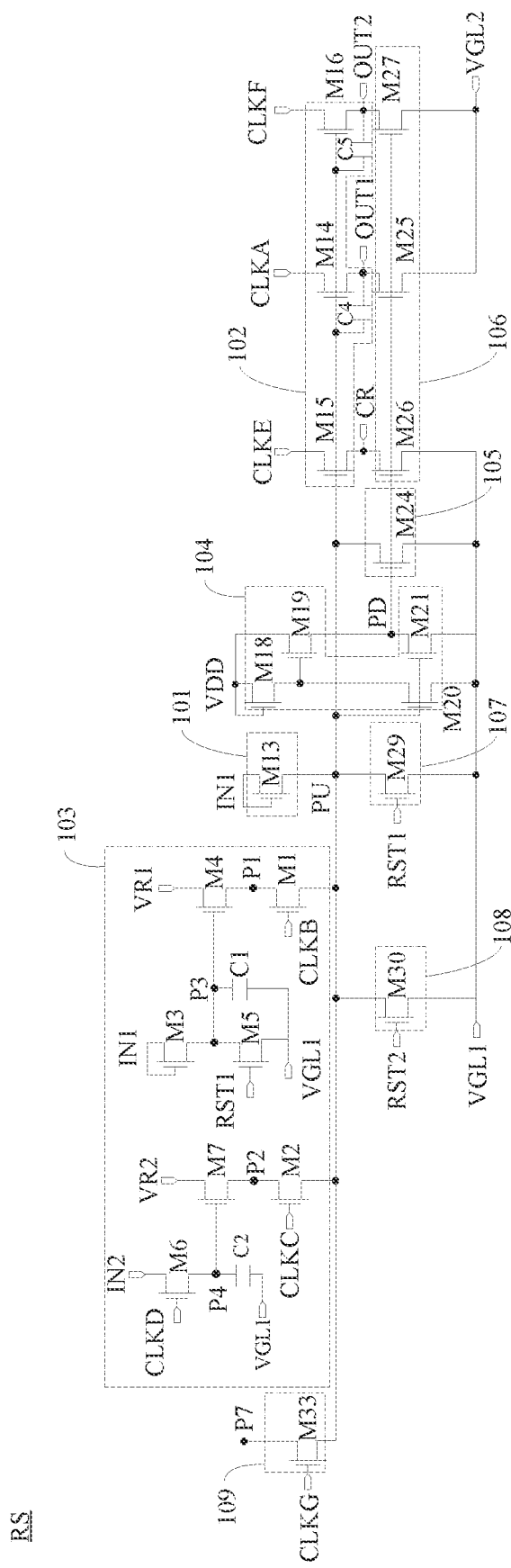
FIG. 24A is a structural diagram of another shift register circuit, in accordance with some embodiments.
Figure 25A:
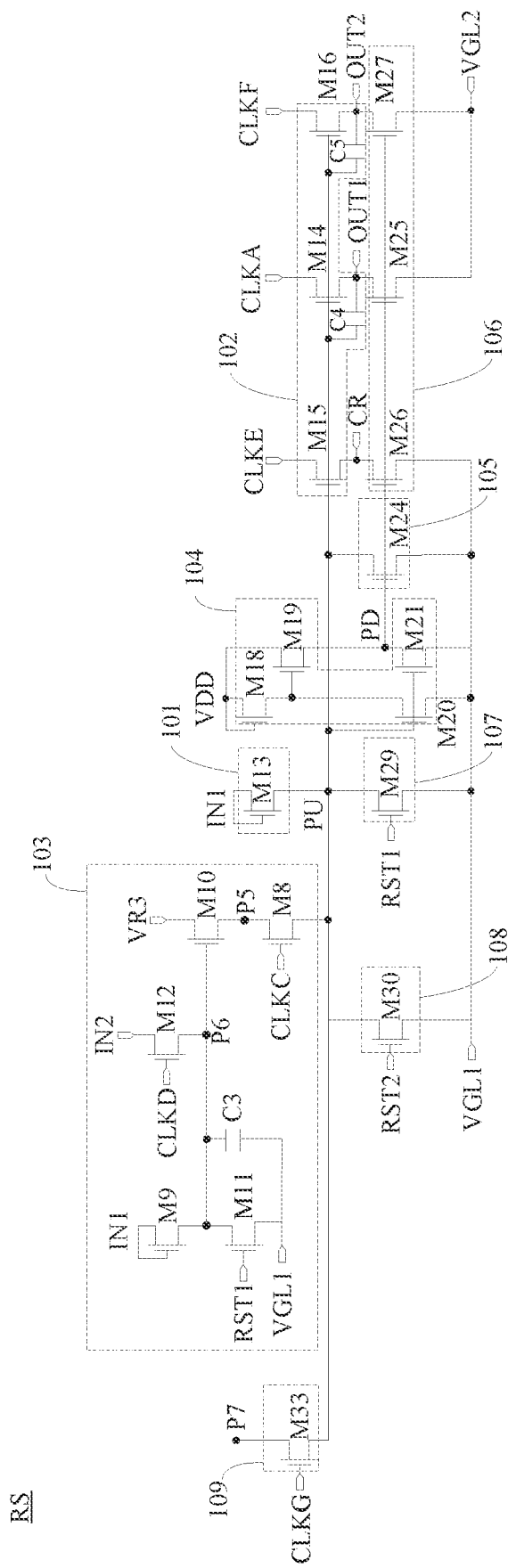
FIG. 25A is a structural diagram of another shift register circuit, in accordance with some embodiments.

In some examples, as shown in FIGS. 24A and 25A, the compensation sub-circuit 109 includes a thirty-third transistor M33. A control electrode of the thirty-third transistor M33 is coupled to the seventh clock signal terminal CLKG, a first electrode of the thirty-third transistor M33 is coupled to the seventh node P7, and a second electrode of the thirty-third transistor M33 is coupled to the pull-up node PU. The thirty-third transistor M33 may transmit the voltage at the seventh node P7 to the pull-up node PU in response to the seventh clock signal received at the seventh clock signal terminal CLKG.

Figure 24B:
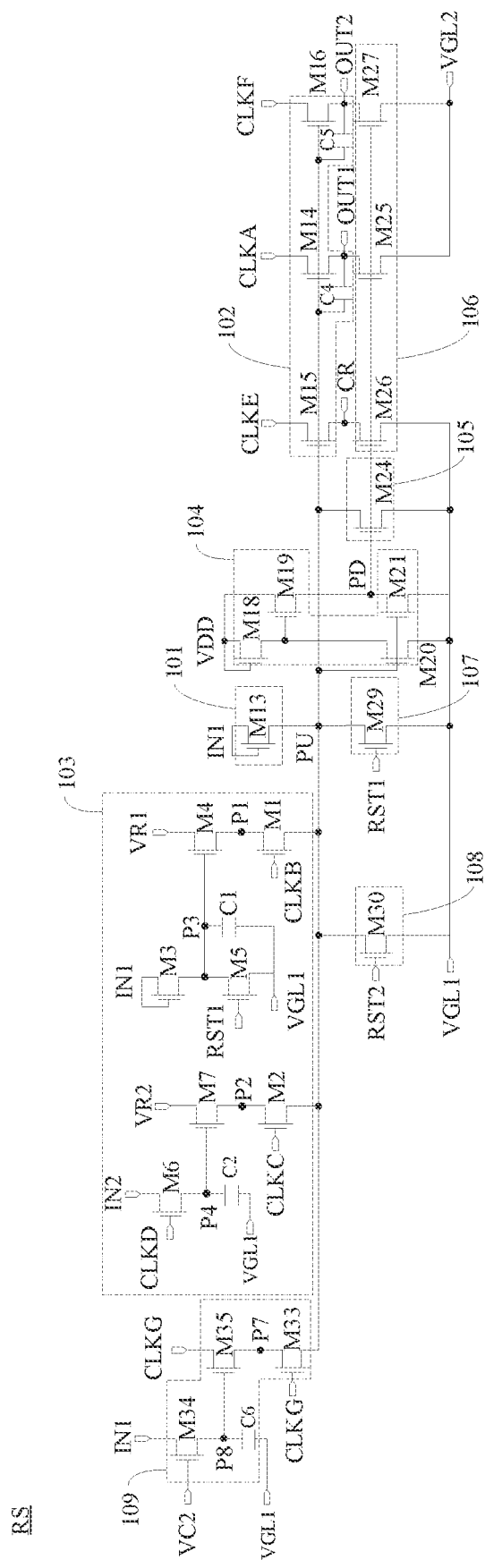
FIG. 24B is a structural diagram of another shift register circuit, in accordance with some embodiments.
Figure 25B:
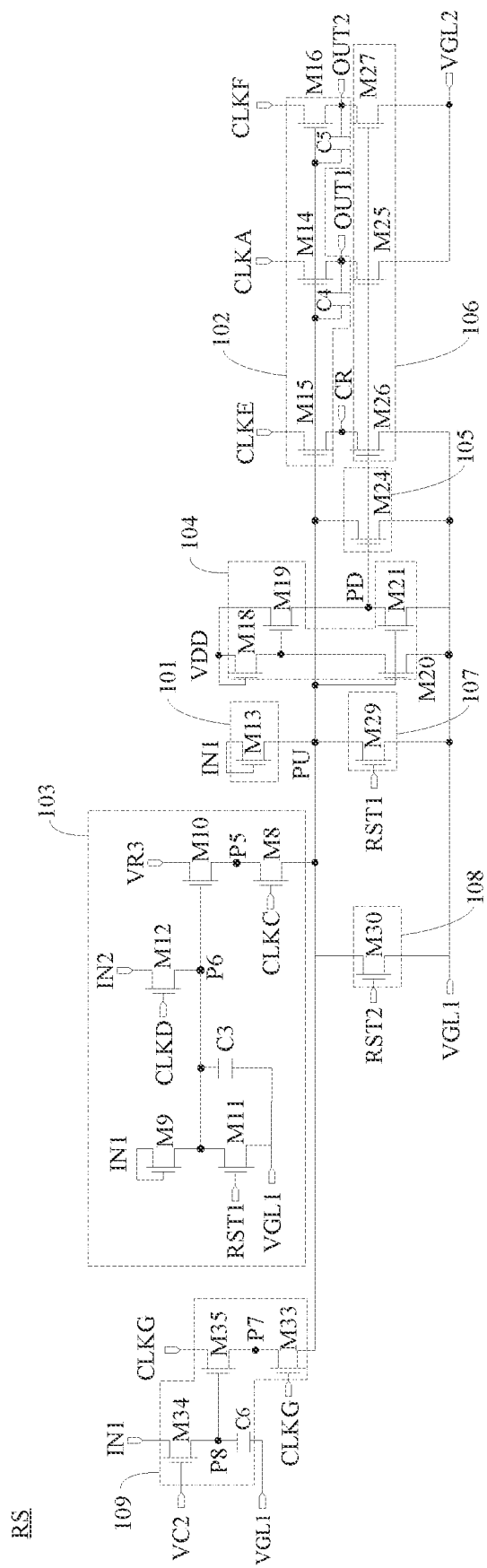
FIG. 25B is a structural diagram of another shift register circuit, in accordance with some embodiments.

In some other examples, as shown in FIGS. 24B and 25B, the compensation sub-circuit 109 is further coupled to a second control signal terminal VC2, the first input signal terminal IN1 and the first voltage signal terminal VGL1. In this case, the compensation sub-circuit 109 further includes a thirty-fourth transistor M34, a thirty-fifth transistor M35 and a sixth storage capacitor C6.

A control electrode of the thirty-fourth transistor M34 is coupled to the second control signal terminal VC2, a first electrode of the thirty-fourth transistor M34 is coupled to the first input signal terminal IN1, and a second electrode of the thirty-fourth transistor M34 is coupled to an eighth node P8. The thirty-fourth transistor M34 may transmit the first input signal received at the first input signal terminal IN1 to the eighth node P8 in response to a second control signal received at the second control signal terminal VC2.

A control electrode of the thirty-fifth transistor M35 is coupled to the eighth node P8, a first electrode of the thirty-fifth transistor M35 is coupled to the seventh clock signal terminal CLKG, and a second electrode of the thirty-fifth transistor M35 is coupled to the seventh node P7. The thirty-fifth transistor M35 may transmit the seventh clock signal received at the seventh clock signal terminal CLKG to the seventh node P7 in response to a voltage at the eighth node P8.

One terminal of the sixth storage capacitor C6 is coupled to the eighth node P8, and the other terminal of the sixth storage capacitor C6 is coupled to the first voltage signal terminal VGL1.

It will be noted that the voltage at the seventh node P7 may be provided by a corresponding signal terminal. For example, the voltage at the seventh node P7 may be provided by the seventh clock signal terminal CLKG when the thirty-fifth transistor M35 is turned on. Alternatively, the voltage at the seventh node P7 may also be obtained by multiplexing a voltage at a seventh node P7 of another shift register circuit. For example, in the gate driver circuit, a voltage at a seventh node P7 of the shift register circuit at the odd-numbered stage is provided by the seventh clock signal terminal CLKG, and a voltage at a seventh node P7 of the shift register circuit at the even-numbered stage multiplexes a voltage at a seventh node P7 of its previous shift register circuit at the odd-numbered stage.

The second control signal transmitted by the second control signal terminal VC2 is configured to trigger a random compensation function of the shift register circuit. That is, the compensation sub-circuit 109 outputs a scanning signal for random compensation to the pixel driving circuit 20 of the display panel 100 in response to the second control signal. The random compensation refers to an external compensation method that is different from a progressive sequential compensation.

In this way, the thirty-fourth transistor M34 may transmit the first input signal to the eighth node P8 in response to the second control signal, and the thirty-fifth transistor M35 and the thirty-third transistor M33 may transmit the seventh clock signal to the pull-up node PU under control of the voltage at the eighth node P8 and the seventh clock signal, so that the pull-up node PU is at the operating voltage. As a result, the output sub-circuit 102 outputs the first scanning signal and the second scanning signal, so as to achieve the function of random compensation for the pixel driving circuit 20 of the display panel 100.

In some embodiments, each sub-circuit of the shift register circuit may further have a leakage prevention function. As shown in FIG. 22, the shift register circuit further includes a first voltage boosting sub-circuit 110, a second voltage boosting sub-circuit 111, a third voltage boosting sub-circuit 112 and a fourth voltage boosting sub-circuit 113. Alternatively, as shown in FIG. 23, the shift register circuit further includes the first voltage boosting sub-circuit 110, the second voltage boosting sub-circuit 111 and a fifth voltage boosting sub-circuit 114.

The first voltage boosting sub-circuit 110 is coupled to the pull-up node PU, the second voltage signal terminal VDD and a ninth node P9, and is configured to transmit the second voltage signal received at the second voltage signal terminal VDD to the ninth node P9 under the control of the voltage at the pull-up node PU, so as to reduce leakage currents of transistors coupled to the ninth node P9.

The second voltage boosting sub-circuit 111 is coupled to the eighth node P8, the second voltage signal terminal VDD and a tenth node P10, and is configured to transmit the second voltage signal received at the second voltage signal terminal VDD to the tenth node P10 under the control of the voltage at the eighth node P8, so as to reduce a leakage current of a transistor coupled to the tenth node P10.

The third voltage boosting sub-circuit 112 is coupled to the third node P3, the second voltage signal terminal VDD and an eleventh node P11, and is configured to transmit the second voltage signal received at the second voltage signal terminal VDD to the eleventh node P11 under control of the voltage at the third node P3, so as to reduce a leakage current of a transistor coupled to the eleventh node P11.

The fourth voltage boosting sub-circuit 113 is coupled to the fourth node P4, the second voltage signal terminal VDD and a twelfth node P12, and is configured to transmit the second voltage signal received at the second voltage signal terminal VDD to the twelfth node P12 under control of the voltage at the fourth node P4, so as to reduce a leakage current of a transistor coupled to the twelfth node P12.

The fifth voltage boosting sub-circuit 114 is coupled to the sixth node P6, the second voltage signal terminal VDD and a thirteenth node P13, and is configured to transmit the second voltage signal received from the second voltage signal terminal VDD to the thirteenth node P13 under control of the voltage at the sixth node P6, so as to reduce leakage currents of transistors coupled to the thirteenth node P13.

Figure 26A:
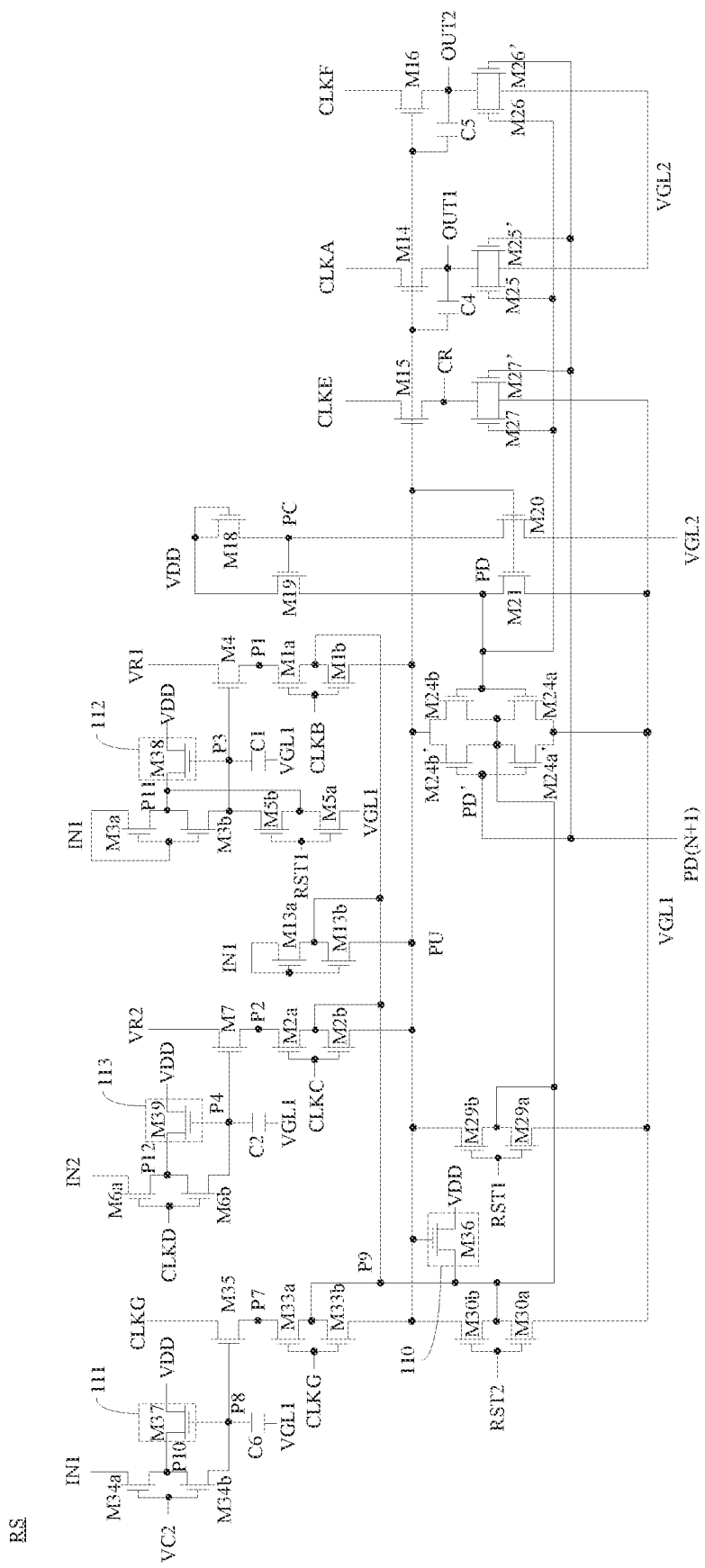
FIG. 26A is a structural diagram of yet another shift register circuit, in accordance with some embodiments.
Figure 27A:
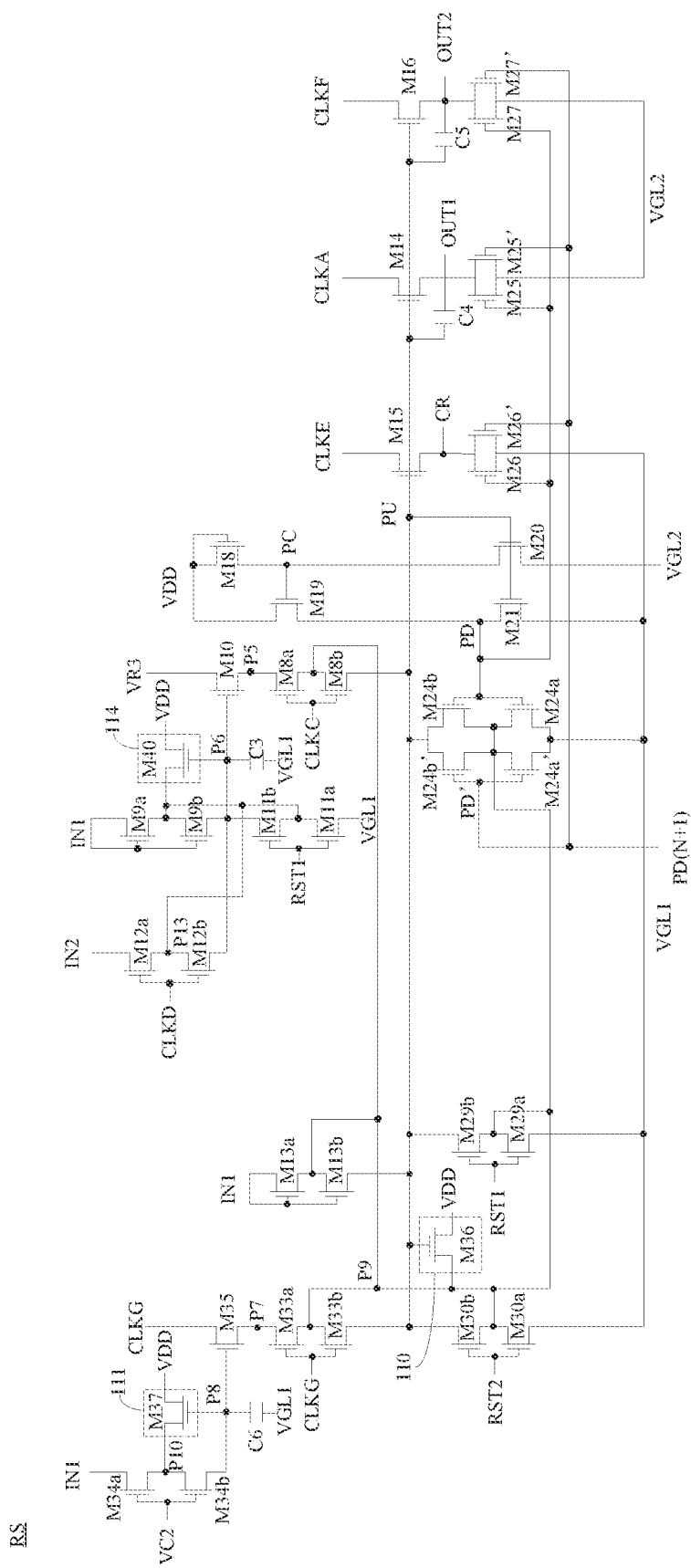
FIG. 27A is a structural diagram of yet another shift register circuit, in accordance with some embodiments.
Figure 28A:
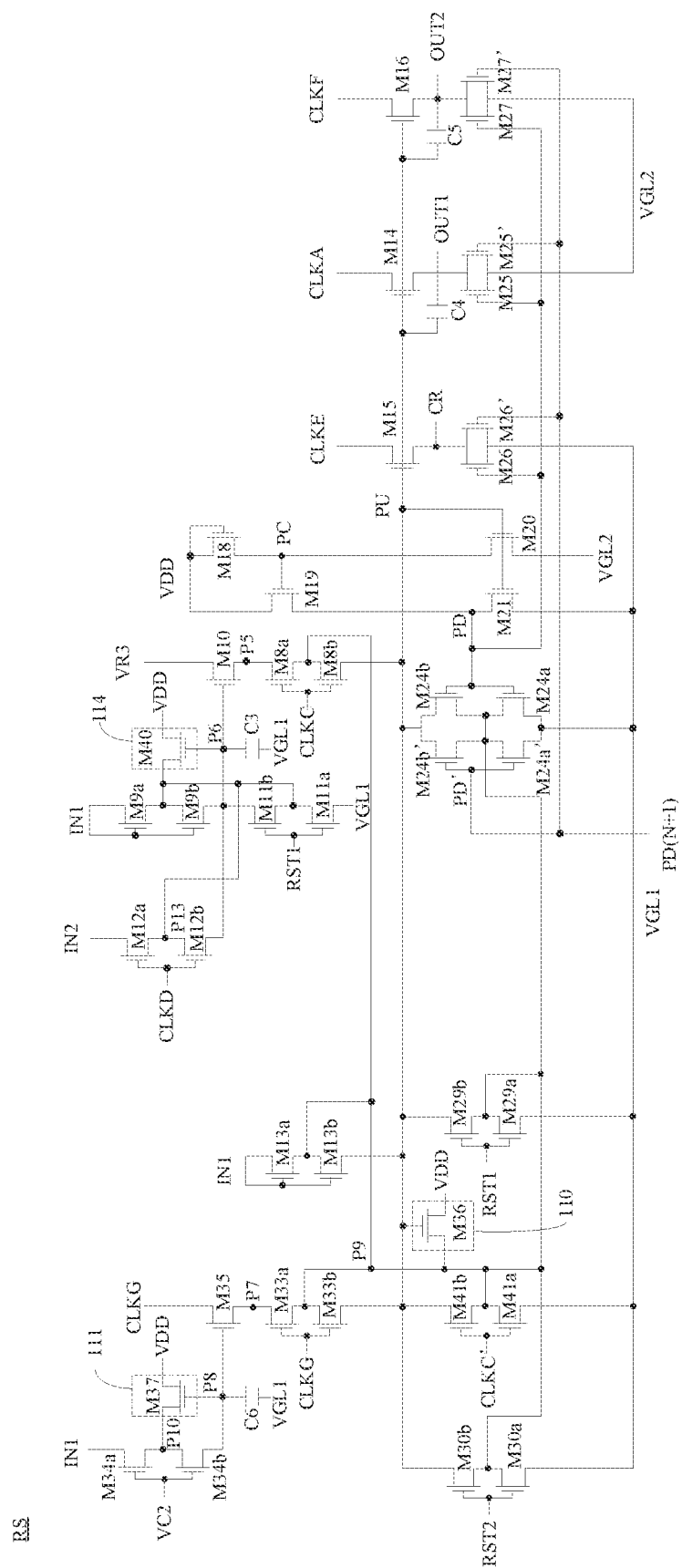
FIG. 28A is a structural diagram of yet another shift register circuit, in accordance with some embodiments.

In some examples, as shown in FIGS. 26A, 27A and 28A, the first voltage boosting sub-circuit 110 includes a thirty-sixth transistor M36. A control electrode of the thirty-sixth transistor M36 is coupled to the pull-up node PU, a first electrode of the thirty-sixth transistor M36 is coupled to the second voltage signal terminal VDD, and a second electrode of the thirty-sixth transistor M36 is coupled to the ninth node P9. The thirty-sixth transistor M36 may transmit the second voltage signal received at the second voltage signal terminal VDD to the ninth node P9 in response to the voltage at the pull-up node PU.

In some examples, as shown in FIGS. 26A, 27A and 28A, the second voltage boosting sub-circuit 111 includes a thirty-seventh transistor M37. A control electrode of the thirty-seventh transistor M37 is coupled to the eighth node P8, a first electrode of the thirty-seventh transistor M37 is coupled to the second voltage signal terminal VDD, and a second electrode of the thirty-seventh transistor M37 is coupled to the tenth node P10. The thirty-seventh transistor M37 may transmit the second voltage signal received at the second voltage signal terminal VDD to the tenth node P10 in response to the voltage at the eighth node P8.

In some examples, as shown in FIG. 26A, the third voltage boosting sub-circuit 112 includes a thirty-eighth transistor M38. A control electrode of the thirty-eighth transistor M38 is coupled to the third node P3, a first electrode of the thirty-eighth transistor M38 is coupled to the second voltage signal terminal VDD, and a second electrode of the thirty-eighth transistor M38 is coupled to the eleventh node P11. The thirty-eighth transistor M38 may transmit the second voltage signal received at the second voltage signal terminal VDD to the eleventh node P11 in response to the voltage at the third node P3.

In some examples, as shown in FIG. 26A, the fourth voltage boosting sub-circuit 113 includes a thirty-ninth transistor M39. A control electrode of the thirty-ninth transistor M39 is coupled to the fourth node P4, a first electrode of the thirty-ninth transistor M39 is coupled to the second voltage signal terminal VDD, and a second electrode of the thirty-ninth transistor M39 is coupled to the twelfth node P12. The thirty-ninth transistor M39 may transmit the second voltage signal received at the second voltage signal terminal VDD to the twelfth node P12 in response to the voltage at the fourth node P4.

In some examples, as shown in FIGS. 27A and 28A, the fifth voltage boosting sub-circuit 114 includes a fortieth transistor M40. A control electrode of the fortieth transistor M40 is coupled to the sixth node P6, a first electrode of the fortieth transistor M40 is coupled to the second voltage signal terminal VDD, and a second electrode of the fortieth transistor M40 is coupled to the thirteenth node P13. The fortieth transistor M40 may transmit the second voltage signal received at the second voltage signal terminal VDD to the thirteenth node P13 in response to the voltage at the sixth node P6.

A leakage prevention mechanism of the shift register circuit will be exemplarily described below with reference to FIGS. 26A to 28B.

In some examples, as shown in FIGS. 26A, 27A and 28A, the thirty-third transistor M33 of the compensation sub-circuit 109 may be replaced with a transistor M33a and a transistor M33b. A control electrode of the transistor M33a and a control electrode of the transistor M33b are both coupled to the seventh clock signal terminal CLKG, a first electrode of the transistor M33a is coupled to the seventh node P7, a second electrode of the transistor M33a is coupled to a first electrode of the transistor M33b and the ninth node P9, and a second electrode of the transistor M33b is coupled to the pull-up node PU. In this case, the thirty-sixth transistor M36 of the first voltage boosting sub-circuit 110 transmits the second voltage signal received at the second voltage signal terminal VDD to the ninth node P9 under the control of the voltage at the pull-up node PU, so that the first electrode and the second electrode of the transistor M33b are both at a high voltage, thereby reducing a leakage current of the transistor M33b.

Figure 26B:
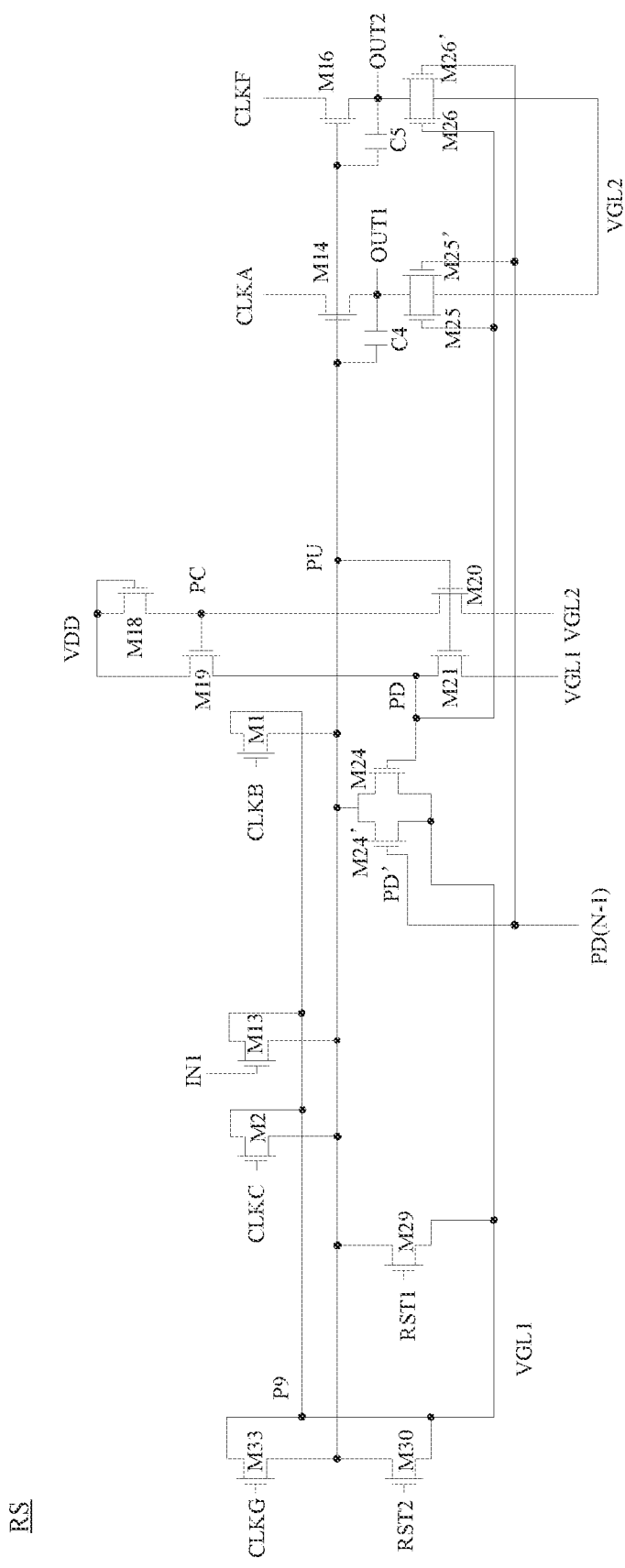
FIG. 26B is a structural diagram of yet another shift register circuit located at an even-numbered stage, in accordance with some embodiments.
Figure 27B:
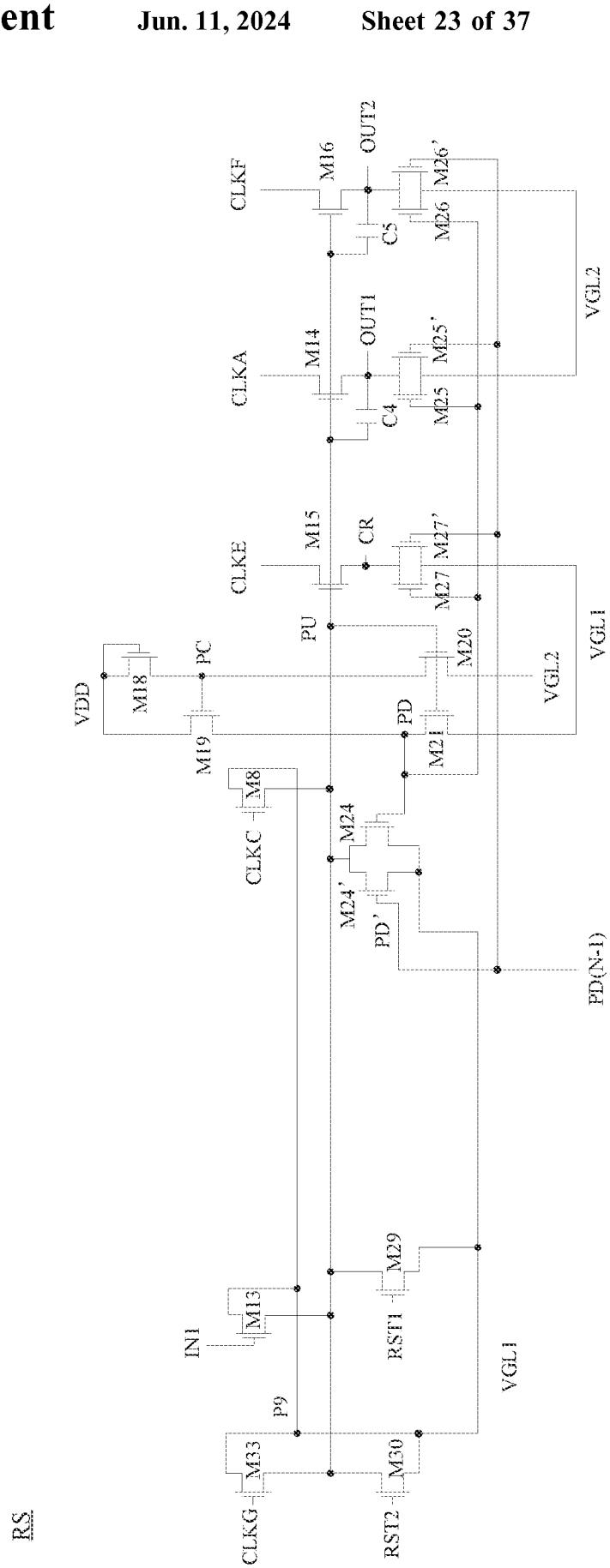
FIG. 27B is a structural diagram of yet another shift register circuit located at an even-numbered stage, in accordance with some embodiments.
Figure 28B:
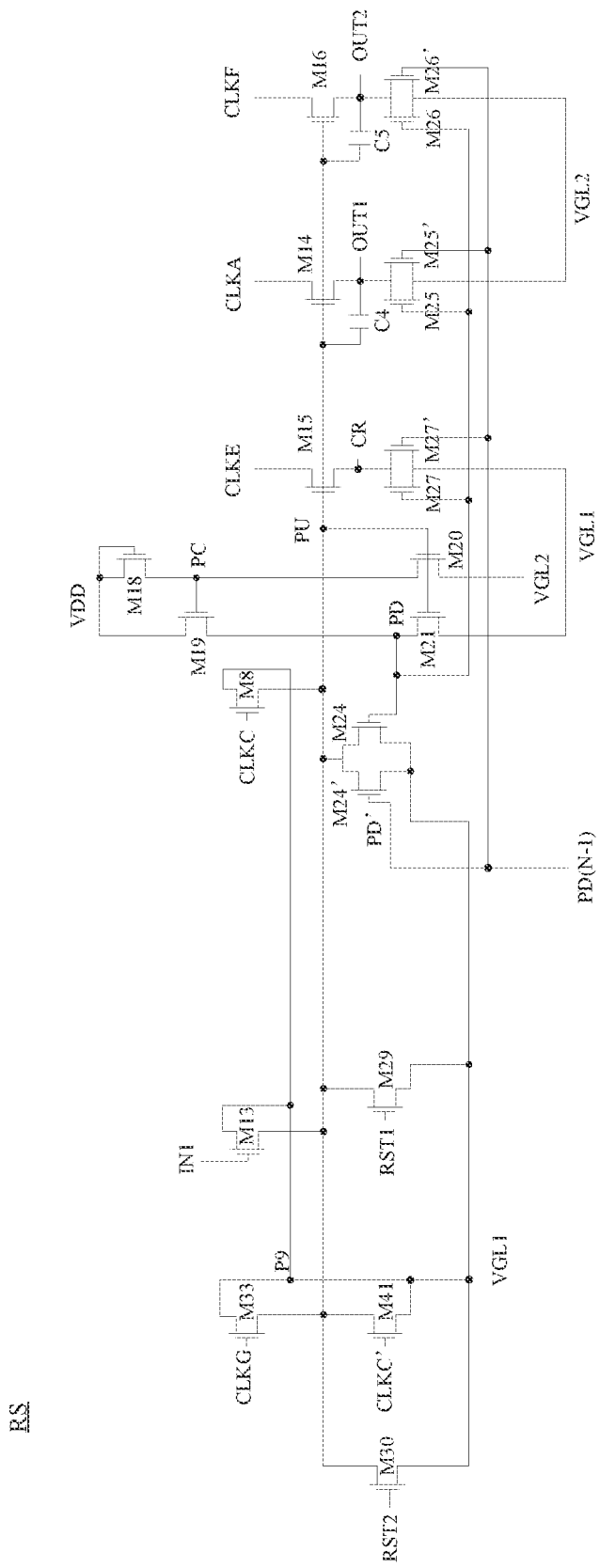
FIG. 28B is a structural diagram of yet another shift register circuit located at an even-numbered stage, in accordance with some embodiments.

In a case where the above structures of the compensation sub-circuit 109 and the first voltage boosting sub-circuit 110 are applied to the shift register circuit at the odd-numbered stage in the gate driver circuit, as shown in FIGS. 26B, 27B and 28B, the compensation sub-circuit 109 of the shift register circuit at the even-numbered stage may still use the thirty-third transistor M33, and the first electrode and the second electrode of the thirty-third transistor M33 are respectively coupled to the ninth node P9 and the pull-up node PU. That is, the shift register circuit at the even-numbered stage and the shift register circuit at the odd-numbered stage share the ninth node P9. Therefore, the first electrode and the second electrode of the thirty-third transistor M33 of the shift register circuit at the even-numbered stage are both at a high voltage, so that a leakage current of the thirty-third transistor M33 may be reduced.

In some examples, as shown in FIGS. 26A, 27A and 28A, the thirteenth transistor M13 of the input sub-circuit 101 may be replaced with a transistor M13a and a transistor M13b. A control electrode of the transistor M13a and a control electrode of the transistor M13b are both coupled to the first input signal terminal IN1, a first electrode of the transistor M13a is coupled to the first input signal terminal IN1, a second electrode of the transistor M13a is coupled to a first electrode of the transistor M13b and the ninth node P9, and a second electrode of the transistor M13b is coupled to the pull-up node PU. In this case, the thirty-sixth transistor M36 of the first voltage boosting sub-circuit 110 transmits the second voltage signal received at the second voltage signal terminal VDD to the ninth node P9 under the control of the voltage at the pull-up node PU, so that the first electrode and the second electrode of the transistor M13b are both at a high voltage, thereby reducing a leakage current of the transistor M13b.

In a case where the above structures of the input sub-circuit 101 and the first voltage boosting sub-circuit 110 are applied to the shift register circuit at the odd-numbered stage in the gate driver circuit, as shown in FIGS. 26B, 27B and 28B, the input sub-circuit 101 of the shift register circuit at the even-numbered stage may still use the thirteenth transistor M13, and the first electrode and the second electrode of the thirteenth transistor M13 are respectively coupled to the ninth node P9 and the pull-up node PU. That is, the shift register circuit at the even-numbered stage and the shift register circuit at the odd-numbered stage share the ninth node P9. Therefore, the first electrode and the second electrode of the thirteenth transistor M13 of the shift register circuit at the even-numbered stage are both at a high voltage, so that a leakage current of the thirteenth transistor M13 may be reduced.

In some examples, as shown in FIG. 26A, the first transistor M1 of the control sub-circuit 103 may be replaced with a transistor M1a and a transistor M1b. A control electrode of the transistor M1a and a control electrode of the transistor M1b are both coupled to the second clock signal terminal CLKB, a first electrode of the transistor M1a is coupled to the first node P1, a second electrode of the transistor M1a is coupled to a first electrode of the transistor M1b and the ninth node P9, and a second electrode of the transistor M1b is coupled to the pull-up node PU. In this case, the thirty-sixth transistor M36 of the first voltage boosting sub-circuit 110 transmits the second voltage signal received at the second voltage signal terminal VDD to the ninth node P9 under the control of the voltage at the pull-up node PU, so that the first electrode and the second electrode of the transistor M1b are both at a high voltage, thereby reducing a leakage current of the transistor M1b.

In a case where the above structures of the control sub-circuit 103 and the first voltage boosting sub-circuit 110 are applied to the shift register circuit at the odd-numbered stage in the gate driver circuit, as shown in FIG. 26B, the control sub-circuit 103 of the shift register circuit at the even-numbered stage may still use the first transistor M1, and the first electrode and the second electrode of the first transistor M1 are respectively coupled to the ninth node P9 and the pull-up node PU. That is, the shift register circuit at the even-numbered stage and the shift register circuit at the odd-numbered stage share the ninth node P9. Therefore, the first electrode and the second electrode of the first transistor M1 of the shift register circuit at the even-numbered stage are both at a high voltage, so that a leakage current of the first transistor M1 may be reduced.

In some examples, as shown in FIG. 26A, the second transistor M2 of the control sub-circuit 103 may be replaced with a transistor M2a and a transistor M2b. A control electrode of the transistor M2a and a control electrode of the transistor M2b are both coupled to the third clock signal terminal CLKC, a first electrode of the transistor M2a is coupled to the second node P2, a second electrode of the transistor M2a is coupled to a first electrode of the transistor M2b and the ninth node P9, and a second electrode of the transistor M2b is coupled to the pull-up node PU. In this case, the thirty-sixth transistor M36 of the first voltage boosting sub-circuit 110 transmits the second voltage signal received at the second voltage signal terminal VDD to the ninth node P9 under the control of the voltage at the pull-up node PU, so that the first electrode and the second electrode of the transistor M2b are both at a high voltage, thereby reducing a leakage current of the transistor M2b.

In a case where the above structures of the control sub-circuit 103 and the first voltage boosting sub-circuit 110 are applied to the shift register circuit at the odd-numbered stage in the gate driver circuit, as shown in FIG. 26B, the control sub-circuit 103 of the shift register circuit at the even-numbered stage may still use the second transistor M2, and the first electrode and the second electrode of the second transistor M2 are respectively coupled to the ninth node P9 and the pull-up node PU. That is, the shift register circuit at the even-numbered stage and the shift register circuit at the odd-numbered stage share the ninth node P9. Therefore, the first electrode and the second electrode of the second transistor M2 of the shift register circuit at the even-numbered stage are both at a high voltage, so that a leakage current of the second transistor M2 may be reduced.

In some examples, as shown in FIGS. 27A and 28A, the eighth transistor M8 of the control sub-circuit 103 may be replaced with a transistor M8a and a transistor M8b. A control electrode of the transistor M8a and a control electrode of the transistor M8b are both coupled to the third clock signal terminal CLKC, a first electrode of the transistor M8a is coupled to the fifth node P5, a second electrode of the transistor M8a is coupled to a first electrode of the transistor M8b and the ninth node P9, and a second electrode of the transistor M8b is coupled to the pull-up node PU. In this case, the thirty-sixth transistor M36 of the first voltage boosting sub-circuit 110 transmits the second voltage signal received at the second voltage signal terminal VDD to the ninth node P9 under the control of the voltage at the pull-up node PU, so that the first electrode and the second electrode of the transistor M8b are both at a high voltage, thereby reducing a leakage current of the transistor M8b.

In a case where the above structures of the control sub-circuit 103 and the first voltage boosting sub-circuit 110 are applied to the shift register circuit at the odd-numbered stage in the gate driver circuit, as shown in FIGS. 27B and 28B, the control sub-circuit 103 of the shift register circuit at the even-numbered stage may still use the eighth transistor M8, and the first electrode and the second electrode of the eighth transistor M8 are respectively coupled to the ninth node P9 and the pull-up node PU. That is, the shift register circuit at the even-numbered stage and the shift register circuit at the odd-numbered stage share the ninth node P9. Therefore, the first electrode and the second electrode of the eighth transistor M8 of the shift register circuit at the even-numbered stage are both at a high voltage, so that a leakage current of the eighth transistor M8 may be reduced.

In some examples, as shown in FIGS. 26A, 27A and 28A, the twenty-ninth transistor M29 of the first reset sub-circuit 107 may be replaced with a transistor M29a and a transistor M29b. A control electrode of the transistor M29a and a control electrode of the transistor M29b are both coupled to the first reset signal terminal RST1, a first electrode of the transistor M29a is coupled to the first voltage signal terminal VGL1, a second electrode of the transistor M29a is coupled to a first electrode of the transistor M29b and the ninth node P9, and a second electrode of the transistor M29b is coupled to the pull-up node PU. In this case, the thirty-sixth transistor M36 of the first voltage boosting sub-circuit 110 transmits the second voltage signal received at the second voltage signal terminal VDD to the ninth node P9 under the control of the voltage at the pull-up node PU, so that the first electrode and the second electrode of the transistor M29b are both at a high voltage, thereby reducing a leakage current of the transistor M29b.

In a case where the above structures of the first reset sub-circuit 107 and the first voltage boosting sub-circuit 110 are applied to the shift register circuit at the odd-numbered stage in the gate driver circuit, as shown in FIGS. 26B, 27B and 28B, the first reset sub-circuit 107 of the shift register circuit at the even-numbered stage may still use the twenty-ninth transistor M29, and the first electrode and the second electrode of the twenty-ninth transistor M29 are respectively coupled to the ninth node P9 and the pull-up node PU. That is, the shift register circuit at the even-numbered stage and the shift register circuit at the odd-numbered stage share the ninth node P9. Therefore, the first electrode and the second electrode of the twenty-ninth transistor M29 of the shift register circuit at the even-numbered stage are both at a high voltage, so that a leakage current of the twenty-ninth transistor M29 may be reduced.

In some examples, as shown in FIGS. 26A, 27A and 28A, the thirtieth transistor M30 of the second reset sub-circuit 108 may be replaced with a transistor M30a and a transistor M30b. A control electrode of the transistor M30a and a control electrode of the transistor M30b are both coupled to the second reset signal terminal RST2, a first electrode of the transistor M30a is coupled to the first voltage signal terminal VGL1, a second electrode of the transistor M30a is coupled to a first electrode of the transistor M30b and the ninth node P9, and a second electrode of the transistor M30b is coupled to the pull-up node PU. In this case, the thirty-sixth transistor M36 of the first voltage boosting sub-circuit 110 transmits the second voltage signal received at the second voltage signal terminal VDD to the ninth node P9 under the control of the voltage at the pull-up node PU, so that the first electrode and the second electrode of the transistor M30b are both at a high voltage, thereby reducing a leakage current of the transistor M30b.

In a case where the above structures of the second reset sub-circuit 108 and the first voltage boosting sub-circuit 110 are applied to the shift register circuit at the odd-numbered stage in the gate driver circuit, as shown in FIGS. 26B, 27B and 28B, the second reset sub-circuit 108 of the shift register circuit at the even-numbered stage may still use the thirtieth transistor M30, and the first electrode and the second electrode of the thirtieth transistor M30 are respectively coupled to the ninth node P9 and the pull-up node PU. That is, the shift register circuit at the even-numbered stage and the shift register circuit at the odd-numbered stage share the ninth node P9. Therefore, the first electrode and the second electrode of the thirtieth transistor M30 of the shift register circuit at the even-numbered stage are both at a high voltage, so that a leakage current of the thirtieth transistor M30 may be reduced.

In some examples, as shown in FIG. 28A, the second reset sub-circuit 108 includes two branches, the thirtieth transistor M30 in one branch may be replaced with the transistor M30a and the transistor M30b, and the forty-first transistor M41 in the other branch may be replaced with a transistor M41a and a transistor M41b. The control electrode of the transistor M30a and the control electrode of the transistor M30b are both coupled to the second reset signal terminal RST2, the first electrode of the transistor M30a is coupled to the first voltage signal terminal VGL1, the second electrode of the transistor M30a is coupled to the first electrode of the transistor M30b and the ninth node P9, and the second electrode of the transistor M30b is coupled to the pull-up node PU. A control electrode of the transistor M41a and a control electrode of the transistor M41b are both coupled to the auxiliary third clock signal terminal CLKC', a first electrode of the transistor M41a is coupled to the first voltage signal terminal VGL1, a second electrode of the transistor M41a is coupled to a first electrode of the transistor M41b and the ninth node P9, and a second electrode of the transistor M41b is coupled to the pull-up node PU. In this case, the thirty-sixth transistor M36 of the first voltage boosting sub-circuit 110 transmits the second voltage signal received at the second voltage signal terminal VDD to the ninth node P9 under the control of the voltage at the pull-up node PU. As a result, both the first electrode and the second electrode of the transistor M30b are at a high voltage, and both the first electrode and the second electrode of the transistor M41b are also at high voltages, and thus leakage currents of the transistor M30b and the transistor M41b may be reduced.

In a case where the above structures of the second reset sub-circuit 108 and the first voltage boosting sub-circuit 110 are applied to the shift register circuit at the odd-numbered stage in the gate driver circuit, as shown in FIG. 28B, the second reset sub-circuit 108 of the shift register circuit at the even-numbered stage may still use the thirtieth transistor M30 and the forty-first transistor M41; the first electrode and the second electrode of the thirtieth transistor M30 are respectively coupled to the ninth node P9 and the pull-up node PU, and the first electrode and the second electrode of the forty-first transistor M41 are respectively coupled to the ninth node P9 and the pull-up node PU. That is, the shift register circuit at the even-numbered stage and the shift register circuit at the odd-numbered stage share the ninth node P9. Therefore, both the first electrode and the second electrode of the thirtieth transistor M30 of the shift register circuit at the even-numbered stage are at a high voltage, and both the first electrode and the second electrode of the forty-first transistor M41 of the shift register circuit at the even-numbered stage are also at high voltages, so that leakage currents of the thirtieth transistor M30 and the forty-first transistor M41 may be reduced.

In some examples, as shown in FIGS. 26A, 27A and 28A, the twenty-fourth transistor M24 of the first noise reduction sub-circuit 105 may be replaced with a transistor M24a and a transistor M24b. A control electrode of the transistor M24a and a control electrode of the transistor M24b are both coupled to the pull-down node PD, a first electrode of the transistor M24a is coupled to the first voltage signal terminal VGL1, a second electrode of the transistor M24a is coupled to a first electrode of the transistor M24b and the ninth node P9, and a second electrode of the transistor M24b is coupled to the pull-up node PU. In this case, the thirty-sixth transistor M36 of the first voltage boosting sub-circuit 110 transmits the second voltage signal received at the second voltage signal terminal VDD to the ninth node P9 under the control of the voltage at the pull-up node PU, so that the first electrode and the second electrode of the transistor M24b are both at a high voltage, thereby reducing a leakage current of the transistor M24b.

In a case where the above structures of the first noise reduction sub-circuit 105 and the first voltage boosting sub-circuit 110 are applied to the shift register circuit at the odd-numbered stage in the gate driver circuit, as shown in FIGS. 26B, 27B and 28B, the first noise reduction sub-circuit 105 of the shift register circuit at the even-numbered stage may still use the twenty-fourth transistor M24, and the first electrode and the second electrode of the twenty-fourth transistor M24 are respectively coupled to the ninth node P9 and the pull-up node PU. That is, the shift register circuit at the even-numbered stage and the shift register circuit at the odd-numbered stage share the ninth node P9. Therefore, the first electrode and the second electrode of the twenty-fourth transistor M24 of the shift register circuit at the even-numbered stage are both at a high voltage, so that a leakage current of the twenty-fourth transistor M24 may be reduced.

In some examples, as shown in FIGS. 26A, 27A and 28A, the thirty-fourth transistor M34 of the compensation sub-circuit 109 may be replaced with a transistor M34a and a transistor M34b. A control electrode of the transistor M34a and a control electrode of the transistor M34b are both coupled to the second control signal terminal VC2, a first electrode of the transistor M34a is coupled to the first input signal terminal IN1, a second electrode of the transistor M34a is coupled to a first electrode of the transistor M34b and the tenth node P10, and a second electrode of the transistor M34b is coupled to the eighth node P8. In this case, the thirty-seventh transistor M37 of the second voltage boosting sub-circuit 111 transmits the second voltage signal received at the second voltage signal terminal VDD to the tenth node P10 under the control of the voltage at the eighth node P8, so that the first electrode and the second electrode of the transistor M34b are both at a high voltage, thereby reducing a leakage current of the transistor M34b.

In some examples, as shown in FIG. 26A, the third transistor M3 of the control sub-circuit 103 may be replaced with a transistor M3a and a transistor M3b. A control electrode of the transistor M3a and a control electrode of the transistor M3b are both coupled to the first input signal terminal IN1, a first electrode of the transistor M3a is coupled to the first input signal terminal IN1, a second electrode of the transistor M3a is coupled to a first electrode of the transistor M3b and the eleventh node P11, and a second electrode of the transistor M3b is coupled to the third node P3. In this case, the thirty-eighth transistor M38 of the third voltage boosting sub-circuit 112 transmits the second voltage signal received at the second voltage signal terminal VDD to the eleventh node P11 under the control of the voltage at the third node P3, so that the first electrode and the second electrode of the transistor M3b are both at a high voltage, thereby reducing a leakage current of the transistor M3b.

In some examples, as shown in FIG. 26A, the fifth transistor M5 of the control sub-circuit 103 may be replaced with a transistor M5a and a transistor M5b. A control electrode of the transistor M5a and a control electrode of the transistor M5b are both coupled to the first reset signal terminal RST1, a first electrode of the transistor M5a is coupled to the first voltage signal terminal VGL1, a second electrode of the transistor M5a is coupled to a first electrode of the transistor M5b and the eleventh node P11, and a second electrode of the transistor M5b is coupled to the third node P3. In this case, the thirty-eighth transistor M38 of the third voltage boosting sub-circuit 112 transmits the second voltage signal received at the second voltage signal terminal VDD to the eleventh node P11 under the control of the voltage at the third node P3, so that the first electrode and the second electrode of the transistor M5b are both at a high voltage, thereby reducing a leakage current of the transistor M5b.

In some examples, as shown in FIG. 26A, the sixth transistor M6 of the control sub-circuit 103 may be replaced with a transistor M6a and a transistor M6b. A control electrode of the transistor M6a and a control electrode of the transistor M6b are both coupled to the fourth clock signal terminal CLKD, a first electrode of the transistor M6a is coupled to the second input signal terminal IN2, a second electrode of the transistor M6a is coupled to a first electrode of the transistor M6b and the twelfth node P12, and a second electrode of the transistor M6b is coupled to the fourth node P4. In this case, the thirty-ninth transistor M39 of the fourth voltage boosting sub-circuit 113 transmits the second voltage signal received at the second voltage signal terminal VDD to the twelfth node P12 under the control of the voltage at the fourth node P4, so that the first electrode and the second electrode of the transistor M6b are both at a high voltage, thereby reducing a leakage current of the transistor M6b.

In some examples, as shown in FIGS. 27A and 28A, the ninth transistor M9 of the control sub-circuit 103 may be replaced with a transistor M9a and a transistor M9b. A control electrode of the transistor M9a and a control electrode of the transistor M9b are both coupled to the first input signal terminal IN1, a first electrode of the transistor M9a is coupled to the first input signal terminal IN1, a second electrode of the transistor M9a is coupled to a first electrode of the transistor M9b and the thirteenth node P13, and a second electrode of the transistor M9b is coupled to the sixth node P6. In this case, the fortieth transistor M40 of the fifth voltage boosting sub-circuit 114 transmits the second voltage signal received at the second voltage signal terminal VDD to the thirteenth node P13 under the control of the voltage at the sixth node P6, so that the first electrode and the second electrode of the transistor M9b are both at a high voltage, thereby reducing a leakage current of the transistor M9b.

In some examples, as shown in FIGS. 27A and 28A, the eleventh transistor M11 of the control sub-circuit 103 may be replaced with a transistor M11a and a transistor M11b. A control electrode of the transistor M11a and a control electrode of the transistor M11b are both coupled to the first reset signal terminal RST1, a first electrode of the transistor M11a is coupled to the first voltage signal terminal VGL1, a second electrode of the transistor M11a is coupled to a first electrode of the transistor M11b and the thirteenth node P13, and a second electrode of the transistor M11b is coupled to the sixth node P6. In this case, the fortieth transistor M40 of the fifth voltage boosting sub-circuit 114 transmits the second voltage signal received at the second voltage signal terminal VDD to the thirteenth node P13 under the control of the voltage at the sixth node P6, so that the first electrode and the second electrode of the transistor M11b are both at a high voltage, thereby reducing a leakage current of the transistor M11b.

In some examples, as shown in FIGS. 27A and 28A, the twelfth transistor M12 of the control sub-circuit 103 may be replaced with a transistor M12a and a transistor M12b. A control electrode of the transistor M12a and a control electrode of the transistor M12b are both coupled to the fourth clock signal terminal CLKD, a first electrode of the transistor M12a is coupled to the second input signal terminal IN2, a second electrode of the transistor M12a is coupled to a first electrode of the transistor M12b and the thirteenth node P13, and a second electrode of the transistor M12b is coupled to the sixth node P6. In this case, the fortieth transistor M40 of the fifth voltage boosting sub-circuit 114 transmits the second voltage signal received at the second voltage signal terminal VDD to the thirteenth node P13 under the control of the voltage at the sixth node P6, so that the first electrode and the second electrode of the transistor M12b are both at a high voltage, thereby reducing a leakage current of the transistor M12b.

It will be noted that all the transistors in the shift register circuit provided by the embodiments of the present disclosure may adopt the above manner to achieve the leakage prevention function, which will not be listed here.

In a case where the shift register circuit is located at the odd-numbered stage in the gate driver circuit, as shown in FIGS. 26A, 27A and 28A, the first noise reduction sub-circuit 105 may further include a transistor M24a' connected in parallel to the transistor M24a, and a transistor M24b' connected in parallel to the transistor 24b. That is, a function of a branch where the transistor M24a and the transistor M24b are located is the same as a function of a branch where the transistor M24a' and the transistor M24b' are located. Therefore, the two branches may operate independently, and when one branch fails, the other branch may be ensured to operate normally.

It will be noted that, unlike the transistor M24a and the transistor M24b, control electrodes of the transistor M24a' and the transistor M24b' are coupled to an auxiliary pull-down node PD', and the auxiliary pull-down node PD' may be coupled to a pull-down node PD(N+1) of a next shift register circuit at the even-numbered stage of the shift register circuit.

In a case where the shift register circuit is located at the even-numbered stage in the gate driver circuit, as shown in FIGS. 26B, 27B and 28B, the first noise reduction sub-circuit 105 may further include a transistor M24' connected in parallel to the twenty-fourth transistor M24. That is, a function of a branch where the twenty-fourth transistor M24 is located is the same as a function of a branch where the transistor M24' is located. Therefore, the two branches may operate independently, and when one branch fails, the other branch may be ensured to operate normally.

It will be noted that, unlike the twenty-fourth transistor M24, a control electrode of the transistor M24' is coupled to an auxiliary pull-down node PD', and the auxiliary pull-down node PD' may be coupled to a pull-down node PD(N−1) of a previous shift register circuit at the odd-numbered stage of the shift register circuit.

In some embodiments, as shown in FIGS. 26A to 28B, the second noise reduction sub-circuit 106 may further include a transistor M25' connected in parallel to the twenty-fifth transistor M25, a transistor M26' connected in parallel to the twenty-sixth transistor M26, and a transistor M27' connected in parallel to the twenty-seventh transistor M27. In this way, the twenty-fifth transistor M25 and the transistor M25' may work independently, the twenty-sixth transistor M26 and the transistor M26' may operate independently, and the twenty-seventh transistor M27 and the transistor M27' may operate independently. Therefore, when one transistor fails, the other transistor may be ensured to operate normally.

The transistors used in the shift register circuit RS provided by the embodiments of the present disclosure may be thin film transistors (TFTs), field effect transistors (FETs) or other switching devices with the same characteristics. The embodiments of the present disclosure are all described by considering thin film transistors as examples.

In addition, all transistors in the embodiments of the present disclosure are described by considering N-type transistors as examples. However, it will be understood that the embodiments of the present disclosure include but are not limited thereto. For example, one or more transistors provided by the embodiments of the present disclosure may also adopt P-type transistors, as long as electrodes of a selected type of transistor are connected with reference to electrodes of a corresponding transistor in the embodiments of the present disclosure, and a corresponding voltage terminal is made to provide a corresponding high potential voltage or low potential voltage.

It will be noted that in the embodiments of the present disclosure, the control electrode of the transistor is a gate of the transistor, the first electrode thereof is one of a source and a drain of the transistor, and the second electrode thereof is the other of the source and the drain of the transistor. Since the source and the drain of the transistor are symmetrical in structure, the first electrode and the second electrode of the transistor in the embodiments of the present disclosure may be indistinguishable. In some examples, if the transistor is a P-type transistor, a first electrode of the transistor is a source and a second electrode of the transistor is a drain. In some other examples, if the transistor is an N-type transistor, a first electrode of the transistor is a drain and a second electrode of the transistor is a source.

In the circuit provided by the embodiments of the present disclosure, the pull-up node PU, the pull-down node PD, and various other nodes do not represent actual components, but represent junctions of relevant electrical connections in circuit connection relationship. That is, these nodes are nodes equivalent to the junctions of relevant electrical connections in a circuit diagram.

In some embodiments of the present disclosure, the storage capacitor may be a capacitor manufactured individually through a process. For example, a capacitor may be implemented by manufacturing specialized capacitor electrodes, and each capacitive electrode of the capacitor may be implemented by a metal layer, a semiconductor layer (e.g., doped polysilicon), or the like. In some other embodiments of the present disclosure, the storage capacitor may also be a parasitic capacitance between transistors, or a parasitic capacitance implemented between the transistor itself and other devices and lines, or a parasitic capacitance implemented between lines of the circuits themselves.

In some embodiments of the present disclosure, the control sub-circuit 103 further includes one or more transistors connected in parallel to the third transistor M3. That is, a control electrode of each of the one or more transistors and the control electrode of the third transistor M3 are coupled to the same first input signal terminal IN1, a first electrode of each of the one or more transistors and the first electrode of the third transistor M3 are coupled to the same first input signal terminal IN1, and a second electrode of each of the one or more transistors and the second electrode of the third transistor M3 are coupled to the same third node P3. In this way, each of the one or more transistors implements the same function as the third transistor M3, and a specific principle will not be repeated. In addition, other transistors may each also be connected in parallel to one or more transistors in the same manner as the third transistor M3, which is not limited in the embodiment of the present disclosure.

In the shift register circuit RS provided by the embodiments of the present disclosure, a specific implementation manner of each sub-circuit is not limited to the above manner, as long as a corresponding function may be ensured to be implemented. The above examples do not limit the protection scope of the present disclosure. In practical applications, those skilled in the art may choose to use or not use one or more of the above sub-circuits according to situations. Various combinational modifications based on the above sub-circuits do not deviate from the principle of the present disclosure, and will not be repeated herein.

In the embodiments of the present disclosure, "operating voltage" refers to a voltage at which an operated transistor included therein may be turned on, and "non-operating voltage" refers to a voltage at which the operated transistor included therein cannot be turned on (i.e., the transistor is turned off). Depending on factors such as the type (the N-type or the P-type) of the transistors in the shift register circuit, the operating voltage may be higher or lower than the non-operating voltage. Generally, the shift register circuit uses a square wave pulse signal during operation, and the operating voltage corresponds to a voltage of a square wave pulse portion of the square wave pulse signal, and the non-operating voltage corresponds to a voltage of a non-square wave pulse portion of the square wave pulse signal.

Figure 29A:
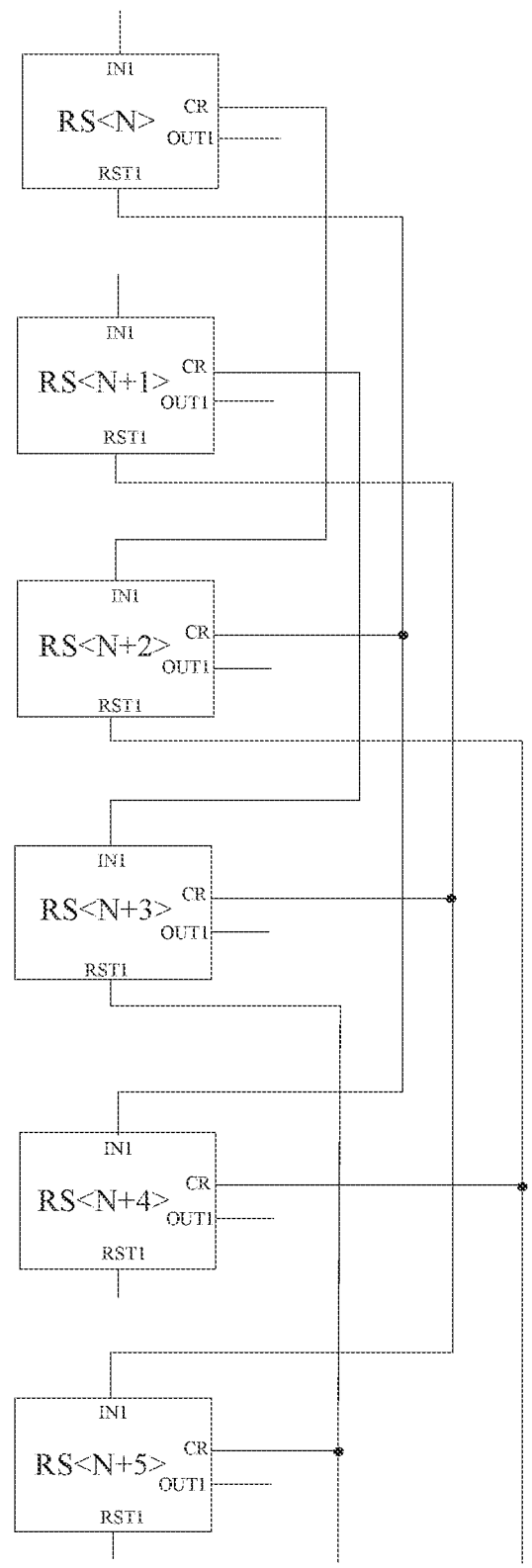
FIG. 29A is a cascade structural diagram of a gate driver circuit, in accordance with some embodiments.
Figure 29B:
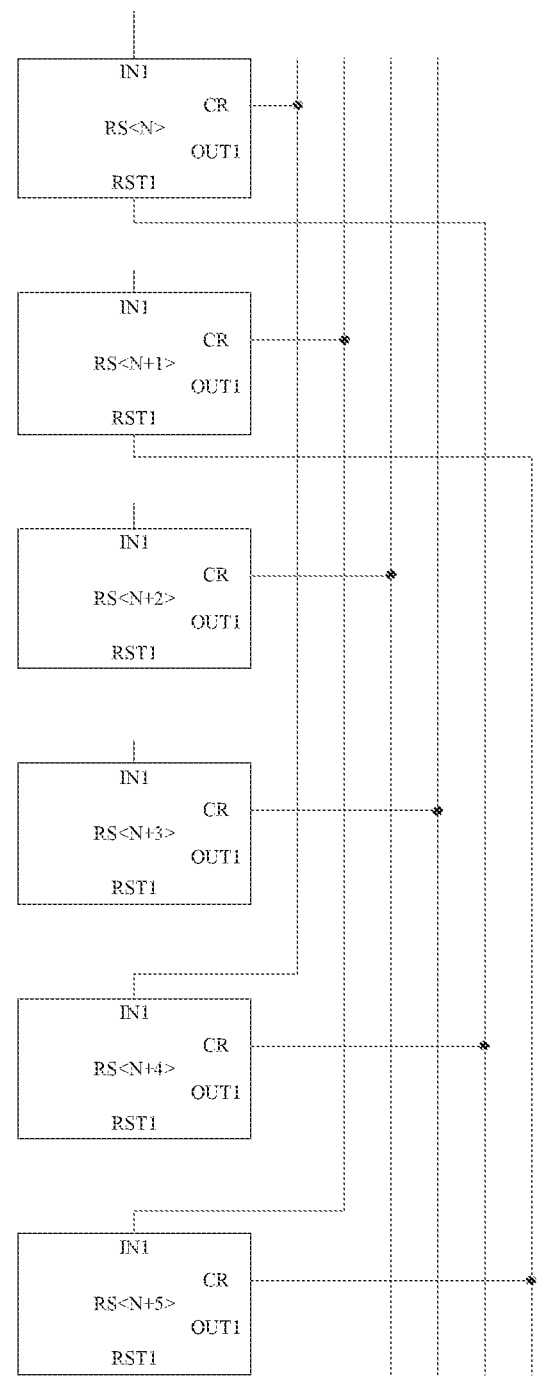
FIG. 29B is a cascade structural diagram of another gate driver circuit, in accordance with some embodiments.

The embodiments of the present disclosure further provide a gate driver circuit 10, and as shown in FIGS. 29A and 29B, the gate driver circuit 10 includes a plurality of shift register circuits RS that are cascaded and each as described above.

A cascade signal output terminal CR of an Nth-stage shift register circuit RS(N) is coupled to a first input signal terminal IN1 of an (N+k)th-stage shift register circuit RS(N+k), a cascade signal output terminal CR of the (N+k)th-stage shift register circuit RS(N+k) is coupled to a first reset signal terminal RST1 of the Nth-stage shift register circuit RS(N), thereby forming a cascade structure of the gate driver circuit 10. It will be noted that a cascade mode of the gate driver circuit 10 is not limited thereto, and may be designed according to actual needs.

In some embodiments, the structure of the shift register circuit is shown with reference to FIGS. 5 to 8B. In this case, as shown in FIG. 29A, the cascade signal output terminal CR of the Nth-stage shift register circuit RS(N) is coupled to a first input signal terminal IN1 of an (N+2)th-stage shift register circuit RS(N+2), and a cascade signal output terminal CR of the (N+2)th-stage shift register circuit RS(N+2) is coupled to the first reset signal terminal RST1 of the Nth-stage shift register circuit RS(N). First input signal terminals IN1 of first two stages of shift register circuits are coupled to the first initial signal line. A second input signal terminal IN2 of a (4i+5)th-stage shift register circuit RS(4i+5) is coupled to a pull-up node PU of a (4i+1)th-stage shift register circuit RS(4i+1). Second input signal terminals IN2 of first four stages of shift register circuits are coupled to the second initial signal line. In addition, second reset signal terminals RST2 of all shift register circuits are coupled to the total reset signal line. The total reset signal line is configured to transmit the second reset signal, and the shift register circuit switches to a non-operating state after receiving the second reset signal.

For example, a cascade signal output terminal CR of a first-stage shift register circuit RS(1) is coupled to a first input signal terminal IN1 of a third-stage shift register circuit RS(3), and a cascade signal output terminal CR of a second-stage shift register circuit RS(2) is coupled to a first input signal terminal IN1 of a fourth-stage shift register circuit RS(4). First input signal terminals IN1 of both the first-stage shift register circuit RS(1) and the second-stage shift register circuit RS(2) are coupled to the first initial signal line. A first reset signal terminal RST1 of the first-stage shift register circuit RS(1) is coupled to a cascade signal output terminal CR of the third-stage shift register circuit RS(3), and a first reset signal terminal RST1 of the second-stage shift register circuit RS(2) is coupled to a cascade signal output terminal CR of the fourth-stage shift register circuit RS(4). A second input signal terminal IN2 of a fifth-stage shift register circuit RS(5) is coupled to a pull-up node PU of the first-stage shift register circuit RS(1), and a second input signal terminal IN2 of a sixth-stage shift register circuit RS(6) is coupled to a pull-up node PU of the second-stage shift register circuit RS(2). Second input signal terminals IN2 of the first-stage shift register circuit RS(1) to the fourth-stage shift register circuit RS(4) are all coupled to the second initial signal line.

In some other embodiments, the structure of the shift register circuit is shown with reference to FIGS. 9 to 12B. In this case, as shown in FIG. 29B, the cascade signal output terminal CR of the Nth-stage shift register circuit RS(N) is coupled to a first input signal terminal IN1 of an (N+4)th-stage shift register circuit RS(N+4), and a cascade signal output terminal CR of the (N+4)th-stage shift register circuit RS(N+4) is coupled to the first reset signal terminal RST1 of the Nth-stage shift register circuit RS(N). First input signal terminals IN1 of the first four stages of shift register circuits are coupled to the first initial signal line. The cascade signal output terminal CR of the Nth-stage shift register circuit RS(N) is coupled to a second input signal terminal IN2 of an (N+7)th-stage shift register circuit RS(N+7). Second input signal terminals IN2 of first seven stages of shift register circuits are coupled to the second initial signal line.

For example, the cascade signal output terminal CR of the first-stage shift register circuit RS(1) is coupled to a first input signal terminal IN1 of the fifth-stage shift register circuit RS(5), the cascade signal output terminal CR of the second-stage shift register circuit RS(2) is coupled to a first input signal terminal IN1 of the sixth-stage shift register circuit RS(6), the cascade signal output terminal CR of the third-stage shift register circuit RS(3) is coupled to a first input signal terminal IN1 of a seventh-stage shift register circuit RS(7), and the cascade signal output terminal CR of the fourth-stage shift register circuit RS(4) is coupled to a first input signal terminal IN1 of an eighth-stage shift register circuit RS(8). First input signal terminals IN1 of the first-stage shift register circuit RS(1) to the fourth-stage shift register circuit RS(4) are all coupled to the first initial signal line.

The first reset signal terminal RST1 of the first-stage shift register circuit RS(1) is coupled to a cascade signal output terminal CR of the fifth-stage shift register circuit RS(5), the first reset signal terminal RST1 of the second-stage shift register circuit RS(2) is coupled to a cascade signal output terminal CR of the sixth-stage shift register circuit RS(6), a first reset signal terminal RST1 of the third-stage shift register circuit RS(3) is coupled to a cascade signal output terminal CR of the seventh-stage shift register circuit RS(7), and a first reset signal terminal RST1 of the fourth-stage shift register circuit RS(4) is coupled to a cascade signal output terminal CR of the eighth-stage shift register circuit RS(8).

The cascade signal output terminal CR of the first-stage shift register circuit RS(1) is coupled to a second input signal terminal IN2 of the eighth-stage shift register circuit RS(8), the cascade signal output terminal CR of the second-stage shift register circuit RS(2) is coupled to a second input signal terminal IN2 of a ninth-stage shift register circuit RS(9), the cascade signal output terminal CR of the third-stage shift register circuit RS(3) is coupled to a second input signal terminal IN2 of a tenth-stage shift register circuit RS(10), and the cascade signal output terminal CR of the fourth-stage shift register circuit RS(4) is coupled to a second input signal terminal IN2 of an eleventh-stage shift register circuit RS(11). Second input signal terminals IN2 of the first-stage shift register circuit RS(1) to the seventh-stage shift register circuit RS(7) are all coupled to the second initial signal line.

Figure 30:
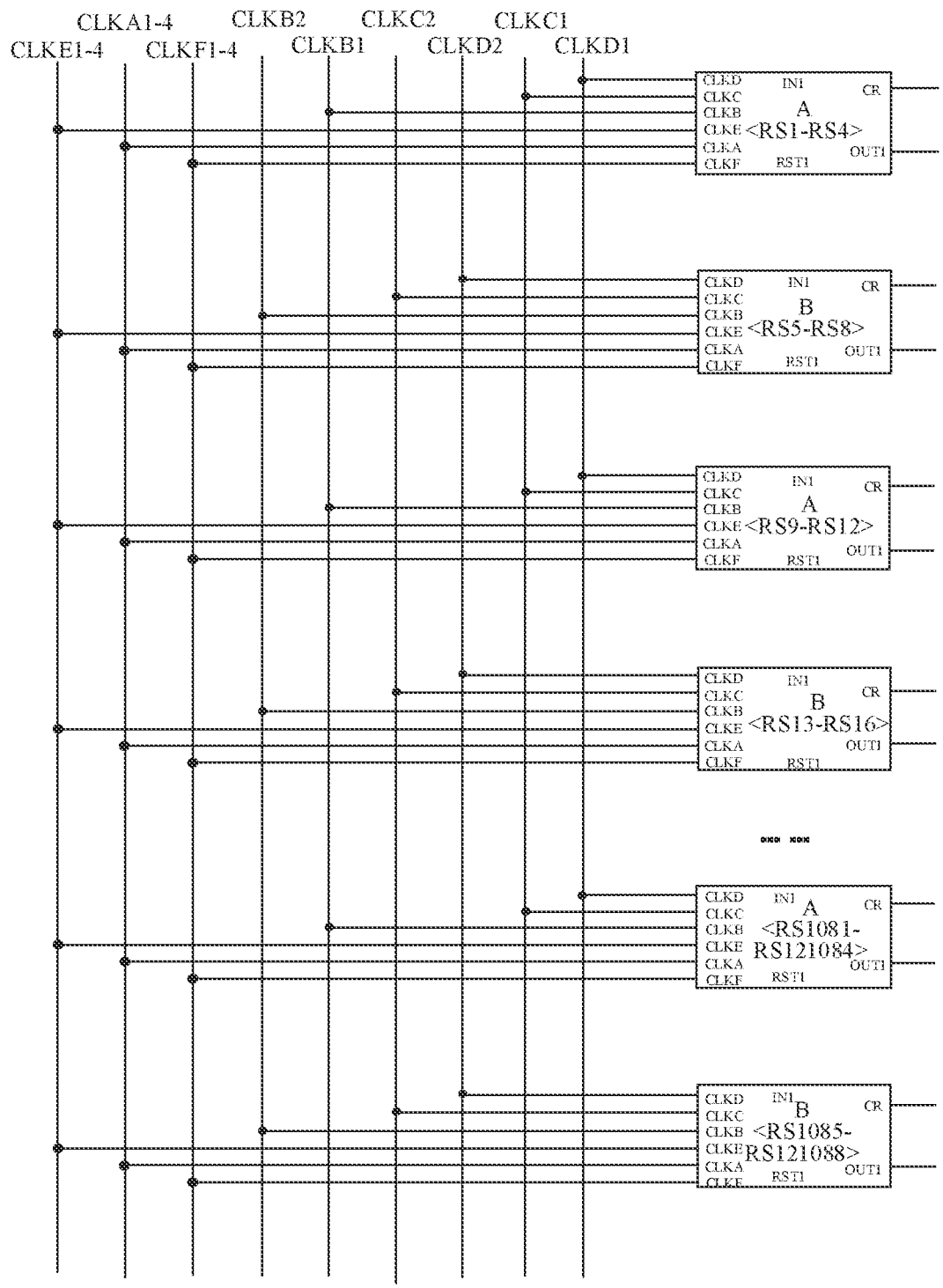
FIG. 30 is a cascade structural diagram of another gate driver circuit, in accordance with some embodiments.

In some embodiments, as shown in FIG. 30, the shift register circuits are divided into a plurality of first shift register circuit groups A and a plurality of second shift register circuit groups B, the first shift register circuit groups A and the second shift register circuit groups B are alternately arranged, and the number of shift register circuits in a first shift register circuit group A is equal to the number of shift register circuits in a second shift register circuit group B.

As shown in FIG. 30, every four stages of shift register circuits being a shift register circuit group will be considered as an example. A control sub-circuit 103 of the (4i+1)th-stage shift register circuit includes the first release unit 1031, the second release unit 1032, the first storage unit 1033 and the second storage unit 1034, and control sub-circuits 103 of the (4i+2)th-stage to (4i+4)th-stage shift register circuits each only include the first release unit 1031 and the second release unit 1032. In this case, first nodes P1 and second nodes P2 of the control sub-circuits 103 of the (4i+2)th-stage to (4i+4)th-stage shift register circuits are respectively coupled to a first node P1 and a second node P2 of the control sub-circuit 103 of the (4i+1)th-stage shift register circuit. Of course, control sub-circuits 103 of the (4i+1)th-stage to (4i+4)th-stage shift register circuits may each include the first release unit 1031, the second release unit 1032, the first storage unit 1033 and the second storage unit 1034. In this case, the control sub-circuits 103 of the (4i+1)th-stage to (4i+4)th-stage shift register circuits are each coupled to their respective corresponding signal terminals.

For example, as shown in FIG. 30, a second clock signal terminal CLKB, a third clock signal terminal CLKC and a fourth clock signal terminal CLKD of the first shift register circuit group A are respectively coupled to a first second clock signal line CLKB1, a first third clock signal line CLKC1 and a first fourth clock signal line CLKD1, and a second clock signal terminal CLKB, a third clock signal terminal CLKC and a fourth clock signal terminal CLKD of the second shift register circuit group B are respectively coupled to a second second clock signal line CLKB2, a second third clock signal line CLKC2 and a second fourth clock signal line CLKD2. A signal transmitted by the second second clock signal line CLKB2 has a phase retardation relative to a signal transmitted by the first second clock signal line CLKB1. A signal transmitted by the second third clock signal line CLKC2 has a phase retardation relative to a signal transmitted by the first third clock signal line CLKC1. A signal transmitted by the second fourth clock signal line CLKD2 has a phase retardation relative to a signal transmitted by the first fourth clock signal line CLKD1. That is, each clock signal line transmits a signal to a signal terminal coupled thereto during its operation.

Figure 31:
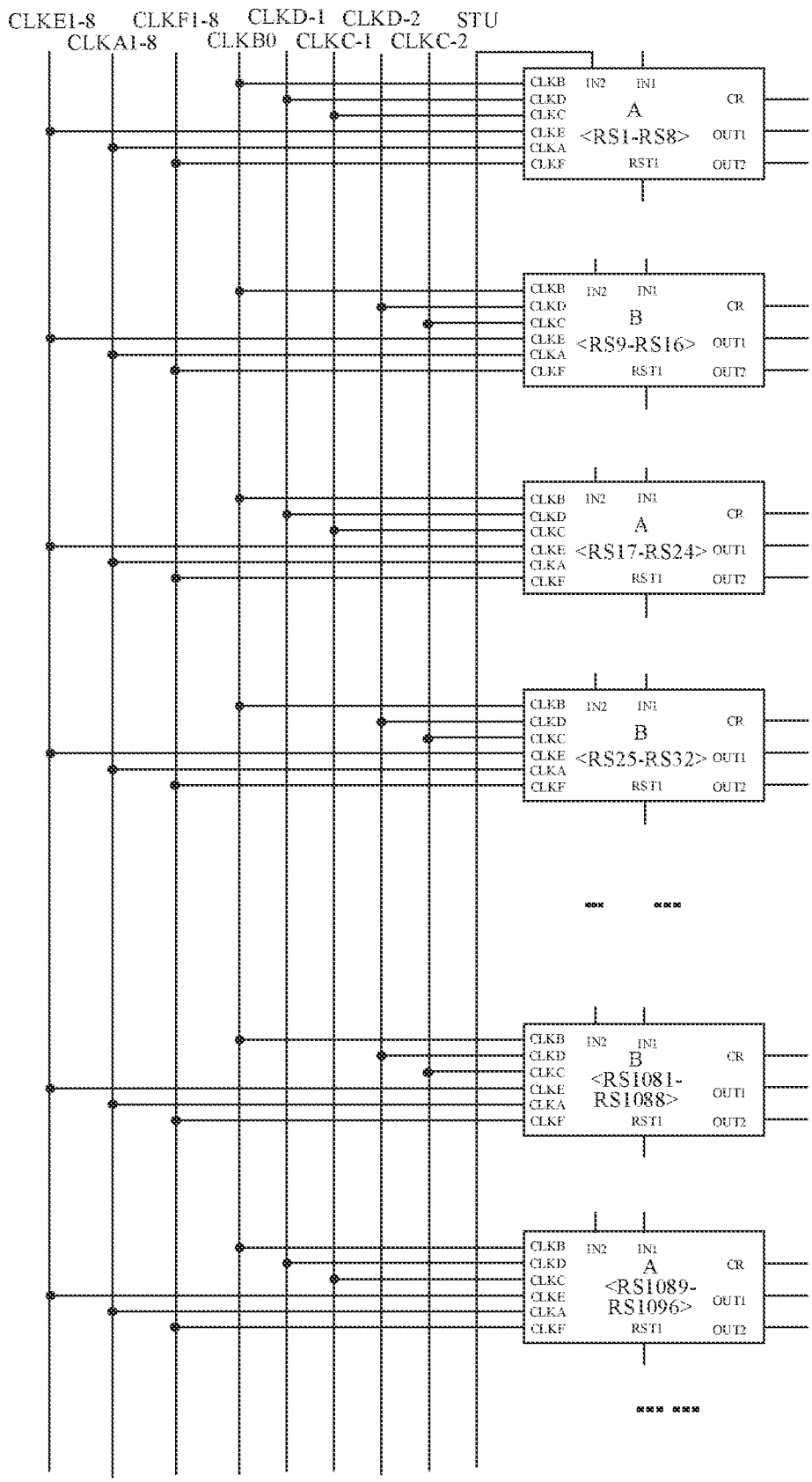
FIG. 31 is a cascade structural diagram of another gate driver circuit, in accordance with some embodiments.

In some embodiments, as shown in FIG. 31, the shift register circuits are divided into a plurality of first shift register circuit groups A and a plurality of second shift register circuit groups B, the first shift register circuit groups A and the second shift register circuit groups B are alternately arranged, and the number of shift register circuits in a first shift register circuit group A is equal to the number of shift register circuits in a second shift register circuit group B.

As shown in FIG. 31, every eight stages of shift register circuits being a shift register circuit group will be considered as an example. A control sub-circuit 103 of a (2i+1)th-stage shift register circuit includes the first release unit 1031, the second release unit 1032, the first storage unit 1033 and the second storage unit 1034, and a control sub-circuit 103 of a (2i+2)th-stage shift register circuit only includes the first release unit 1031 and the second release unit 1032. In this case, a first node P1 and a second node P2 of the control sub-circuit 103 of the (2i+2)th-stage shift register circuit are respectively coupled to a first node P1 and a second node P2 of the control sub-circuit 103 of the (2i+1)th-stage shift register circuit. Of course, control sub-circuits 103 of the (2i+1)th-stage to (2i+2)th-stage shift register circuits may each include the first release unit 1031, the second release unit 1032, the first storage unit 1033 and the second storage unit 1034. In this case, the control sub-circuits 103 of the (2i+1)th-stage to (2i+2)th-stage shift register circuits are each coupled to their respective corresponding signal terminals.

For example, as shown in FIG. 31, a third clock signal terminal CLKC and a fourth clock signal terminal CLKD of the first shift register circuit group A are respectively coupled to a first third clock signal line CLKC1 and a first fourth clock signal line CLKD1, a third clock signal terminal CLKC and a fourth clock signal terminal CLKD of the second shift register circuit group B are respectively coupled to a second third clock signal line CLKC2 and a second fourth dock signal line CLKD2, and second clock signal terminals CLKB of all shift register circuits are coupled to a second clock signal line CLKB0. A signal transmitted by the second third clock signal line CLKC2 has a phase retardation relative to a signal transmitted by the first third clock signal line CLKC1. A signal transmitted by the second fourth clock signal line CLKD2 has a phase retardation relative to signal transmitted by the first fourth clock signal line CLKD1. That is, each clock signal line transmits a signal to a signal terminal coupled thereto during its operation.

Figure 32:
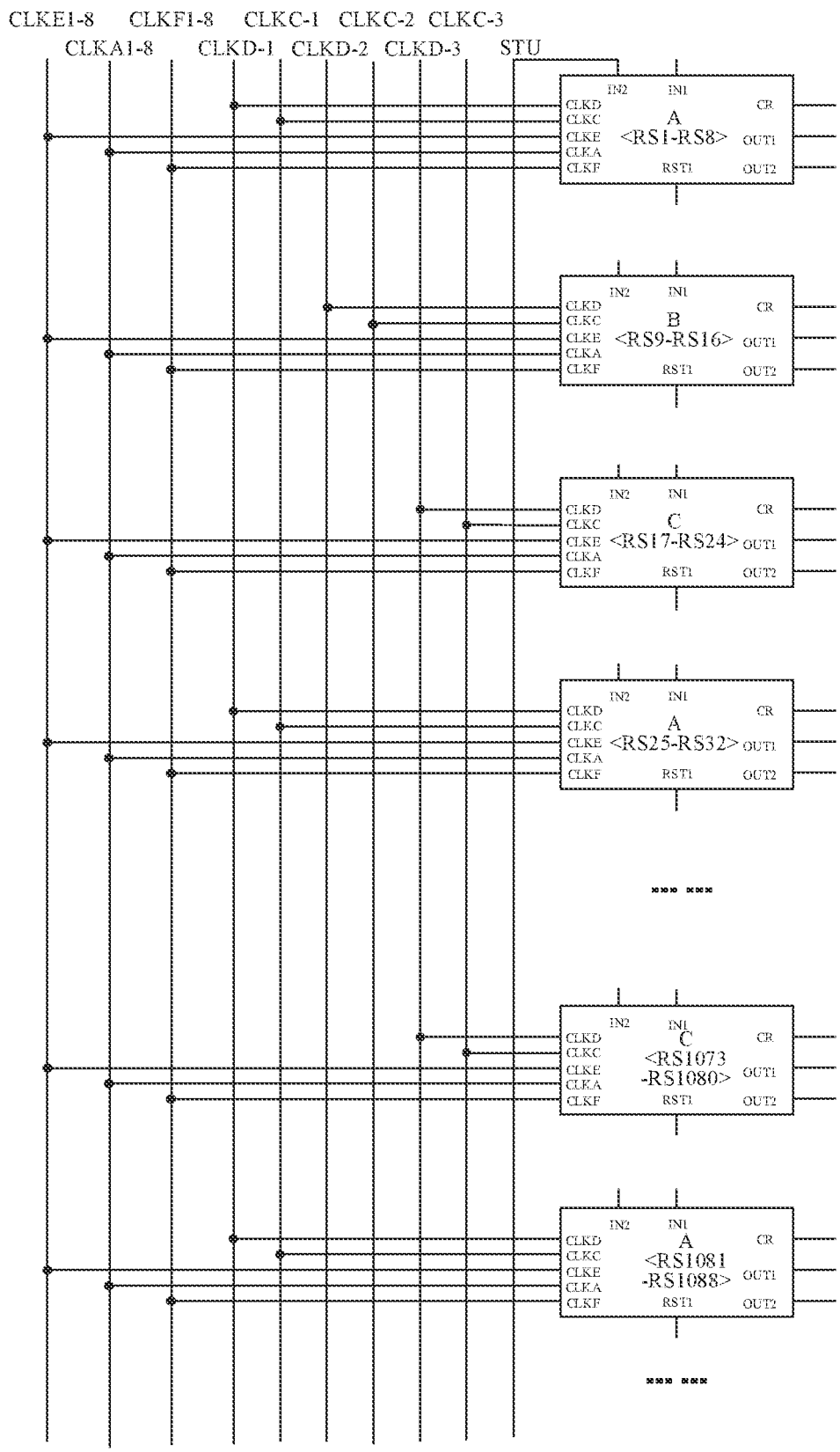
FIG. 32 is a cascade structural diagram of another gate driver circuit, in accordance with some embodiments.

In some embodiments, as shown in FIG. 32, the shift register circuits are divided into a plurality of first shift register circuit groups A, a plurality of second shift register circuit groups B and a plurality of third shift register circuit groups C. The first shift register circuit groups A, the second shift register circuit groups B and the third shift register circuit groups C are alternately arranged in sequence, and the number of shift register circuits in a first shift register circuit group A, the number of shift register circuits in a second shift register circuit group B, and the number of shift register circuits in a third shift register circuit group C are equal.

As shown in FIG. 32, every eight stages of shift register circuits being a shift register circuit group will be considered as an example. A control sub-circuit 103 of a (2i+1)th-stage shift register circuit includes the third release unit 1035, the third storage unit 1036 and the fourth storage unit 1037, and a control sub-circuit 103 of the (2i+2)th-stage shift register circuit includes only the third release unit 1035. In this case, a first node P1 and a second node P2 of the control sub-circuit 103 of the (2i+2)th-stage shift register circuit are respectively coupled to a first node P1 and a second node P2 of the control sub-circuit 103 of the (2i+1)th-stage shift register circuit. Of course, the control sub-circuits 103 of the (2i+1)th-stage to (2i+2)th-stage shift register circuits may each include the third release unit 1035, the third storage unit 1036 and the fourth storage unit 1037. In this case, the control sub-circuits 103 of the (2i+1)th-stage to (2i+2)th-stage shift register circuits are each coupled to their respective corresponding signal terminals.

For example, as shown in FIG. 32, a third clock signal terminal CLKC and a fourth clock signal terminal CLKD of the first shift register circuit group A are respectively coupled to a first third clock signal line CLKC1 and a first fourth clock signal line CLKD1, a third clock signal terminal CLKC and a fourth clock signal terminal CLKD of the second shift register circuit group B are respectively coupled to a second third clock signal line CLKC2 and a second fourth clock signal line CLKD2, and a third clock signal terminal CLKC and a fourth clock signal terminal CLKD of the third shift register circuit group C are respectively coupled to a third third clock signal line CLKC3 and a third fourth clock signal line CLKD3. A signal transmitted by the third third clock signal line CLKC3 has a phase retardation relative to a signal transmitted by the second third clock signal line CLKC2, and the signal transmitted by the second third clock signal line CLKC2 has a phase retardation relative to a signal transmitted by the first third clock signal line CLKC1. A signal transmitted by the third fourth clock signal line CLKD3 has a phase retardation relative to a signal transmitted by the second fourth clock signal line CLKD2, and the signal transmitted by the second fourth clock signal line CLKD2 has a phase retardation relative to a signal transmitted by the first fourth clock signal line CLKD1. That is, each clock signal line transmits a signal to a signal terminal coupled thereto during its operation.

Figure 33:
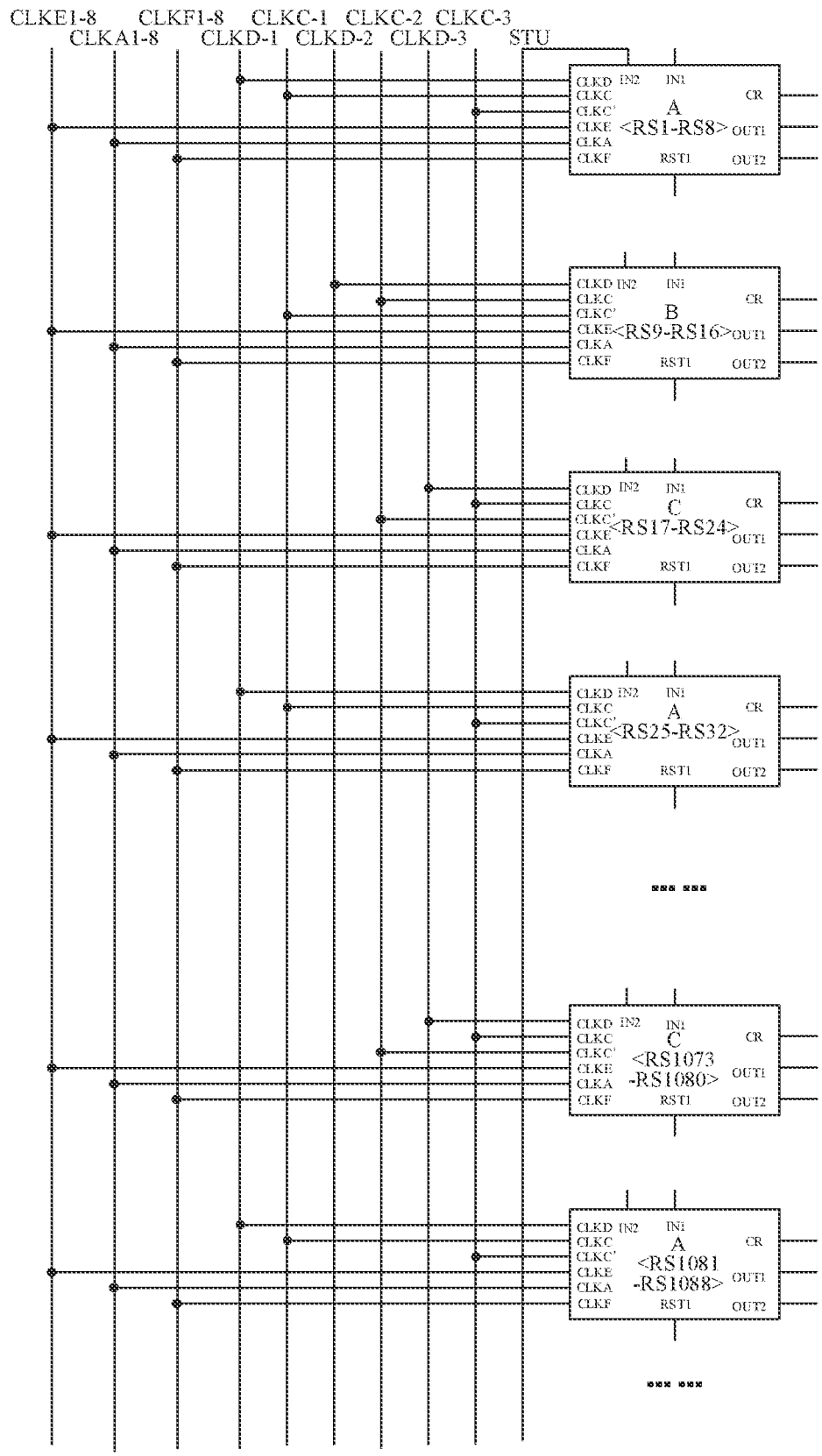
FIG. 33 is a cascade structural diagram of another gate driver circuit, in accordance with some embodiments.

In some embodiments, as shown in FIG. 33, the shift register circuits are divided into a plurality of first shift register circuit groups A, a plurality of second shift register circuit groups B and a plurality of third shift register circuit groups C. The first shift register circuit groups A, the second shift register circuit groups B and the third shift register circuit groups C are alternately arranged in sequence, and the number of shift register circuits in a first shift register circuit group A, the number of shift register circuits in a second shift register circuit group B and the number of shift register circuits in a third shift register circuit group C are equal.

As shown in FIG. 33, every eight stages of shift register circuits being a shift register circuit group will be considered as an example. A control sub-circuit 103 of a (2i+1)th-stage shift register circuit includes the third release unit 1035, the third storage unit 1036 and the fourth storage unit 1037, and a control sub-circuit 103 of the (2i+2)th-stage shift register circuit includes only the third release unit 1035. In this case, a first node P1 and a second node P2 of the control sub-circuit 103 of the (2i+2)th-stage shift register circuit are respectively coupled to a first node P1 and a second node P2 of the control sub-circuit 103 of the (2i+1)th-stage shift register circuit. Of course, the control sub-circuits 103 of the (2i+1)th-stage to (2i+2)th-stage shift register circuits may each include the third release unit 1035, the third storage unit 1036 and the fourth storage unit 1037. In this case, the control sub-circuits 103 of the (2i+1)th-stage to (2i+2)th-stage shift register circuits are coupled to their respective corresponding signal terminals.

For example, as shown in FIG. 33, a third clock signal terminal CLKC, an auxiliary third clock signal terminal CLKC' and a fourth clock signal terminal CLKD of the first shift register circuit group A are respectively coupled to a first third clock signal line CLKC1, a third third clock signal line CLKC3 and a first fourth dock signal line CLKD1, a third clock signal terminal CLKC, an auxiliary third clock signal terminal CLKC' and a fourth dock signal terminal CLKD of the second shift register circuit group B are respectively coupled to a second third clock signal line CLKC2, the first third clock signal line CLKC1 and a second fourth clock signal line CLKD2, and a third clock signal terminal CLKC, an auxiliary third clock signal terminal CLKC' and a fourth clock signal terminal CLKD of the third shift register circuit group C are respectively coupled to the third third clock signal line CLKC3, the second third clock signal line CLKC2 and the third fourth clock signal line CLKD3. A signal transmitted by the third clock signal line CLKC3 has a phase retardation relative to a signal transmitted by the second third clock signal line CLKC2, and the signal transmitted by the second third clock signal line CLKC2 has a phase retardation relative to a signal transmitted by the first third clock signal line CLKC1. A signal transmitted by the third fourth clock signal line CLKD3 has a phase retardation relative to a signal transmitted by the second fourth clock signal line CLKD2, and the signal transmitted by the second fourth clock signal line CLKD2 has a phase retardation relative to a signal transmitted by the first fourth clock signal line CLKD1. That is, each clock signal line transmits a signal to a signal terminal coupled thereto during its operation.

It will be noted that in the embodiments of the present disclosure, a cascade mode of various stages of shift register circuits in the gate driver circuit and a connection mode of the various stages of shift register circuits and a system clock may be the above mode, or may also be other connection modes.

A process in which the gate driver circuit 10 inserts a black image during display of a normal image will be described in detail below with reference to specific embodiments.

Figure 34:
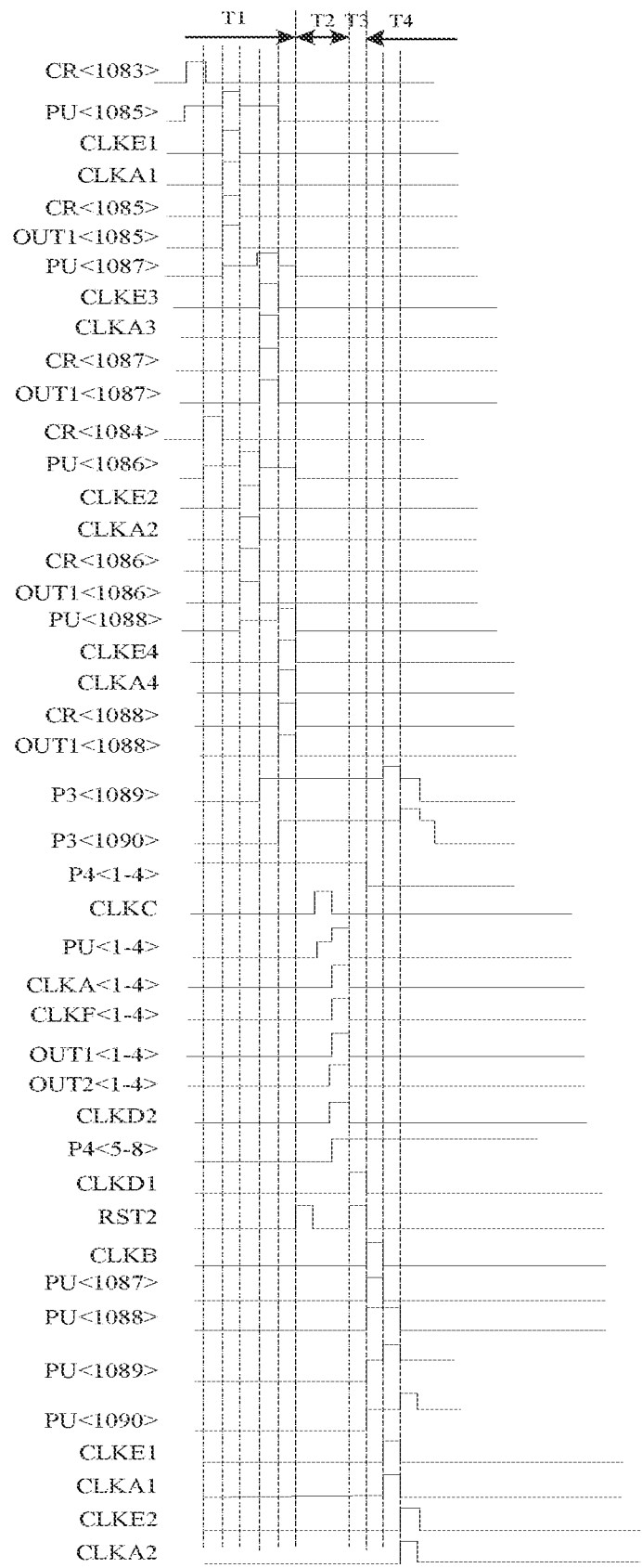
FIG. 34 is a timing diagram of a gate driver circuit based on the cascade structural diagram in FIG. 30.

In a first implementation manner:

by considering an example in which the control sub-circuit 103 of the shift register circuit includes at least the first release unit 1031 and the second release unit 1032, the process of inserting the black image during display of the normal image is exemplarily described in combination with the structure of the gate driver circuit 10 shown in FIG. 30 and with reference to the timing diagram shown in FIG. 34.

It will be noted that in the gate driver circuit 10, the control sub-circuit 103 of the (4i+1)th-stage shift register circuit includes the first release unit 1031, the second release unit 1032, the first storage unit 1033 and the second storage unit 1034, and the control sub-circuits 103 of the (4i+2)th-stage to (4i+4)th-stage shift register circuits each include the first release unit 1031, the second release unit 1032 and the second storage unit 1034. This embodiment will be described by considering the above contents as an example. However, it will be clear that the (4i+1)th-stage to (4i+4)th-stage shift register circuits may have the same structure. That is, each shift register circuit among the (4i+1)th-stage to (4i+4)th-stage shift register circuits includes the first release unit 1031, the second release unit 1032, the first storage unit 1033 and the second storage unit 1034. In addition, FIG. 34 is illustrated by considering an example in which a first frame of image is displayed, but the embodiments of the present disclosure are not limited thereto.

A cascade signal output terminal CR of the (4i+1)th-stage shift register circuit is coupled to a first input signal terminal IN1 of a (4i+3)th-stage shift register circuit, and a pull-up node PU of the (4i+1)th-stage shift register circuit is coupled to a second input signal terminal IN2 of the (4i+5)th-stage shift register circuit. First nodes P1 of the (4i+2)th-stage to (4i+4)th-stage shift register circuits are coupled to the first node P1 of the (4i+1)th-stage shift register circuit, and second nodes P2 of the (4i+1)th-stage to (4i+4)th-stage shift register circuits are independently arranged.

In a first phase (T1):

a fifth clock signal output from a cascade signal output terminal CR of a 1083rd-stage shift register circuit is used as a first input signal of a 1085th-stage shift register circuit, so that the 1085th-stage shift register circuit starts to operate; an input sub-circuit 101 of the 1085th-stage shift register circuit transmits the first input signal to a pull-up node PU thereof, so that the pull-up node PU is at a high voltage; and a control sub-circuit 103 of the 1085th-stage shift register circuit transmits the first input signal to a third node P3 thereof, so that the third node P3 is also at a high voltage; since the voltage at the third node P3 is the same as the voltage at the pull-up node PU, the control sub-circuit 103 of the 1085th-stage shift register circuit is equivalent to storing a current voltage at the pull-up node PU;

under control of the voltage at the pull-up node PU, an output sub-circuit 102 of the 1085th-stage shift register circuit transmits a first clock signal and the fifth clock signal to a first signal output terminal OUT1 thereof and a cascade signal output terminal CR thereof, respectively; a fifth clock signal output from the cascade signal output terminal CR of the 1085th-stage shift register circuit may be used as a first input signal of a 1087th-stage shift register circuit, and may also be used as a first reset signal of the 1083rd-stage shift register circuit;

a fifth clock signal output from a cascade signal output terminal CR of a 1084th-stage shift register circuit is used as a first input signal of a 1086th-stage shift register circuit, so that the 1086th-stage shift register circuit starts to operate; an input sub-circuit 101 of the 1086th-stage shift register circuit transmits the first input signal to a pull-up node PU thereof, so that the pull-up node PU is at a high voltage; and a control sub-circuit 103 of the 1086th-stage shift register circuit transmits the first input signal to a third node P3 thereof, so that the third node P3 is also at a high voltage; similarly, the control sub-circuit 103 of the 1086th-stage shift register circuit is equivalent to storing a current voltage at the pull-up node PU;

under control of the voltage at the pull-up node PU, an output sub-circuit 102 of the 1086th-stage shift register circuit transmits the first clock signal and the fifth dock signal to a first signal output terminal OUT1 thereof and a cascade signal output terminal CR thereof, respectively; a fifth clock signal output from the cascade signal output terminal CR of the 1086th-stage shift register circuit may be used as a first input signal of a 1088th-stage shift register circuit, and may also be used as a first reset signal of the 1084th-stage shift register circuit.

Regarding operating processes of the 1087th-stage shift register circuit and the 1088th-stage shift register circuit, reference may be made to the operating processes of the 1085th-stage shift register circuit and the 1086th-stage shift register circuit, which will not be repeated here.

It will be noted that, while the 1087th-stage shift register circuit outputs the first clock signal and the fifth clock signal, a control sub-circuit 103 of a 1089th-shift register circuit realizes a storage of a first input signal (a voltage at a third node P3 thereof), and the 1085th-stage shift register circuit realizes reset triggered by a first reset signal thereof; and while the 1088th-stage shift register circuit outputs the first clock signal and the fifth clock signal, a control sub-circuit 103 of a 1090th-shift register circuit realizes a storage of a first input signal (a voltage at the third node P3 thereof), and the 1086th-stage shift register circuit realizes reset triggered by a first reset signal thereof.

In this phase, output of signals from the 1085th-stage shift register circuit to the 1088th-stage shift register circuit and storage of voltages at third nodes P3 from the 1087th-stage shift register circuit to the 1090th-stage shift register circuit are completed.

It will be understood that, first clock signals output by the 1085th-stage shift register circuit to the 1088th-stage shift register circuit are sequentially transmitted to first scanning signal lines from 1085th to 1088th rows in the display panel 100. As long as data signal lines in the display panel 100 provide data signals for displaying a normal image, the 1085th to 1088th rows in the display panel 100 may display the normal image.

In a second phase (T2):
before cascade signal output terminals CR of the 1089th-stage shift register circuit and the 1090th-stage shift register circuit output fifth clock signals, that is, before first reset signals of the 1087th-stage shift register circuit and the 1088th-stage shift register circuit arrive, the total reset signal line provides a high voltage signal, so that second reset signal terminals RST2 of the 1087th-stage shift register circuit to the 1090th-stage shift register circuit each receive a second reset signal with a high voltage, so as to pull down a voltage at a respective pull-up node PU; that is, the 1087th-stage shift register circuit to the 1090th-stage shift register circuit are each in the non-operating state;
a second initial signal line coupled to control sub-circuits 103 of the first-stage shift register circuit to the fourth-stage shift register circuit provides a second initial signal with a high voltage; fourth nodes P4 of the first-stage to the fourth-stage shift register circuits are each made to be at a high voltage under control of a fourth clock signal with a high voltage received at a respective fourth dock signal terminal CLKD; under control of a voltage at a respective fourth node P4 and a third clock signal with a high voltage received at a respective third dock signal terminal CLKC, the control sub-circuits 103 of the first-stage to fourth-stage shift register circuits each transmit a second storage signal with a high voltage from a respective second storage signal terminal VR2 to a pull-up node PU, so that the pull-up node PU is at a high voltage;
first dock signal terminals CLKA each receive a first dock signal with a high voltage, fifth dock signal terminals CLKE each receive a fifth clock signal with a high voltage, and sixth dock signal terminals CLKF each receive a sixth dock signal with a high voltage; the first-stage to fourth-stage shift register circuits each transmit the first clock signal, the fifth clock signal and the sixth dock signal to a first signal output terminal OUT1, a cascade signal output terminal CR and a second signal output terminal OUT2 respectively under control of a voltage at a respective pull-up node PU;
moreover, the fifth-stage to eighth-stage shift register circuits, under control of a fourth dock signal received at fourth clock signal terminals CLKD, transmit high voltage signals of the pull-up nodes PU of the first-stage to fourth-stage shift register circuits to fourth nodes P4 thereof respectively.

In this phase, output of signals from the first-stage shift register circuit to the fourth-stage shift register circuit is completed.

It will be understood that, first clock signals output by the first-stage shift register circuit to the fourth-stage shift register circuit are transmitted to first scanning signal lines from first to fourth rows in the display panel 100, and sixth clock signals output by the first-stage shift register circuit to the fourth-stage shift register circuit are transmitted to second scanning signal lines from the first to fourth rows in the display panel 100. As long as the data signal lines in the display panel 100 provide data signals for displaying the black image, the first to fourth rows in the display panel 100 may display the black image. Of course, the shift register circuit may not output the sixth clock signal in this phase. That is, the display panel does not receive the second scanning signal, which does not affect the display of the black image of the display panel.

In a third phase (T3):
the total reset signal line provides the high voltage signal, so that second reset signal terminals RST2 of the first-stage shift register circuit to the fourth-stage shift register circuit each receive a second reset signal with a high voltage, so as to pull down a voltage at a respective pull-up node PU; that is, the first-stage shift register circuit to the fourth-stage shift register circuit are each in the non-operating state;
in addition, the control sub-circuits 103 of the first-stage shift register circuit to the fourth-stage shift register circuit each transmit a second initial signal with a low voltage to the respective fourth node P4 under the control of the fourth clock signal received at the respective fourth clock signal terminal CLKD.

It will be noted that a second input signal of a control sub-circuit 103 of an Nth-stage shift register circuit, other than the first four stages of shift register circuits, may be provided by a pull-up node PU of an (N−4)th-stage shift register circuit.

In a fourth phase (T4):
second clock signal terminals CLKB of the 1087th-stage shift register circuit to the 1090th-stage shift register circuit each receive a second clock signal with a high voltage; control sub-circuits 103 of the 1087th-stage shift register circuit to the 1090th-stage shift register circuit each transmit a first storage signal received at a respective first storage signal terminal VR1 to a pull-up node PU under control of the second clock signal and a pre-stored voltage at a respective third node P3, so that the pull-up node PU is at a high voltage. This process is equivalent to re-releasing the voltage at the pull-up node PU stored before inserting the black image, so as to restore the operation of the 1087th-stage shift register circuit to the 1090th-stage shift register circuit, thereby performing the normal display.

Based on the above process, the normal image and the black image may be alternately displayed. It will be understood that this embodiment will be described by considering an example in which the display of the black image from the first to fourth rows is inserted during the display of the normal image from the 1085th to 1088th rows, but an insertion method of the black image is not limited thereto, as long as the normal image and the black image may be alternately displayed. In this way, in this embodiment, the MPRT may increase without changing an image refresh frequency, thereby improving the display quality of the display panel.

Figure 35:
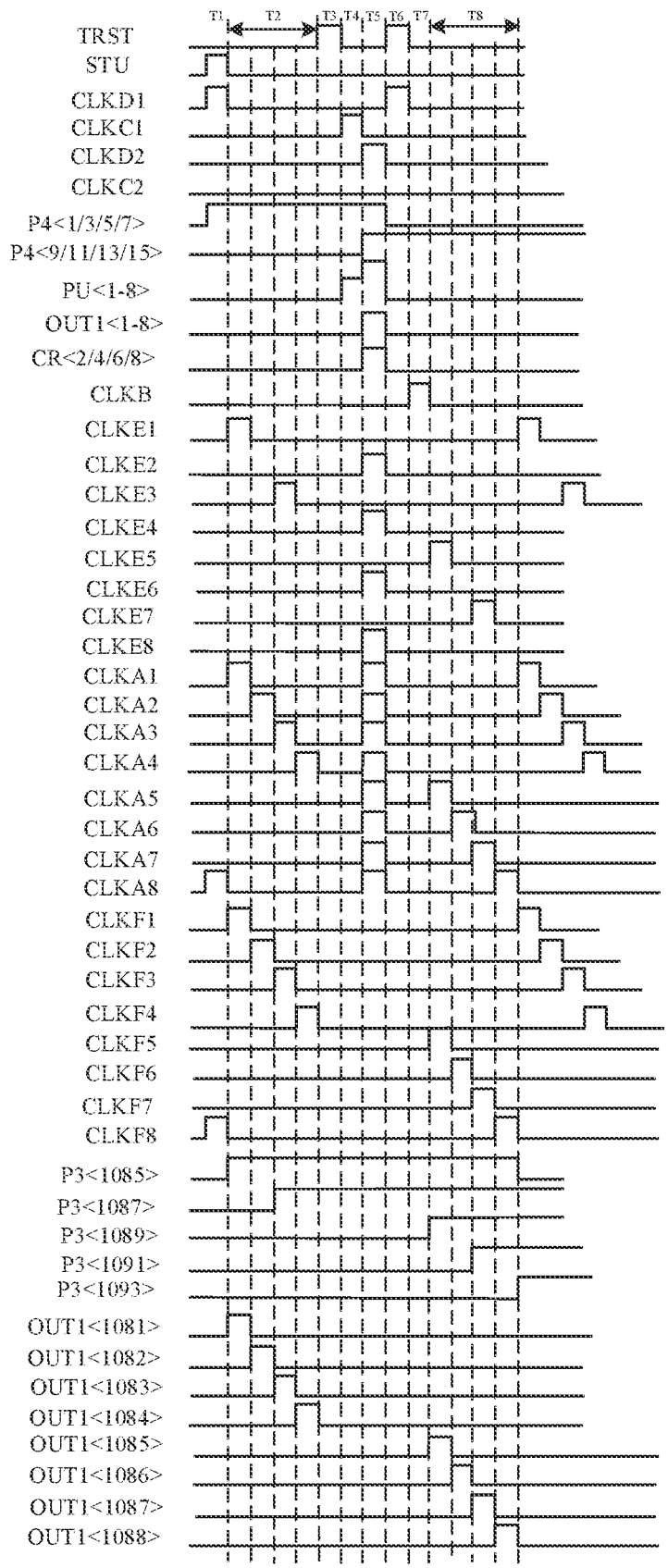
FIG. 35 is a timing diagram of a gate driver circuit based on the cascade structural diagram in FIG. 31.

In a second implementation manner:

by considering an example in which the control sub-circuit 103 of the shift register circuit includes at least the first release unit 1031 and the second release unit 1032, and the second reset signal terminal RST2 is coupled to the total reset signal line, the process of inserting the black image during the display of the normal image is exemplarily described in combination with the structure of the gate driver circuit 10 shown in FIG. 31 and with reference to the timing diagram shown in FIG. 35.

It will be noted that in the gate driver circuit 10, the control sub-circuit 103 of the shift register circuit at the odd-numbered stage includes the first release unit 1031, the second release unit 1032, the first storage unit 1033 and the second storage unit 1034, and the control sub-circuit 103 of the shift register circuit at the even-numbered stage includes the first release unit 1031 and the second release unit 1032. This embodiment will be described by considering the above contents as an example. However, it will be clear that the shift register circuit at the odd-numbered stage and the shift register circuit at the even-numbered stage may have the same structure. That is, each shift register circuit includes the first release unit 1031, the second release unit 1032, the first storage unit 1033 and the second storage unit 1034.

A cascade signal output terminal CR of the (2i+1)th-stage shift register circuit is coupled to a first input signal terminal IN1 of a (2i+5)th-stage shift register circuit and a second input signal terminal IN2 of a (2i+7)th-stage shift register circuit. The first node P1 and the second node P2 of the (2i+2)th-stage shift register circuit are coupled to the first node P1 and the second node P2 of the (2i+1)th-stage shift register circuit, respectively.

In a first phase (T1):

the second initial signal provided by the second initial signal line STU and a fourth clock signal provided by the fourth clock signal terminals CLKD coupled to the first-stage, third-stage, fifth-stage and seventh-stage shift register circuits are both at high voltages, so that sixth transistors M6 of the first-stage, third-stage, fifth-stage and seventh-stage shift register circuits are each turned on to transmit a second input signal to a respective fourth node P4, so as to make the fourth node P4 at a high voltage.

In a second phase (T2):

input sub-circuits 101 of 1081st-stage to 1084th-stage shift register circuits each transmit a received first input signal to a respective pull-up node PU, so that the pull-up node PU is at a high voltage; and control sub-circuits 103 of the 1081st-stage to the 1084th-stage shift register circuits each transmit the received first input signal to a respective third node P3, so that the third node P3 is also at a high voltage, and the third node P3 is equivalent to storing the current voltage at the pull-up node PU;

output sub-circuits 102 of the 1081st-stage to 1084th-stage shift register circuits, under control of the voltages at the pull-up nodes PU thereof, sequentially transmit the first clock signals to their respective first signal output terminals OUT1, and sequentially transmit the sixth clock signals to their respective second signal output terminals OUT2; in addition, the output sub-circuits 102 of 1081st-stage and 1083rd-stage shift register circuits further transmit the fifth clock signals to their respective cascade signal output terminals CR; the fifth clock signals output from the cascade signal output terminals CR of the 1081st-stage and 1083rd-stage shift register circuits may be used as first input signals of 1085th-stage and 1087th-stage shift register circuits respectively, and may also be used as first reset signals of 1077th-stage and 1079th-stage shift register circuits respectively;

when the 1081st-stage shift register circuit outputs the fifth clock signal, both an input sub-circuit 101 and a control sub-circuit 103 of the 1085th-stage shift register circuit receives a first input signal, so that both the pull-up node PU and the third node P3 thereof are at high voltages; when the 1083rd-stage shift register circuit outputs the fifth clock signal, both an input sub-circuit 101 and a control sub-circuit 103 of the 1087th-stage shift register circuit receives a first input signal, so that both the pull-up node PU and the third node P3 thereof are at high voltages; since the 1081st-stage and 1083rd-stage shift register circuits have not been reset at this time, the pull-up nodes PU and the third nodes P3 thereof are also at the high voltages.

It will be noted that in this embodiment, the shift register circuits at the odd-numbered stages are each used to transmit a cascade signal in the process of displaying the normal image, and the shift register circuits at the even-numbered stages are each used to transmit the cascade signal in the process of inserting the black image. Therefore, only the shift register circuits at the odd-numbered stages each output the fifth clock signal in the above display process.

In this phase, output of the first clock signals of 1081st-stage to 1084th-stage shift register circuits is completed, and the first clock signals are sequentially transmitted to first scanning signal lines from 1081st to 1084th rows in the display panel 100. As long as the data signal lines in the display panel 100 provide the data signals for displaying the normal image, the 1081st to 1084th rows in the display panel 100 may display the normal image.

In a third phase (T3):

the total reset signal line provides the reset signal with the high voltage, so that second reset signal terminals RST2 of all shift register circuits each receive a second reset signal with a high voltage, so as to pull down the voltage at a respective pull-up node PU; therefore, the 1081st-stage to 1084th-stage, the 1085th-stage and the 1087th-stage shift register circuits are each in the non-operating state.

In a fourth phase (T4):

the third clock signal provided by the third clock signal terminals CLKC coupled to the first-stage, third-stage, fifth-stage and seventh-stage shift register circuits is at a high voltage, so that second transistors M2 of the first-stage, third-stage, fifth-stage and seventh-stage shift register circuits are each turned on; seventh transistors M7 of the first-stage, third-stage, fifth-stage and seventh-stage shift register circuits are each turned on under control of a stored high voltage at a respective fourth node P4, so that a second storage signal (the third clock signal) received at a respective second storage signal terminal VR2 is transmitted to a pull-up node PU through a second node P2;

since second nodes P2 of the second-stage, fourth-stage, sixth-stage and eighth-stage shift register circuits are respectively coupled to second nodes P2 of the first-stage, third-stage, fifth-stage and seventh-stage shift register circuits, pull-up nodes PU of the first-stage to eighth-stage shift register circuits are all at the operating voltages.

In a fifth phase (T5):
the first clock signals provided by the first clock signal terminals CLKA coupled to the first-stage to eighth-stage shift register circuits and the fifth clock signals provided by fifth clock signal terminals CLKE coupled to the second-stage, fourth-stage, sixth-stage and eighth-stage shift register circuits are all at high voltages; first signal output terminals OUT1 of the first-stage to eighth-stage shift register circuits each output the first clock signal, and cascade signal output terminals CR of the second-stage, fourth-stage, sixth-stage and eighth-stage shift register circuits each output the fifth clock signal; moreover, the fourth clock signal provided by fourth clock signal terminals CLKD coupled to the ninth-stage, eleventh-stage, thirteenth-stage and fifteenth-stage shift register circuits is also at a high voltage, so that sixth transistors M6 of the ninth-stage, eleventh-stage, thirteenth-stage and fifteenth-stage shift register circuits are each turned on; therefore, the fifth clock signals output by the second-stage, fourth-stage, sixth-stage and eighth-stage shift register circuits are respectively stored in fourth nodes P4 of the ninth-stage, eleventh-stage, thirteenth-stage and fifteenth-stage shift register circuits.

It will be noted that the sixth clock signal may or may not be output. Since this phase is used to display the black image, whether the sixth clock signal (the second scanning signal of the display panel 100) is output does not affect the display of the black image.

In addition, in the gate driver circuit, the shift register circuits at the even-numbered stages may be connected to the same fifth clock signal line. As long as a cascade signal output terminal CR of the last-stage ((8i+8)th-stage) shift register circuit in each shift register circuit group is coupled to second input signal terminals IN2 of the shift register circuits at the odd-numbered stages in the next shift register circuit group, so as to form a one-to-many input mode. Of course, the fifth clock signal line may also be coupled in other manners, which are not limited in this embodiment.

In this phase, output of the first clock signals of the first-stage to eighth-stage shift register circuits is completed, the first clock signals are transmitted to the first scanning signal lines from first to eighth rows in the display panel 100. As long as the data signal lines in the display panel 100 provide the data signals for turning off the driving transistors, the first to eighth rows in the display panel 100 may display the black image.

In a sixth phase (T6):
the reset signal provided by the total reset signal line and the fourth clock signal provided by the fourth clock signal terminals CLKD coupled to the first-stage, third-stage, fifth-stage and seventh-stage shift register circuits are both at high voltages; the second reset signal terminals RST2 of all shift register circuits each receive the second reset signal with the high voltage, so as to pull down the voltage at a respective pull-up node PU; in addition, sixth transistors M6 of the first-stage, third-stage, fifth-stage and seventh-stage shift register circuits are each turned on, so that the voltage at a respective fourth node P4 is also pulled down; therefore, the pull-up nodes PU of the first-stage shift register circuit to the eighth-stage shift register circuit and the fourth nodes P4 of the first-stage, third-stage, fifth-stage and seventh-stage shift register circuits are all at low voltages.

In a seventh phase (T7):
the second clock signal provided by the second clock signal terminals CLKB is at a high voltage, so that first transistors M1 of the 1081st-stage to 1088th-stage shift register circuits are each turned on; fourth transistors M4 of the 1081st-stage, 1083rd-stage, 1085th-stage, and 1087th-stage shift register circuits are each turned on under control of the stored high voltage at a respective third node P3, so that a first storage signal (the second clock signal) received at a respective first storage signal terminal VR1 is transmitted to a pull-up node PU through a first node P1;

since first nodes P1 of the 1082nd-stage, 1084th-stage, 1086th-stage and 1088th-stage shift register circuits are respectively coupled to first nodes P1 of the 1081st-stage, 1083rd-stage, 1085th-stage and 1087th-stage shift register circuits, the pull-up nodes PU of the 1081st-stage to 1088th-stage shift register circuits are all at the operating voltages.

In an eighth phase (T8):
the first clock signals provided by the first clock signal terminals CLKA coupled to the 1085th-stage to 1088th-stage shift register circuits, the sixth clock signals provided by the sixth clock signal terminals CLKF coupled to the 1085th-stage to 1088th-stage shift register circuits, and the fifth clock signals provided by the fifth clock signal terminals CLKE coupled to the 1085th-stage and 1087th-stage shift register circuits are all at high voltages; output sub-circuits 102 of the 1085th-stage to 1088th-stage shift register circuits sequentially transmit the first dock signals to their respective first signal output terminals OUT1, and transmit the sixth clock signals to their respective second signal output terminals OUT2; in addition, the output sub-circuits 102 of the 1085th-stage and 1087th-stage shift register circuits further transmit the fifth clock signals to their respective cascade signal output terminals CR, and the fifth clock signals output by the 1085th-stage and 1087th-stage shift register circuits may be used as first input signals of the 1089th-stage and 1091st-stage shift register circuits respectively, and may also be used as first reset signals of the 1081st-stage and 1083rd-stage shift register circuits respectively.

In this phase, output of the first clock signals of the 1085th-stage to 1088th-stage shift register circuits is completed, and the first clock signals are sequentially transmitted to first scanning signal lines from 1085th to 1088th rows in the display panel 100. As long as the data signal lines in the display panel 100 provide the data signals for displaying the normal image, the 1085th to 1088th rows in the display panel 100 may display the normal image.

Based on the above process, the normal image and the black image may be alternately displayed. It will be understood that this embodiment will be described by considering an example in which the display of the black image from the first to eighth rows is inserted during the display of the normal image from the 1081st to 1088th rows, but an insertion method of the black image is not limited thereto, as long as the normal image and the black image may be alternately displayed. In this way, in this embodiment, the MPRT may increase without changing the image refresh frequency, thereby improving the display quality of the display panel.

Figure 36:
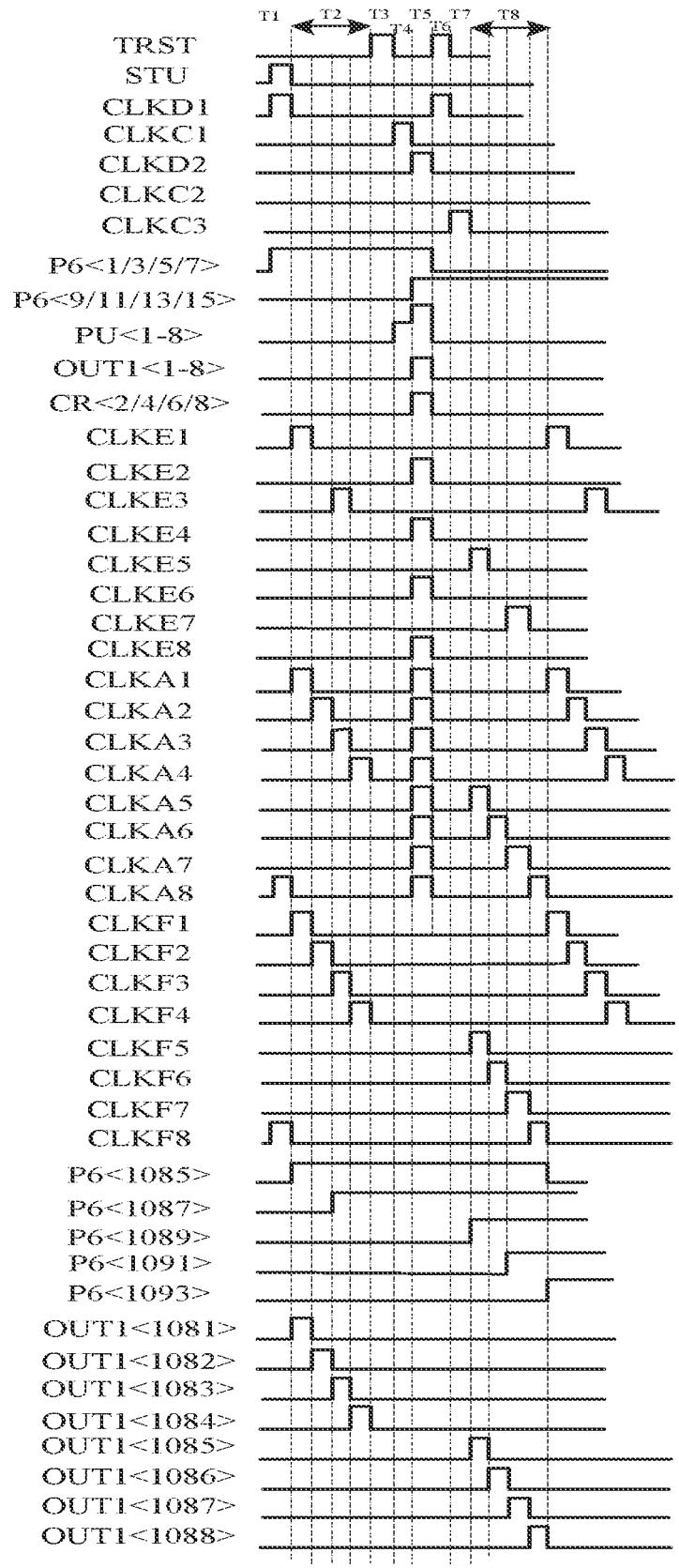
FIG. 36 is a timing diagram of a gate driver circuit based on the cascade structural diagram in FIG. 32.

In a third implementation manner:

by considering an example in which the control sub-circuit 103 of the shift register circuit includes at least the third release unit 1035, and the second reset sub-circuit 108 of the shift register circuit is coupled to the second reset signal terminal RST2, the process of inserting the black image during the display of the normal image is exemplarily described in combination with the structure of the gate driver circuit 10 shown in FIG. 32 and with reference to the timing diagram shown in FIG. 36.

It will be noted that in the gate driver circuit 10, the control sub-circuit 103 of the shift register circuit at the odd-numbered stage includes the third release unit 1035, the third storage unit 1036 and the fourth storage unit 1037, and the control sub-circuit 103 of the shift register circuit at the even-numbered stage includes the third release unit 1035. This embodiment will be described by considering the above contents as an example. However, it will be clear that the shift register circuit at the odd-numbered stage and the shift register circuit at the even-numbered stage may have the same structure. That is, each shift register circuit includes the third release unit 1035, the third storage unit 1036 and the fourth storage unit 1037.

A cascade signal output terminal CR of the (2i+1)th-stage shift register circuit is coupled to a first input signal terminal IN1 of a (2i+5)th-stage shift register circuit and a second input signal terminal IN2 of the (2i+7)th-stage shift register circuit. The first node P1 and the second node P2 of the (2i+2)th-stage shift register circuit are coupled to the first node P1 and the second node P2 of the (2i+1)th-stage shift register circuit, respectively.

In a first phase (T1):

the second initial signal provided by the second initial signal line STU and a fourth clock signal provided by the fourth clock signal terminals CLKD coupled to the first-stage, third-stage, fifth-stage and seventh-stage shift register circuits are both at high voltages, so that twelfth transistors M12 of the first-stage, third-stage, fifth-stage and seventh-stage shift register circuits are each turned on to transmit a second input signal to a respective sixth node P6, so as to make the sixth nodes P6 at a high voltage.

In a second phase (T2):

input sub-circuits 101 of 1073rd-stage to 1076th-stage shift register circuits each transmit a received first input signal to a respective pull-up node PU, so that the pull-up node PU is at a high voltage; under control of the voltages of the pull-up nodes PU, output sub-circuits 102 of the 1073rd-stage to 1076th-stage shift register circuits sequentially transmit the first clock signals to their respective first signal output terminals OUT1, and transmit the sixth clock signals to their respective second signal output terminals OUT2; in addition, output sub-circuits 102 of the 1073rd-stage and 1075th-stage shift register circuits further transmit the fifth clock signals to their respective cascade signal output terminals CR; the fifth clock signals output from the cascade signal output terminals CR of the 1073rd-stage and 1075th-stage shift register circuits may be used as first input signals of the 1077th-stage and 1079th-stage shift register circuits, and may also be used as first reset signals of 1069th-stage and 1071st-stage shift register circuits respectively;

when the 1073rd-stage shift register circuit outputs the fifth clock signal, an input sub-circuit 101 and a control sub-circuit 103 of the 1077th-stage shift register circuit receive a first input signal, so that both a pull-up node PU and a sixth node P6 of the 1077th-stage shift register circuit are at high voltages; when the 1075th-stage shift register circuit outputs the fifth clock signal, an input sub-circuit 101 and a control sub-circuit 103 of the 1079th-stage shift register circuit receive a first input signal, so that both a pull-up node PU and a sixth node P6 of the 1079th-stage shift register circuit are at high voltages; since the 1073rd-stage and 1075th-stage shift register circuits have not been reset at this time, the pull-up nodes PU and sixth nodes P6 thereof are also at the high voltages.

It will be noted that in this embodiment, the shift register circuits at the odd-numbered stages are each used to transmit a cascade signal in the process of displaying the normal image, and the shift register circuits at the even-numbered stages are each used to transmit the cascade signal in the process of inserting the black image. Therefore, only the shift register circuits at the odd-numbered stages each output the fifth clock signal in the above display process.

In this phase, output of the first clock signals of the 1073rd-stage to 1076th-stage shift register circuits is completed, and the first clock signals are sequentially transmitted to first scanning signal lines from 1073rd to 1076th rows in the display panel 100. As long as the data signal lines in the display panel 100 provide the data signals for displaying the normal image, the 1073rd to 1076th rows in the display panel 100 may display the normal image.

In a third phase (T3):

the reset signal provided by the total reset signal line is at a high voltage; the second reset signal terminals RST2 of all shift register circuits each receive a second reset signal with a high voltage, so as to pull down the voltage at a respective pull-up node PU; therefore, the 1073rd-stage to 1076th-stage, the 1077th-stage and the 1079th-stage shift register circuits are each in the non-operating state.

In a fourth phase (T4):

the third clock signal provided by the third clock signal terminals CLKC coupled to the first-stage, third-stage, fifth-stage and seventh-stage shift register circuits is at a high voltage, so that eighth transistors M8 of the first-stage, third-stage, fifth-stage and seventh-stage shift register circuits are each turned on; tenth transistors M10 of the first-stage, third-stage, fifth-stage and seventh-stage shift register circuits are each turned on under control of a stored high voltage at a respective sixth nodes P6, so that a third storage signal (the third clock signal) received at a respective third storage signal terminal VR3 is transmitted to a pull-up node PU through a fifth node P5;

since fifth nodes P5 of the second-stage, fourth-stage, sixth-stage and eighth-stage shift register circuits are respectively coupled to fifth nodes P5 of the first-stage, third-stage, fifth-stage and seventh-stage shift register circuits, the pull-up nodes PU of the first-stage to eighth-stage shift register circuits are all at the operating voltages.

In a fifth phase (T5):

the first clock signals provided by the first clock signal terminals CLKA coupled to the first-stage to eighth-stage shift register circuits and the fifth clock signals provided by the fifth clock signal terminals CLKE coupled to the second-stage, fourth-stage, sixth-stage and eighth-stage shift register circuits are all at high voltages; first signal output terminals OUT1 of the first-stage to eighth-stage shift register circuits each output the first clock signal, and cascade signal output terminals CR of the second-stage, fourth-stage, sixth-stage and eighth-stage shift register circuits each output the fifth clock signal; moreover, the fourth clock signal provided by the fourth dock signal terminals CLKD coupled to the ninth-stage, eleventh-stage, thirteenth-stage and fifteenth-stage shift register circuits is also at a high voltage, so that twelfth transistors M12 of the ninth-stage, eleventh-stage, thirteenth-stage and fifteenth-stage shift register circuits are each turned on; therefore, the fifth clock signals output by the second-stage, fourth-stage, sixth-stage and eighth-stage shift register circuits are respectively stored in sixth nodes P6 of the ninth-stage, eleventh-stage, thirteenth-stage and fifteenth-stage shift register circuits.

It will be noted that the sixth clock signal may or may not be output. Since this phase is used to display the black image, whether the sixth clock signal (the second scanning signal of the display panel 100) is output does not affect the display of the black image.

In addition, in the gate driver circuit, the shift register circuits at the even-numbered stages may be connected to the same fifth dock signal line. As long as a cascade signal output terminal CR of the last-stage ((8i+8)th-stage) shift register circuit in each shift register circuit group is coupled to the second input signal terminals IN2 of the shift register circuits at the odd-numbered stages in the next shift register circuit group, so as to form the one-to-many input mode. Of course, the fifth clock signal line may also be coupled in other manners, which are not limited in this embodiment.

In this phase, output of the first clock signals of the first-stage to eighth-stage shift register circuits is completed, the first clock signals are transmitted to the first scanning signal lines from first to eighth rows in the display panel 100. As long as the data signal lines in the display panel 100 provide the data signals for turning off the driving transistors, the first to eighth rows in the display panel 100 may display the black image.

In a sixth phase (T6):
the reset signal provided by the total reset signal line and the fourth clock signal provided by the fourth clock signal terminals CLKD coupled to the first-stage, third-stage, fifth-stage and seventh-stage shift register circuits are both at high voltages; the second reset signal terminals RST2 of all shift register circuits each receive the second reset signal with the high voltage, so as to pull down the voltage at a respective pull-up node PU; in addition, twelfth transistors M12 of the first-stage, third-stage, fifth-stage and seventh-stage shift register circuits are each turned on, so that the voltage at a respective sixth node P6 is also pulled down; therefore, the pull-up nodes PU of the first-stage to eighth-stage shift register circuits and the sixth nodes P6 of the first-stage, third-stage, fifth-stage and seventh-stage shift register circuits are all at a low voltages.

In a seventh phase (T7):
the third clock signal provided by third clock signal terminals CLKC coupled to the 1073rd-stage to 1080th-stage shift register circuits is at a high voltage, so that eighth transistors M8 of the 1073rd-stage to 1080th-stage shift register circuits are each turned on; tenth transistors M10 of the 1073rd-stage, 1075th-stage, 1077th-stage and 1079th-stage shift register circuits are each turned on under control of the stored high voltage at a respective sixth node P6, so that a third storage signal (the third clock signal) received at a respective third storage signal terminal VR3 is transmitted to a pull-up node PU through a fifth node P5;

since fifth nodes P5 of the 1074th-stage, 1076th-stage, 1078th-stage and 1080th-stage shift register circuits are respectively coupled to fifth nodes P5 of the 1073rd-stage, 1075th-stage, 1077th-stage and 1079th-stage shift register circuits, the pull-up nodes PU of the 1073rd-stage to 1080th-stage shift register circuits are all at the operating voltages.

In an eighth phase (T8):
the first clock signals provided by the first clock signal terminals CLKA coupled to the 1077th-stage to 1080th-stage shift register circuits, the sixth clock signals provided by the sixth clock signal terminals CLKF coupled to the 1077th-stage to 1080th-stage shift register circuits, and the fifth clock signals provided by fifth clock signal terminals CLKE coupled to the 1077th-stage and 1079th-stage shift register circuits are all at high voltages; output sub-circuits 102 of the 1077th-stage to 1080th-stage shift register circuits sequentially transmit the first clock signals to their respective first signal output terminals OUT1, and transmit the sixth clock signals to their respective second signal output terminals OUT2; in addition, the output sub-circuits 102 of the 1077th-stage and 1079th-stage shift register circuits further transmit the fifth clock signals to their respective cascade signal output terminals CR, and the fifth clock signals output by the 1077th-stage and 1079th-stage shift register circuits may be used as the first input signals of the 1081st-stage and 1083rd-stage shift register circuits respectively, and may also be used as first reset signals of the 1073rd-stage and 1075th-stage shift register circuits respectively.

In this phase, output of the first clock signals of the 1077th-stage to 1080th-stage shift register circuits is completed, and the first clock signals are sequentially transmitted to first scanning signal lines from 1077th to 1080th rows in the display panel 100. As long as the data signal lines in the display panel 100 provide the data signals for displaying the normal image, the 1077th to 1080th rows in the display panel 100 may display the normal image.

Based on the above process, the normal image and the black image may be alternately displayed. It will be understood that this embodiment will be described by considering an example in which the display of the black image from the first to eighth rows is inserted during the display of the normal image from the 1073rd to 1080th rows, but an insertion method of the black image is not limited thereto, as long as the normal image and the black image may be alternately displayed. In this way, in this embodiment, the MPRT may increase without changing the image refresh frequency, thereby improving the display quality of the display panel.

Figure 37:
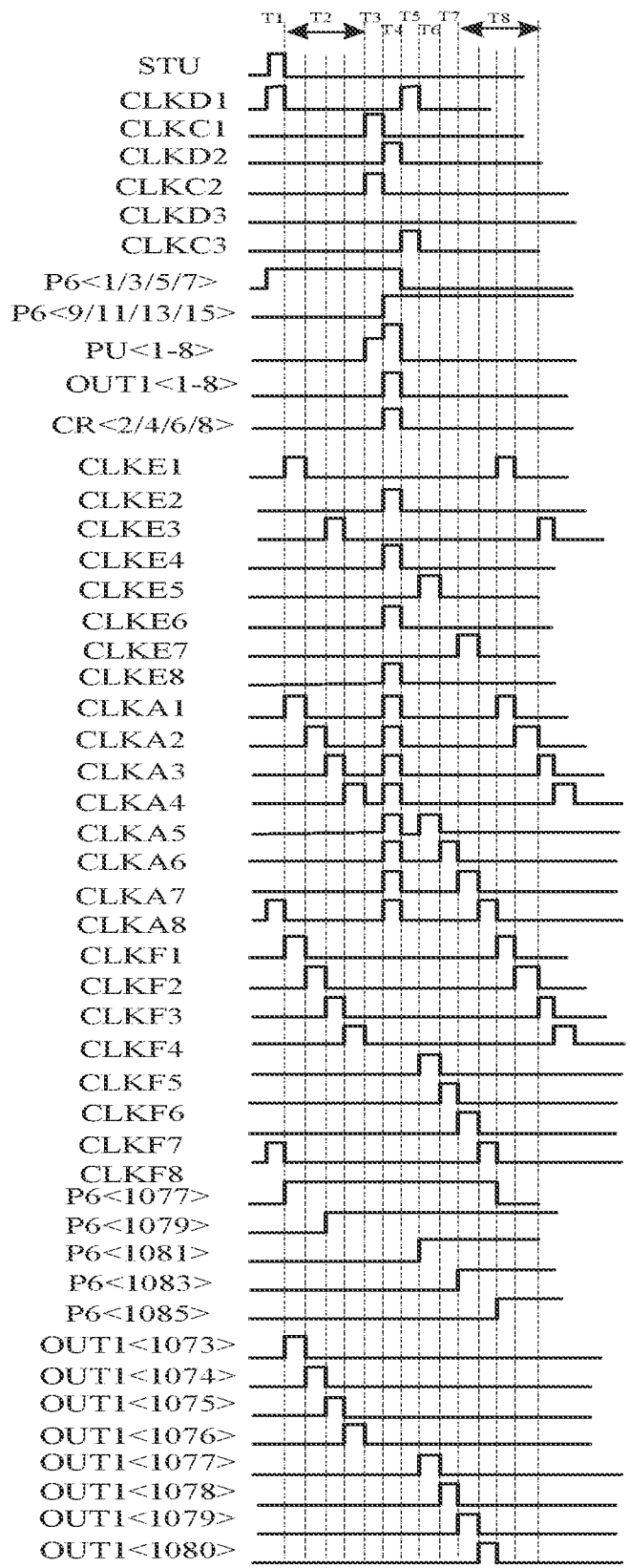
FIG. 37 is a timing diagram of a gate driver circuit based on the cascade structural diagram in FIG. 33.

In a fourth implementation manner:
by considering an example in which the control sub-circuit 103 of the shift register circuit includes at least the third release unit 1035, and the second reset sub-circuit 108 of the shift register circuit is coupled to the auxiliary third clock signal terminal CLKC', the process of inserting the black image during the display of the normal image is exemplarily described in combination with the structure of the shift register circuit shown in FIG. 21, the structure of the gate driver circuit 10 shown in FIG. 33 and with reference to the timing diagram shown in FIG. 37.

It will be noted that in the gate driver circuit 10, the control sub-circuit 103 of the shift register circuit at the odd-numbered stage includes the third release unit 1035, the third storage unit 1036 and the fourth storage unit 1037, and the control sub-circuit 103 of the shift register circuit at the even-numbered stage includes the third release unit 1035. This embodiment will be described by considering the above contents as an example. However, it will be clear that the shift register circuit at the odd-numbered stage and the shift register circuit at the even-numbered stage may have the same structure. That is, each shift register circuit includes the third release unit 1035, the third storage unit 1036 and the fourth storage unit 1037.

A cascade signal output terminal CR of the (2i+1)th-stage shift register circuit is coupled to a first input signal terminal IN1 of a (2i+5)th-stage shift register circuit and a second input signal terminal IN2 of the (2i+7)th-stage shift register circuit. The first node P1 and the second node P2 of the (2i+2)th-stage shift register circuit are coupled to the first node P1 and the second node P2 of the (2i+1)th-stage shift register circuit, respectively.

In a first phase (T1):
the second initial signal provided by the second initial signal line STU and a fourth clock signal provided by the fourth clock signal terminals CLKD coupled to the first-stage, third-stage, fifth-stage and seventh-stage shift register circuits are both at high voltages, so that twelfth transistors M12 of the first-stage, third-stage, fifth-stage and seventh-stage shift register circuits are each turned on to transmit a second input signal to a respective sixth node P6, so as to make the sixth nodes P6 at a high voltage.

In a second phase (T2):
input sub-circuits 101 of 1073rd-stage to 1076th-stage shift register circuits each transmit a received first input signal to a respective pull-up node PU, so that the pull-up node PU is at a high voltage; under control of the voltages of the pull-up nodes PU, output sub-circuits 102 of the 1073rd-stage to 1076th-stage shift register circuits sequentially transmit the first clock signals to their respective first signal output terminals OUT1, and transmit the sixth clock signals to their respective second signal output terminals OUT2; in addition, output sub-circuits 102 of the 1073rd-stage and 1075th-stage shift register circuits further transmit the fifth clock signals to their respective cascade signal output terminals CR; the fifth clock signals output from the cascade signal output terminals CR of the 1073rd-stage and 1075th-stage shift register circuits may be used as first input signals of the 1077th-stage and 1079th-stage shift register circuits, and may also be used as first reset signals of 1069th-stage and 1071st-stage shift register circuits respectively:

when the 1073rd-stage shift register circuit outputs the fifth clock signal, an input sub-circuit 101 and a control sub-circuit 103 of the 1077th-stage shift register circuit receive a first input signal, so that both a pull-up node PU and a sixth node P6 of the 1077th-stage shift register circuit are at high voltages; when the 1075th-stage shift register circuit outputs the fifth clock signal, an input sub-circuit 101 and a control sub-circuit 103 of the 1079th-stage shift register circuit receive a first input signal, so that both a pull-up node PU and a sixth node P6 of the 1079th-stage shift register circuit are at high voltages; since the 1073rd-stage and 1075th-stage shift register circuits have not been reset at this time, the pull-up nodes PU and sixth nodes P6 thereof are also at the high voltages.

It will be noted that in this embodiment, the shift register circuits at the odd-numbered stages are each used to transmit a cascade signal in the process of displaying the normal image, and the shift register circuits at the even-numbered stages are each used to transmit the cascade signal in the process of inserting the black image. Therefore, only the shift register circuits at the odd-numbered stages each output the fifth clock signal in the above display process.

In this phase, output of the first clock signals of the 1073rd-stage to 1076th-stage shift register circuits is completed, and the first clock signals are sequentially transmitted to first scanning signal lines from 1073rd to 1076th rows in the display panel 100. As long as the data signal lines in the display panel 100 provide the data signals for displaying the normal image, the 1073rd to 1076th rows in the display panel 100 may display the normal image.

In a third phase (T3):
an auxiliary third clock signal provided by auxiliary third clock signal terminals CLKC' coupled to second reset sub-circuits 108 of the 1073rd-stage to 1080th-stage shift register circuits is at a high voltage, so as to pull down the voltage at a respective pull-up node PU of the 1073rd-stage to 1080th-stage shift register circuits; the third dock signal provided by third clock signal terminals CLKC coupled to control sub-circuits 103 of the first-stage to eighth-stage shift register circuits is at a high voltage, and the tenth transistors M10 of the first-stage, third-stage, fifth-stage and seventh-stage shift register circuits are each turned on under control of the stored high voltage at a respective sixth node P6, so that a third storage signal (the third clock signal) received at a respective third storage signal terminal VR3 is transmitted to a pull-up node PU through a fifth node P5;

since fifth nodes P5 of the second-stage, fourth-stage, sixth-stage and eighth-stage shift register circuits are respectively coupled to fifth nodes P5 of the first-stage, third-stage, fifth-stage and seventh-stage shift register circuits, the pull-up nodes PU of the first-stage to eighth-stage shift register circuits are all at the operating voltages.

In this phase, the pull-up nodes PU of the 1073rd-stage to 1080th-stage shift register circuits are pulled down, and the pull-up nodes PU of the first-stage to eighth-stage shift register circuits are pulled up, thereby effectively saving the time for inserting the black image during the display of the normal image.

In a fourth phase (T4):
the first clock signals provided by the first clock signal terminals CLKA coupled to the first-stage to eighth-stage shift register circuits and the fifth clock signals provided by the fifth clock signal terminals CLKE coupled to the second-stage, fourth-stage, sixth-stage and eighth-stage shift register circuits are all at high voltages; the first signal output terminals OUT1 of the first-stage to eighth-stage shift register circuits each output the first clock signal, and the cascade signal output terminals CR of the second-stage, fourth-stage, sixth-stage and eighth-stage shift register circuits each output the fifth clock signal; moreover, the fourth clock signal provided by the fourth clock signal terminals CLKD coupled to the ninth-stage, eleventh-stage, thirteenth-stage and fifteenth-stage shift register circuits is also at a high voltage, so the twelfth transistors M12 of the ninth-stage, eleventh-stage, thirteenth-stage and fifteenth-stage shift register circuits are each turned on; therefore, the fifth clock signals output by the second-stage, fourth-stage, sixth-stage and eighth-stage shift register circuits are respectively stored in the sixth nodes P6 of the ninth-stage, eleventh-stage, thirteenth-stage and fifteenth-stage shift register circuits.

It will be noted that the sixth clock signal may or may not be output. Since this phase is used to display the black image, whether the sixth clock signal (the second scanning signal of the display panel 100) is output does not affect the display of the black image.

In addition, in the gate driver circuit, the shift register circuits at the even-numbered stages may be connected to the same fifth clock signal line. As long as a cascade signal output terminal CR of the last-stage ((8i+8)th-stage) shift register circuit in each shift register circuit group is coupled to the second input signal terminals IN2 of the shift register circuits at the odd-numbered stages in the next shift register circuit group, so as to form the one-to-many input mode. Of course, the fifth clock signal line may also be coupled in other manners, which are not limited in this embodiment.

In this phase, output of the first clock signals of the first-stage to eighth-stage shift register circuits is completed, the first clock signals are transmitted to the first scanning signal lines from first to eighth rows in the display panel 100. As long as the data signal lines in the display panel 100 provide the data signals for turning off the driving transistors, the first to eighth rows in the display panel 100 may display the black image.

In a fifth phase (T5):
the auxiliary third clock signal provided by auxiliary third clock signal terminals CLKC' coupled to second reset sub-circuits 108 of the first-stage to eighth-stage shift register circuits and the third clock signal provided by third clock signal terminals CLKC coupled to control sub-circuits 103 of the 1073rd-stage to 1088th-stage shift register circuits are all at high voltages, so that the pull-up nodes PU of the first-stage to eighth-stage shift register circuits are pulled down, and eighth transistors M8 of the 1073rd-stage to 1088th-stage shift register circuits are each turned on; the tenth transistors M10 of the 1073rd-stage, 1075th-stage, 1077th-stage and 1079th-stage shift register circuits are each turned on under control of the stored high voltage at a respective sixth node P6, so that a third storage signal (the third clock signal) received at a respective third storage signal terminal VR3 is transmitted to a pull-up node PU through a fifth node P5;
since the fifth nodes P5 of the 1074th-stage, 1076th-stage, 1078th-stage and 1080th-stage shift register circuits are respectively coupled to the fifth nodes P5 of the 1073rd-stage, 1075th-stage, 1077th-stage and 1079th-stage shift register circuits, the pull-up nodes PU of the 1073rd-stage to 1080th-stage shift register circuits are all at the operating voltages;
moreover, the fourth clock signal provided by the fourth clock signal terminals CLKD coupled to the first-stage, third-stage, fifth-stage and seventh-stage shift register circuits is at a high voltage, so that the twelfth transistors M12 of the first-stage, third-stage, fifth-stage and seventh-stage shift register circuits are each turned on; therefore, the voltages at the sixth nodes P6 of the first-stage, third-stage, fifth-stage and seventh-stage shift register circuits are pulled down. It will be noted that this process may also be performed in the next phase, which is not limited in this embodiment.

In this phase, the voltages at the pull-up nodes PU of the first-stage to eighth-stage shift register circuits are pulled down, and the voltages at the pull-up nodes PU of the 1073rd-stage to 1080th-stage shift register circuits are pulled up, thereby further saving the time for inserting the black image during the display of the normal image.

In a sixth phase (T6):
the first clock signals provided by the first clock signal terminals CLKA coupled to the 1077th-stage to 1080th-stage shift register circuits, the sixth clock signals provided by the sixth clock signal terminals CLKF coupled to the 1077th-stage to 1080th-stage shift register circuits, and the fifth clock signals provided by the fifth clock signal terminals CLKE coupled to the 1077th-stage and 1079th-stage shift register circuits are all at high voltages; the output sub-circuits 102 of the 1077th-stage to 1080th-stage shift register circuits sequentially transmit the first clock signals to their respective first signal output terminals OUT1, and transmit the sixth clock signals to their respective second signal output terminals OUT2; in addition, the output sub-circuits 102 of the 1077th-stage and 1079th-stage shift register circuits further transmit the fifth clock signals to their respective cascade signal output terminals CR, and the fifth clock signals output by the 1077th-stage and 1079th-stage shift register circuits may be used as the first input signals of the 1081st-stage and 1083rd-stage shift register circuits respectively, and may also be used as the first reset signals of the 1073rd-stage and 1075th-stage shift register circuits respectively.

In this phase, output of the first clock signals of the 1077th-stage to 1080th-stage shift register circuits is completed, and the first clock signals are sequentially transmitted to first scanning signal lines from 1077th to 1080th rows in the display panel 100. As long as the data signal lines in the display panel 100 provide the data signals for displaying the normal image, the 1077th to 1080th rows in the display panel 100 may display the normal image.

Based on the above process, the normal image and the black image may be alternately displayed. It will be understood that this embodiment will be described by considering an example in which the display of the black image from the first to eighth rows is inserted during the display of the normal image from the 1073rd to 1080th rows, but an insertion method of the black image is not limited thereto, as long as the normal image and the black image may be alternately displayed. In this way, in this embodiment, the MPRT may increase without changing the image refresh frequency, thereby improving the display quality of the display panel.

The embodiments of the present disclosure further provide a driving method for the gate driver circuit, and the method is used to drive the above gate driver circuit 10. The gate driver circuit 10 includes a plurality of shift register circuit groups, and each shift register circuit group includes M shift register circuits. An Xth-stage shift register circuit and a Yth-stage shift register circuit belong to different shift register circuit groups, and M, X and Y are all positive integers. As shown in FIG. 38, the method includes steps 10 to 30 (S10 to S30).

In S10, an input sub-circuit 101 of the Xth-stage shift register circuit, under control of a first input signal received at a first input signal terminal IN1, transmits the first input signal to a pull-up node PU coupled thereto; an output sub-circuit 102 of the Xth-stage shift register circuit transmits a first clock signal received at a first clock signal terminal CLKA to a first signal output terminal OUT1 under control of a voltage at the pull-up node PU coupled thereto; and a control sub-circuit 103 of an (X+m)th-stage shift register circuit, a first input signal terminal IN1 of which is coupled to the Xth-stage shift register circuit, stores a first input signal received at the first input signal terminal IN1 under control of the first input signal received at the first input signal terminal IN1.

In S20, a control sub-circuit 103 of the Yth-stage shift register circuit releases an operating voltage of a pull-up node to the pull-up node PU coupled thereto under control of a first control signal received at a first control signal terminal VC1; an output sub-circuit 102 of the Yth-stage shift register circuit transmits a first clock signal received at a first dock signal terminal CLKA to a first signal output terminal OUT1 under control of the voltage at the pull-up node PU coupled thereto; and a control sub-circuit 103 of a (Y+n)th-stage shift register circuit, a second input signal terminal IN2 of which is coupled to the Yth-stage shift register circuit, stores a second input signal received at the second input signal terminal IN2 under control of the second input signal received at the second input signal terminal IN2.

In S30, the control sub-circuit 103 of the (X+m)th-stage shift register circuit releases an operating voltage of a pull-up node to the pull-up node PU coupled thereto under a control of a first control signal received at a first control signal terminal VC1; an output sub-circuit 102 of the (X+m)th-stage shift register circuit transmits a first clock signal received at a first clock signal terminal CLKA to a first signal output terminal OUT1 under control of the voltage at the pull-up node PU coupled thereto.

It will be noted that, for details and beneficial effects of the driving method for the gate driver circuit, reference may be made to the above embodiments, which will not be described in detail here.

The embodiments of the present disclosure further provide a display apparatus. The display apparatus may be any apparatus that displays an image whether in motion (e.g., a video) or fixed (e.g., a static image), and regardless of text or image.

For example, the display apparatus includes but is not limited to a mobile telephone, a wireless apparatus, a personal digital assistant (PDA), a hand-held or portable computer, a global positioning system (GPS) receiver/navigator, a camera, an MPEG-4 Part 14 (MP4) video player, a video camera, a game console, a watch, a dock, a calculator, a TV monitor, a flat-panel display, a computer monitor, a car display (e.g., an odometer display), a navigator, a cockpit controller and/or display, a camera view display (e.g., a display of rear view camera in a vehicle), an electronic photo, an electronic billboard or sign, a projector, an architectural structure, and a packaging and aesthetic structure (e.g., a display for an image of a piece of jewelry).

Figure 40:
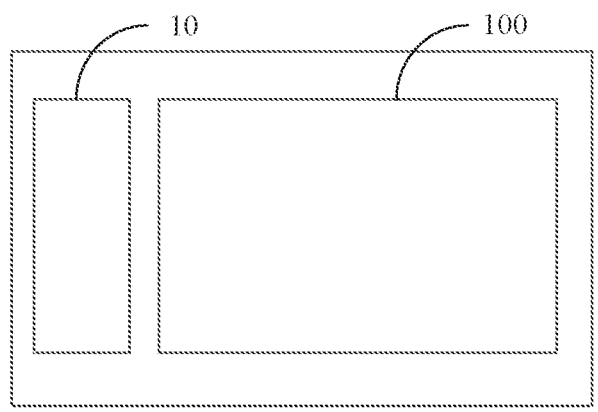
FIG. 40 is a structural diagram of a display apparatus, in accordance with some embodiments.

As shown in FIGS. 1 and 40, the display apparatus 01 includes a display panel 100 and gate driver circuit(s) 10 each in any of the above embodiments.

As shown in FIG. 2, the display panel 100 includes a plurality of pixel driving circuits 20, and each pixel driving circuit 20 includes a first switching transistor T1, a driving transistor DT and a storage capacitor Cst.

As shown in FIG. 1, the gate driver circuit 10 is configured to provide gate driving signals, such as first scanning signals and second scanning signals, for the plurality of pixel driving circuits 20 in the display panel 100.

Figure 39B:
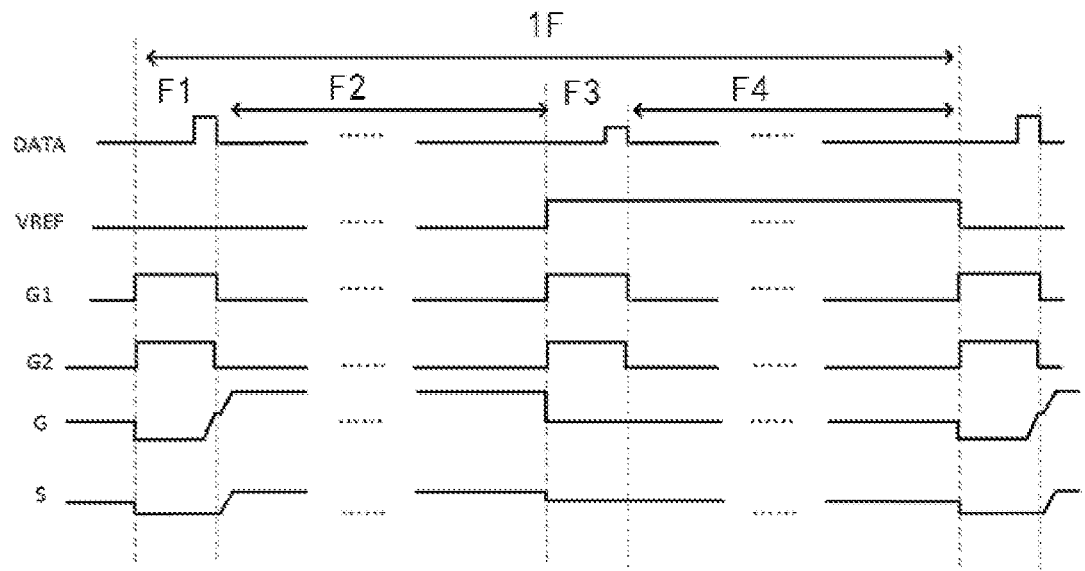
FIG. 39B is another timing diagram of a pixel driving circuit, in accordance with some embodiments.

When the display apparatus displays images by using the above gate driver circuit and driving method therefor, as shown in FIGS. 39A and 39B, in a process of displaying a frame F of image, not only a data writing phase F1 and a light-emitting phase F2 for displaying a normal image but also a data writing phase F3 and a black image phase F4 for inserting a black image are included. In the data writing phase F3 and the black image phase F4 for inserting the black image, whether the gate driver circuit 10 outputs the second scanning signals to the display panel 100 or not does not affect the display of the black image. For a display process, reference may be made to the above embodiments, which will not be repeated here.

It will be noted that, for the gate driver circuit 10, FIG. 1 is only illustrated by considering a single-side driving (that is, the gate driver circuit 10 is provided on a single side of the peripheral area S of the display panel 100, and the first scanning signal line GL1 and the second scanning signal line GL2 are sequentially driven row by row from the single side) as an example. In some other embodiments, a dual-side simultaneous driving (that is, the gate driver circuits 10 are provided on both sides, in an extending direction of the first scanning signal line GL1 and the second scanning signal line GL2, of the peripheral area S of the display panel 100, and the first scanning signal line GL1 and the second scanning signal line GL2 are sequentially driven row by row from both sides simultaneously by the two gate driver circuits 10) may also be used. In yet some other embodiments, a dual-side alternate driving (that is, the gate driver circuits 10 are provided on both sides, in the extending direction of the first scanning signal line GL1 and the second scanning signal line GL2, of the peripheral area S of the display panel 100, and the first scanning signal line GL1 and the second scanning signal line GL2 are sequentially driven row by row from both sides alternately by the two gate driver circuits 10) may also be used.

In addition, in the gate driver circuit 10, for each dock signal terminal of the shift register circuit RS, a multi-dock signal mode may be used, such as a 2-dock signal model, a 4-clock signal model, a 6-dock signal model, an 8-clock signal model or a 10-clock signal model, which is not limited in the embodiments of the present disclosure.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A shift register circuit, comprising:
   an input sub-circuit coupled to a first input signal terminal and a pull-up node, and configured to, under control of a first input signal received at the first input signal terminal, transmit the first input signal to the pull-up node;
   an output sub-circuit at least coupled to the pull-up node, a first clock signal terminal and a first signal output terminal, and configured to transmit a first clock signal received at the first clock signal terminal to the first signal output terminal under control of a voltage at the pull-up node; and
   a control sub-circuit coupled to at least one first reference node, at least one first control signal terminal and the pull-up node, and configured to transmit a voltage at a first reference node to the pull-up node under control of a first control signal received at a first control signal terminal.

2. The shift register circuit according to claim 1, wherein the control sub-circuit is coupled to two first reference nodes and two first control signal terminals; the two first reference nodes are a first node and a second node, and the two first control signal terminals are a second clock signal terminal and a third clock signal terminal;
the control sub-circuit includes:
a first release unit coupled to the first node, the second clock signal terminal and the pull-up node, and configured to transmit a voltage at the first node to the pull-up node under control of a second clock signal received at the second clock signal terminal; and
a second release unit coupled to the second node, the third clock signal terminal and the pull-up node, and configured to transmit a voltage at the second node to the pull-up node under control of a third clock signal received at, the third clock signal terminal.

3. The shift register circuit according to claim 2, wherein the first release unit includes a first transistor;
a control electrode of the first transistor is coupled to the second clock signal terminal, a first electrode of the first transistor is coupled to the first node, and a second electrode of the first transistor is coupled to the pull-up node; and
the second release unit includes a second transistor;
a control electrode of the second transistor is coupled to the third clock signal terminal, a first electrode of the second transistor is coupled to the second node, and a second electrode of the second transistor is coupled to the pull-up node.

4. The shift register circuit according to claim 2, wherein the control sub-circuit further includes:
a first storage unit at least coupled to the first input signal terminal, a first storage signal terminal and the first node, and configured to store the first input signal under the control of the first input signal received at the first input signal terminal, and to transmit a first storage signal received at the first storage signal terminal to the first node under the control of the first input signal; or,
a first storage unit coupled to the first input signal terminal, a first storage signal terminal, a first reset signal terminal, a first voltage signal terminal and the first node, and configured to store the first input signal under the control of the first input signal received at the first input signal terminal, and to transmit a first storage signal received at the first storage signal terminal to the first node under the control of the first input signal, wherein
the first storage unit includes a third transistor, a fourth transistor, a fifth transistor and a first storage capacitor; a control electrode and a first electrode of the third transistor are coupled to the first input signal terminal, and a second electrode of the third transistor is coupled to a third node; a control electrode of the fourth transistor is coupled to the third node, a first electrode of the fourth transistor is coupled to the first storage signal terminal, and a second electrode of the fourth transistor is coupled to the first node; a control electrode of the fifth transistor is coupled to the first reset signal terminal, a first electrode of the fifth transistor is coupled to the first voltage signal terminal, and a second electrode of the fifth transistor is coupled to the third node; one terminal of the first storage capacitor is coupled to the third node, and another terminal of the first storage capacitor is coupled to the first voltage signal terminal or the first node; and a second storage unit at least coupled to a second input signal terminal, a fourth clock signal terminal, a second storage signal terminal and the second node, and configured to store a second input signal received at the second input signal terminal under control of a fourth clock signal received at the fourth clock signal terminal, and to transmit a second storage signal received at the second storage signal terminal to the second node under control of the second input signal; or, a second storage unit at least coupled to a second input signal terminal, a fourth clock signal terminal, a second storage signal terminal and the second node, and configured to store a second input signal received at the second input signal terminal under control of a fourth clock signal received at the fourth clock signal terminal, and to transmit a second storage signal received at the second storage signal terminal to the second node under control of the second input signal, wherein
the second storage unit includes a sixth transistor, a seventh transistor and a second storage capacitor; a control electrode of the sixth transistor is coupled to the fourth clock signal terminal, a first electrode of the sixth transistor is coupled to the second input signal terminal, and a second electrode of the sixth transistor is coupled to a fourth node;
a control electrode of the seventh transistor is coupled to the fourth node, a first electrode of the seventh transistor is coupled to the second storage signal terminal, and a second electrode of the seventh transistor is coupled to the second node; one terminal of the second storage capacitor is coupled to the fourth node, and another terminal of the second storage capacitor is coupled to the first voltage signal terminal or the second node.

5. The shift register circuit according to claim 1, wherein the control sub-circuit is coupled to one first reference node and one first control signal terminal; the first reference node is a fifth node, and the first control signal terminal is a third clock signal terminal;
the control sub-circuit includes:
a third release unit coupled to the fifth node, the third clock signal terminal and the pull-up node, and configured to transmit a voltage at the fifth node to the pull-up node under control of a third clock signal received at the third clock signal terminal.

6. The shift register circuit according to claim 5, wherein the third release unit includes an eighth transistor;
a control electrode of the eighth transistor is coupled to the third clock signal terminal, a first electrode of the eighth transistor is coupled to the fifth node, and a second electrode of the eighth transistor is coupled to the pull-up node.

7. The shift register circuit according to claim 5, wherein the control sub-circuit further includes:
a third storage unit at least coupled to the first input signal terminal, a third storage signal terminal and the fifth node, and configured to store the first input signal under the control of the first input signal received at the first input signal terminal, and to transmit a third storage signal received at the third storage signal terminal to the fifth node under the control of the first input signal; or, a third storage unit coupled to the first input signal terminal, a third storage signal terminal, a first reset signal terminal, a first voltage signal terminal and the fifth node, and configured to store the first input signal under the control of the first input signal received at the first input signal terminal, and to transmit a third storage signal received at the third storage signal terminal to the fifth node under the control of the first input signal; wherein the third storage unit includes a ninth transistor, a tenth transistor, an eleventh transistor and a third storage capacitor; a control electrode and a first electrode of the ninth transistor are coupled to the first input signal terminal, and a second electrode of the ninth transistor is coupled to a sixth node; a control electrode of the tenth transistor is coupled to the sixth node, a first electrode of the tenth transistor is coupled to the third storage signal terminal, and a second electrode of the tenth transistor is coupled to the fifth node; a control electrode of the eleventh transistor is coupled to the first reset signal terminal, a first electrode of the eleventh transistor is coupled to the first voltage signal terminal, and a second electrode of the eleventh transistor is coupled to the sixth node; one terminal of the third storage capacitor is coupled to the sixth node, and another terminal of the third storage capacitor is coupled to the first voltage signal terminal or the fifth node; and a fourth storage unit coupled to a fourth clock signal terminal and a second input signal terminal, and configured to store a second input signal received at the second input signal terminal under control of a fourth clock signal received at the fourth clock signal terminal, wherein the third storage unit is further configured to transmit the third storage signal received at the third storage signal terminal to the fifth node under control of the second input signal; or, a fourth storage unit coupled to a fourth clock signal terminal and a second input signal terminal, and configured to store a second input signal received at the second input signal terminal under control of a fourth clock signal received at the fourth clock signal terminal, wherein the third storage unit is further configured to transmit the third storage signal received at the third storage signal terminal to the fifth node under control of the second input signal; wherein the fourth storage unit includes a twelfth transistor; a control electrode of the twelfth transistor is coupled to the fourth clock signal terminal, a first electrode of the twelfth transistor is coupled to the second input signal terminal, and a second electrode of the twelfth transistor is coupled to the sixth node.

8. The shift register circuit according to claim 1, wherein the input sub-circuit includes a thirteenth transistor;

a control electrode and a first electrode of the thirteenth transistor are coupled to the first input signal terminal, and a second electrode of the thirteenth transistor is coupled to the pull-up node; and the output sub-circuit at least includes a fourteenth transistor and a fourth storage capacitor;

a control electrode of the fourteenth transistor is coupled to the pull-up node, a first electrode of the fourteenth transistor is coupled to the first clock signal terminal, and a second electrode of the fourteenth transistor is coupled to the first signal output terminal; and one terminal of the fourth storage capacitor is coupled to the pull-up node, and another terminal of the fourth storage capacitor is coupled to the first signal output terminal; or the output sub-circuit is further coupled to a fifth clock signal terminal and a cascade signal output terminal, and the output sub-circuit includes a fourteenth transistor, a fifteenth transistor and a fourth storage capacitor;

a control electrode of the fourteenth transistor is coupled to the pull-up node, a first electrode of the fourteenth transistor is coupled to the first clock signal terminal, and a second electrode of the fourteenth transistor is coupled to the first signal output terminal;

a control electrode of the fifteenth transistor is coupled to the pull-up node, a first electrode of the fifteenth transistor is coupled to the fifth clock signal terminal, and a second electrode of the fifteenth transistor is coupled to the cascade signal output terminal; and one terminal of the fourth storage capacitor is coupled to the pull-up node, and another terminal of the fourth storage capacitor is coupled to the first signal output terminal; or the output sub-circuit is further coupled to a sixth clock signal terminal and a second signal output terminal, and the output sub-circuit includes a fourteenth transistor, a sixteenth transistor, a fourth storage capacitor and a fifth storage capacitor;

a control electrode of the fourteenth transistor is coupled to the pull-up node, a first electrode of the fourteenth transistor is coupled to the first clock signal terminal, and a second electrode of the fourteenth transistor is coupled to the first signal output terminal;

a control electrode of the sixteenth transistor is coupled to the pull-up node, a first electrode of the sixteenth transistor is coupled to the sixth clock signal terminal, and a second electrode of the sixteenth transistor is coupled to the second signal output terminal;

one terminal of the fourth storage capacitor is coupled to the pull-up node, and another terminal of the fourth storage capacitor is coupled to the first signal output terminal; and one terminal of the fifth storage capacitor is coupled to the pull-up node, and another terminal of the fifth storage capacitor is coupled to the second signal output terminal.

9. E shift register circuit according to claim 1, further comprising:

a pull-down sub-circuit coupled to a second voltage signal terminal, a first voltage signal terminal, the pull-up node and a pull-down node, and configured to, under control of a second voltage signal received at the second voltage signal terminal, transmit the second voltage signal to the pull-down node, and to transmit a first voltage signal received at the first voltage signal terminal to the pull-down node under control of the voltage at the pull-up node;

a first noise reduction sub-circuit coupled to the pull-down node, the pull-up node and the first voltage signal terminal, and configured to transmit the first voltage signal to the pull-up node under control of a voltage at the pull-down node; and a second noise reduction sub-circuit at least coupled to the pull-down node, the first signal output terminal and a third voltage signal terminal, and configured to transmit a third voltage signal received at the third voltage signal terminal to the first signal output terminal under the control of the voltage at the pull-down node.

10. The shift register circuit according to claim 9, wherein the pull-down sub-circuit includes an eighteenth transistor, a nineteenth transistor, a twentieth transistor and a twenty-first transistor;
    a control electrode and a first electrode of the eighteenth transistor are coupled to the second voltage signal terminal, and a second electrode of the eighteenth transistor is coupled to a pull-down control node;
    a control electrode of the nineteenth transistor is coupled to the pull-down control node, a first electrode of the nineteenth transistor is coupled to the second voltage signal terminal, and a second electrode of the nineteenth transistor is coupled to the pull-down node;
    a control electrode of the twentieth transistor is coupled to the pull-up node, a first electrode of the twentieth transistor is coupled to the first voltage signal terminal, and a second electrode of the twentieth transistor is coupled to the pull-down control node; and
    a control electrode of the twenty-first transistor is coupled to the pull-up node, a first electrode of the twenty-first transistor is coupled to the first voltage signal terminal, and a second electrode of the twenty-first transistor is coupled to the pull-down node; or
    the pull-down sub-circuit includes a twenty-second transistor and a twenty-third transistor;
    a control electrode and a first electrode of the twenty-second transistor are coupled to the second voltage signal terminal, and a second electrode of the twenty-second transistor is coupled to the pull-down node; and
    a control electrode of the twenty-third transistor is coupled to the pull-up node, a first electrode of the twenty-third transistor is coupled to the first voltage signal terminal, and a second electrode of the twenty-third transistor is coupled to the pull-down node.

11. The shift register circuit according to claim 9, wherein the first noise reduction sub-circuit includes a twenty-fourth transistor;
    a control electrode of the twenty-fourth transistor is coupled to the pull-down node, a first electrode of the twenty-fourth transistor is coupled to the first voltage signal terminal, and a second electrode of the twenty-fourth transistor is coupled to the pull-up node; and the second noise reduction sub-circuit includes a twenty-fifth transistor;
    a control electrode of the twenty-fifth transistor is coupled to the pull-down node, a first electrode of the twenty-fifth transistor is coupled to the third voltage signal terminal, and a second electrode of the twenty-fifth transistor is coupled to the first signal output terminal; or,
    the output sub-circuit is further coupled to a cascade signal output terminal, a fifth clock signal terminal, a second signal output terminal and a sixth clock signal terminal; and the second noise reduction sub-circuit includes a twenty-fifth transistor, a twenty-sixth transistor and a twenty-seventh transistor, wherein
    a control electrode of the twenty-fifth transistor is coupled to the pull-down node, a first electrode of the twenty-fifth transistor is coupled to the third voltage signal terminal, and a second electrode of the twenty-fifth transistor is coupled to the first signal output terminal;
    a control electrode of the twenty-sixth transistor is coupled to the pull-down node, a first electrode of the twenty-sixth transistor is coupled to the first voltage signal terminal, and a second electrode of the twenty-sixth transistor is coupled to the cascade signal output terminal; and a control electrode of the twenty-seventh transistor is coupled to the pull-down node, a first electrode of the twenty-seventh transistor is coupled to the third voltage signal terminal, and a second electrode of the twenty-seventh transistor is coupled to the second signal output terminal.

12. The shift register circuit according to claim 1, further comprising:
    first reset sub-circuit coupled to a first reset signal terminal, the pull-up node and a first voltage signal terminal, and configured to transmit a first voltage signal received at the first voltage signal terminal to the pull-up node under control of a first reset signal received at the first reset signal terminal; or, a first reset sub-circuit coupled to a first reset signal terminal, the pull-up node and a first voltage signal terminal, and configured to transmit a first voltage signal received at the first voltage signal terminal to the pull-up node under control of a first reset signal received at the first reset signal terminal, wherein
    the first reset sub-circuit includes a twenty-ninth transistor; a control electrode of the twenty-ninth transistor is coupled to the first reset signal terminal, a first electrode of the twenty-ninth transistor is coupled to the first voltage signal terminal, and a second electrode of the twenty-ninth transistor is coupled to the pull-up node; and
    a second reset sub-circuit coupled to a second reset signal terminal, the pull-up node and the first voltage signal terminal, and configured to transmit the first voltage signal to the pull-up node under control of a second reset signal received at the second reset signal terminal; or, a second reset sub-circuit coupled to a second reset signal terminal, the pull-up node and the first voltage signal terminal, and configured to transmit the first voltage signal to the pull-up node under control of a second reset signal received at the second reset signal terminal, wherein
    the second reset sub-circuit includes a thirtieth transistor; a control electrode of the thirtieth transistor is coupled to the second reset signal terminal, a first electrode of the thirtieth transistor is coupled to the first voltage signal terminal, and a second electrode of the thirtieth transistor is coupled to the pull-up node; or the second reset sub-circuit includes a thirty-first transistor and a thirty-second transistor; a control electrode of the thirty-first transistor is coupled to the second reset signal terminal, a first electrode of the thirty-first transistor is coupled to the first voltage signal terminal, and a second electrode of the thirty-first transistor is coupled to a first electrode of the thirty-second transistor; a control electrode of the thirty-second transistor is coupled to a second reference node, and a second electrode of the thirty-second transistor is coupled to the pull-up node.

13. The shift register circuit according to claim 12, wherein the second reset sub-circuit is further coupled to an auxiliary third clock signal terminal, and is configured to transmit the first voltage signal to the pull-up node under control of an auxiliary third clock signal received at the auxiliary third clock signal terminal; or
    the second reset sub-circuit is further coupled to an auxiliary third clock signal terminal, and is configured to transmit the first voltage signal to the pull-up node under control of an auxiliary third clock signal received at the auxiliary third clock signal terminal, wherein the second reset sub-circuit further includes a forty-first transistor; a control electrode of the forty-first transistor is coupled to the auxiliary third clock signal terminal, a first electrode of the forty-first transistor is coupled to the first voltage signal terminal, and a second electrode of the forty-first transistor is coupled to the pull-up node.

14. The shift register circuit according to claim 1, further comprising:
a first voltage boosting sub-circuit coupled to the pull-up node, a second voltage signal terminal and a ninth node, and configured to transmit a second voltage signal received at the second voltage signal terminal to the ninth node under the control of the voltage at the pull-up node; or, a first voltage boosting sub-circuit coupled to the pull-up node, a second voltage signal terminal and a ninth node, and configured to transmit a second voltage signal received at the second voltage signal terminal to the ninth node under the control of the voltage at the pull-up node, wherein the first voltage boosting sub-circuit includes a thirty-sixth transistor; a control electrode of the thirty-sixth transistor is coupled to the pull-up node, a first electrode of the thirty-sixth transistor is coupled to the second voltage signal terminal, and a second electrode of the thirty-sixth transistor is coupled to the ninth node; and
a second voltage boosting sub-circuit coupled to an eighth node, the second voltage signal terminal and a tenth node, and configured to transmit the second voltage signal received at the second voltage signal terminal to the tenth node under control of a voltage at the eighth node; or, a second voltage boosting sub-circuit coupled to an eighth node, the second voltage signal terminal and a tenth node, and configured to transmit the second voltage signal received at the second voltage signal terminal to the tenth node under control of a voltage at the eighth node, wherein the second voltage boosting sub-circuit includes a thirty-seventh transistor; a control electrode of the thirty-seventh transistor is coupled to the eighth node, a first electrode of the thirty-seventh transistor is coupled to the second voltage signal terminal, and a second electrode of the thirty-seventh transistor is coupled to the tenth node.

15. A gate driver circuit, comprising a plurality of shift register circuits that are cascaded and each according to claim 1.

16. The gate driver circuit according to claim 15, wherein a control sub-circuit of a (4i+1)th-stage shift register circuit includes a first release unit, a second release unit, a first storage unit and a second storage unit, and control sub-circuits of (4i+2)th-stage to (4i+4)th-stage shift register circuits each include a first release unit and a second release unit; each first release unit is coupled to a respective first node, a respective second clock signal terminal and a respective pull-up node; each second release unit is coupled to a respective second node, a respective third clock signal terminal and the respective pull-up node; the first storage unit is at least coupled to a first input signal terminal, a first storage signal terminal and a first node; the second storage unit is at least coupled to a second input signal terminal, a fourth clock signal terminal, a second storage signal terminal and a second node; and
first nodes and second nodes of the control sub-circuits of the (4i+2)th-stage to (4i+4)th-stage shift register circuits are coupled to the first node and the second node of the control sub-circuit of the (4i+1)th-stage shift register circuit, respectively; or a control sub-circuit of a (4i+1)th-stage shift register circuit includes a first release unit, a second release unit, a first storage unit and a second storage unit, and control sub-circuits of (4i+2)th-stage to (4i+4)th-stage shift register circuits each include a first release unit and a second release unit; each first release unit is coupled to a respective first node, a respective second clock signal terminal and a respective pull-up node; each second release unit is coupled to a respective second node, a respective third clock signal terminal and the respective pull-up node; the first storage unit is at least coupled to a first input signal terminal, a first storage signal terminal and a first node; the second storage unit is at least coupled to a second input signal terminal, a fourth clock signal terminal, a second storage signal terminal and a second node; and first nodes and second nodes of the control sub-circuits of the (4i+2)th-stage to (4i+4)th-stage shift register circuits are coupled to the first node and the second node of the control sub-circuit of the (4i+1)th-stage shift register circuit, respectively; the plurality of shift register circuits are divided into a plurality of first shift register circuit groups and a plurality of second shift register circuit groups, and the first shift register circuit groups and the second shift register circuit groups are alternately arranged; a number of shift register circuits in a first shift register circuit group is equal to a number of shift register circuits in a second shift register circuit group; and the first shift, register circuit group is coupled to a first second clock signal line, a first third clock signal line and a first fourth clock signal line, and the second shift register circuit group is coupled to a second clock signal line, a second third clock signal line and a second fourth clock signal line.

17. The gate driver circuit according to claim 15, wherein a control sub-circuit of a (2i+1)th-stage shift register circuit includes a first release unit, a second release unit, a first storage unit and a second storage unit, and a control sub-circuit of a (2i+2)th-stage shift register circuit includes a first release unit and a second release unit; each first release unit is coupled to a respective first node, a respective second clock signal terminal and a respective pull-up node; each second release unit is coupled to a respective second node, a respective third clock signal terminal and the respective pull-up node; the first storage unit is at least coupled to a first input signal terminal, a first storage signal terminal and a first node; the second storage unit is at least coupled to a second input signal terminal, a fourth clock signal terminal, a second storage signal terminal and a second node; and
a first node and a second node of the control sub-circuit of the (2i+2)th-stage shift register circuit are coupled to the first node and the second node of the control sub-circuit of the (2i+1)th-stage shift register circuit, respectively; or
a control sub-circuit of a (2i+1)th-stage shift register circuit includes a first release unit, a second release unit, a first storage unit and a second storage unit, and a control sub-circuit of a (2i+2)th-stage shift register circuit includes a first release unit and a second release unit; each first release unit is coupled to a respective first node, a respective second clock signal terminal and a respective pull-up node; each second release unit is coupled to a respective second node, a respective third clock signal terminal and the respective pull-up node; the first storage unit is at least coupled to a first input signal terminal, a first storage signal terminal and a first node; the second storage unit is at least coupled to a second input signal terminal, a fourth clock signal terminal, a second storage signal terminal and a second node; and a first node and a second node of the control sub-circuit of the (2i+2)th-stage shift register circuit are coupled to the first node and the second node of the control sub-circuit of the (2i+1)th-stage shift register circuit, respectively; the plurality of shift register circuits are divided into a plurality of first shift register circuit groups and a plurality of second shift register circuit groups, and the first shift, register circuit groups and the second shift register circuit groups are alternately arranged; a number of shift register circuits in a first shift register circuit group is equal to a number of shift register circuits in a second shift register circuit group; and the first shift register circuit group is coupled to a first third clock signal line and a first fourth clock signal line, the second shift register circuit group is coupled to a second third clock signal line and a second fourth clock signal line, and all shift register circuits are coupled to a second clock signal line.

18. The gate driver circuit according to claim 15, wherein a control sub-circuit of a (2i+1)th-stage shift register circuit includes a third release unit, a third storage unit and a fourth storage unit, and a control sub-circuit of a (2i+2)th-stage shift register circuit includes a third release unit; each third release unit is coupled to a respective fifth node, a respective third clock signal terminal and a respective pull-up node; the third storage unit is at least coupled to a first input signal terminal, a third storage signal terminal and a fifth node; the fourth storage unit is coupled to a fourth dock signal terminal and a second input signal terminal; and a fifth node of the control sub-circuit of the (2i+2)th-stage shift register circuit is coupled to the fifth node of the control sub-circuit of the (2i+1)th-stage shift register circuit; or a control sub-circuit of a (2i+1)th-stage shift register circuit includes a third release unit, a third storage unit and a fourth storage unit, and a control sub-circuit of a (2i+2)th-stage shift register circuit includes a third release unit; each third release unit is coupled to a respective fifth node, a respective third clock signal terminal and a respective pull-up node; the third storage unit is at least coupled to a first input signal terminal, a third storage signal terminal and a fifth node; the fourth storage unit is coupled to a fourth clock signal terminal and a second input signal terminal; and a fifth node of the control sub-circuit of the (2i+2)th-stage shift register circuit is coupled to the fifth node of the control sub-circuit of the (2i+1)th-stage shift register circuit; the plurality of shift register circuits are divided into a plurality of first shift register circuit groups, a plurality of second shift register circuit groups and a plurality of third shift register circuit groups, and the first shift register circuit groups, the second shift register circuit groups and the third shift register circuit groups are alternately arranged in sequence; a number of shift register circuits in a first shift, register circuit group, a number of shift register circuits in a second shift register circuit group and a number of shift register circuits in a third shift register circuit group are equal; the first shift register circuit group is coupled to a first third clock signal line and a first fourth clock signal line, the second shift register circuit group is coupled to a second third clock signal line and a second fourth clock signal line, and the third shift register circuit group is coupled to a third third clock signal line and a third fourth clock signal line; or a control sub-circuit of a (2i+1)th-stage shift register circuit includes a third release unit, a third storage unit and a fourth storage unit, and a control sub-circuit of a (2i+2)th-stage shift register circuit includes a third release unit; each third release unit is coupled to a respective fifth node, a respective third clock signal terminal and a respective pull-up node; the third storage unit is at least coupled to a first input signal terminal, a third storage signal terminal and a fifth node;

the fourth storage unit is coupled to a fourth clock signal terminal and a second input signal terminal; and a fifth node of the control sub-circuit of the (2i+2)th-stage shift register circuit is coupled to the fifth node of the control sub-circuit of the (2i+1)th-stage shift register circuit; the plurality of shift register circuits are divided into a plurality of first shift register circuit groups, a plurality of second shift register circuit groups and a plurality of third shift register circuit groups, and the first shift register circuit groups, the second shift register circuit groups and the third shift register circuit groups are alternately arranged in sequence; a number of shift register circuits in a first shift register circuit group, a number of shift register circuits in a second shift register circuit group and a number of shift register circuits in a third shift register circuit group are equal; the first shift register circuit group is coupled to a first third clock signal line, a third third clock signal line and a first fourth clock signal line, the second shift register circuit group is coupled to a second third clock signal line, the first third clock signal line and a second fourth clock signal line, and the third shift register circuit group is coupled to the third third clock signal line, the second third clock signal line and a third fourth clock signal line.

19. A display apparatus, comprising a display panel and at least one gate driver circuit according to claim 15.

20. A driving method for the gate driver circuit according to claim 15, wherein the gate driver circuit includes a plurality of shift register circuit groups, an Xth-stage shift register circuit and a Yth-stage shift register circuit belong to different shift register circuit groups, and X and Y are both positive integers; and the driving method comprises:

a first phase in which:
an input sub-circuit of the Xth-stage shift register circuit, under control of a first input signal received at a first input signal terminal, transmits the first input signal to a pull-up node coupled thereto;
an output sub-circuit of the Xth-stage shift register circuit transmits a first clock signal received at a first clock signal terminal to a first signal output terminal under control of a voltage at the pull-up node coupled thereto; and
a control sub-circuit of an (X+m)th-stage shift register circuit stores a first input signal received at another first input signal terminal under control of the first input signal received at the another first input signal terminal; m is a positive integer; wherein the another first input signal terminal is coupled to the Xth-stage shift register circuit;

a second phase in which:
a control sub-circuit of the Yth-stage shift register circuit releases an operating voltage of another pull-up node to the another pull-up node coupled thereto under control of a first control signal received at a first control signal terminal;
an output sub-circuit of the Yth-stage shift register circuit transmits a first clock signal received at another first clock signal terminal to another first signal output terminal under control of the voltage at the another pull-up node coupled thereto; and a control sub-circuit of a (Y+n)th-stage shift register circuit, a second input signal terminal of which is coupled to the Yth-stage shift register circuit, stores a second input signal received at the second input signal terminal under control of the second input signal received at the second input signal terminal; n is a positive integer;

a third phase in which:

the control sub-circuit of the (X+m)th-stage shift register circuit releases an operating voltage of yet another pull-up node to the yet another pull-up node coupled thereto under control of a first control signal received at another first control signal terminal; and an output sub-circuit of the (X+m)th-stage shift register circuit transmits a first clock signal received at yet another first clock signal terminal to vet another first signal output terminal under control of the voltage at the yet another pull-up node coupled thereto.

* * * * *

UNITED STATES PATENT AND TRADEMARK OFFICE
CERTIFICATE OF CORRECTION

| | |
|---|---|
| PATENT NO. | : 12,008,974 B2 |
| APPLICATION NO. | : 17/776267 |
| DATED | : June 11, 2024 |
| INVENTOR(S) | : Xuehuan Feng and Yongqian Li |

It is certified that error appears in the above-identified patent and that said Letters Patent is hereby corrected as shown below:

In the Claims

Column 64, Claim 9, Line 45, "E shift register circuit" should be "The shift register circuit".

Column 66, Claim 12, Line 9, "first reset sub-circuit" should be "a first reset sub-circuit".

Signed and Sealed this
Eighth Day of October, 2024

Katherine Kelly Vidal
*Director of the United States Patent and Trademark Office*